(12) United States Patent
Davies

(10) Patent No.: US 7,598,588 B2
(45) Date of Patent: Oct. 6, 2009

(54) SEMICONDUCTOR STRUCTURE AND METHOD OF MANUFACTURE

(75) Inventor: Robert Bruce Davies, Tempe, AZ (US)

(73) Assignee: HVVi Semiconductors, Inc, Phoenix, AZ (US)

( * ) Notice: Subject to any disclaimer, the term of this patent is extended or adjusted under 35 U.S.C. 154(b) by 56 days.

(21) Appl. No.: 11/925,457

(22) Filed: Oct. 26, 2007

(65) Prior Publication Data

US 2009/0108392 A1    Apr. 30, 2009

(51) Int. Cl.
   *H01L 23/66* (2006.01)
(52) U.S. Cl. ....................................................... 257/499
(58) Field of Classification Search ................... 257/499
    See application file for complete search history.

(56) References Cited

U.S. PATENT DOCUMENTS 6,593,621 B2 * 7/2003 Tsuchiko et al. ............ 257/335
6,909,114 B1 * 6/2005 Yamazaki .................... 257/66
6,959,127 B2 * 10/2005 Zoorob ......................... 385/16
2007/0020956 A1 * 1/2007 Kamata et al. .............. 438/782

* cited by examiner

*Primary Examiner*—Thomas L Dickey
*Assistant Examiner*—Nikolay Yushin
(74) *Attorney, Agent, or Firm*—Cool Patent, P.C.; Kenneth J. Cool

(57) ABSTRACT

In various embodiments, semiconductor structures and methods to manufacture these structures are disclosed. In one embodiment, a semiconductor device includes a plurality of rectilinear structures, wherein the plurality of rectilinear structures comprise silicon dioxide and extend from a surface of a semiconductor material to a distance of at least about three microns or greater below the surface of the semiconductor material and wherein a first rectilinear structure of the plurality of rectilinear structures is perpendicular to, or substantially perpendicular to, a second rectilinear structure of the plurality of rectilinear structures. Other embodiments are described and claimed.

25 Claims, 48 Drawing Sheets

US 7,598,588 B2

SEMICONDUCTOR STRUCTURE AND METHOD OF MANUFACTURE

TECHNICAL FIELD

Embodiments disclosed in the present disclosure relate generally to electrical and semiconductor technology, and more specifically to a semiconductor structure that includes a dielectric structure.

BACKGROUND

For some applications, such as high frequency or radio frequency ("RF") applications, it may be desirable to form integrated passive devices using semiconductor processing technology or it may be desirable to integrate passive devices such as inductors and/or capacitors together with active devices such as transistors using conductive silicon substrates. However, passive devices may have relatively low quality factors ("Qs") when these passive devices are formed on, or in relatively close proximity to, the conductive silicon substrate. In addition, due to parasitic capacitive coupling between these passive devices and the conductive silicon substrate, the frequency of operation of the integrated devices is reduced. Electrically conductive interconnects or busses may be used to electrically couple different devices within the die and external to the die. The frequency of operation may also be reduced by parasitic capacitive coupling between the interconnects and the conductive silicon substrate.

Further, it may be desirable to physically and electrically isolate regions of a semiconductor substrate from each other. Additionally, some semiconductor devices, such as power transistors, provide relatively high power output, which may be desirable in some RF, industrial, and medical applications. Power transistor designers are continually seeking ways to efficiently increase power output by varying the output voltage and current characteristics of a power transistor. For example, it may be desirable to have a power transistor that has an increased breakdown voltage to enable the power transistor to operate at a relatively higher voltage and provide a relatively higher power output.

Accordingly, it is desirable to have improved semiconductor structures, and methods to make these structures, that may provide for reduced parasitic capacitances, relatively higher frequencies of operation, relatively higher breakdown voltages, relatively higher quality factor passive devices, improved isolation, or combinations thereof.

Figure 1:
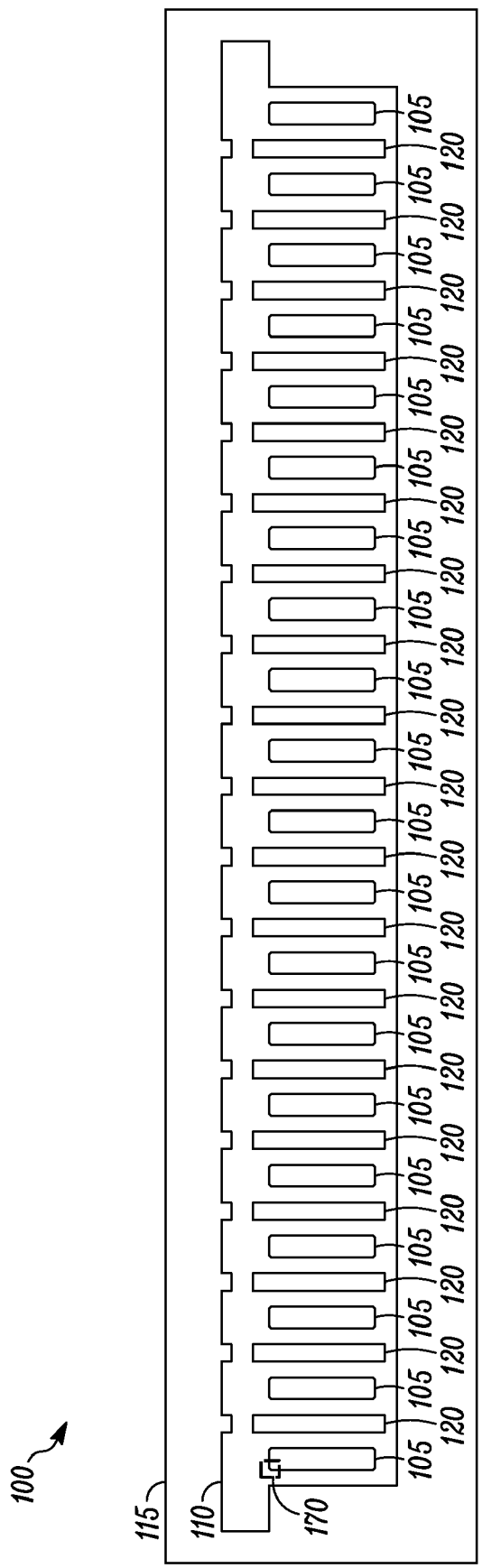
FIG. 1 is a plan view of a device at one stage during manufacturing in accordance with an embodiment of the present invention.

For simplicity of illustration and ease of understanding, elements in the various figures are not necessarily drawn to scale, unless explicitly so stated. Further, if considered appropriate, reference numerals have been repeated among the figures to indicate corresponding and/or analogous elements. In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

DETAILED DESCRIPTION

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements.

FIG. 1 is a plan view of a device 100 at one stage during manufacturing. Device 100 may include at least one active area 105 and at least one dielectric structure 110 formed in conjunction with a substrate 115 that has been formed into a wafer or slice and then into a die, and accordingly, device 100 may be referred to as a die. In some embodiments, dielectric structure 110 may be referred to simply as a structure, an element, a dielectric platform, a dielectric region, or an isolation region. A portion 170 of device 100 is highlighted using a dashed line. Various embodiments of dielectric structure 110 will be discussed below.

Active electrical components or active devices such as, for example, metal oxide semiconductor field effect transistors (MOSFETs), bipolar transistors, or diodes, or portions of active devices, may be formed in active areas 105. Conventional complementary metal oxide semiconductor (CMOS), bipolar, or bipolar-CMOS (BiCMOS) semiconductor processes may be used to form the active electrical components in device 100.

In the example shown in FIG. 1, twenty active area regions or islands 105 are surrounded by the dielectric structure 110 and are separated from one another by intervening areas 120.

The individual active areas 105 may be referred to as banks, and may be electrically coupled to each other such that the elements, for example, transistors, of the separated banks are coupled to each other to perform an equivalent function of a single active area. In one example, intervening areas 120 may each comprise about one micron thick field oxide separating the individual active areas 105, and the center-to-center spacing of the active areas 105 may be about 216 microns (um). In this example, each active area 105 may include 8 by 21 transistor cells (not shown in FIG. 1) for a total of 168 transistors cells per active area 105. The length of each active area 105 may be about 600 microns and the width may be about 160 microns. Bus connections (not shown in FIG. 1) may be provided to ensure that active areas 105 retain equivalent, or substantially identical, electrical potential to each other to prevent oscillation at the output.

The thermal advantage of this example, which may be called the "spread-cell" approach, with banks of transistors spread apart by relatively large distances (for example, at least several microns), may be significant. In some embodiments, the source of heat resides in an epitaxial layer of the active area. Thermal energy may be dissipated through electrical contacts or interconnects, such as, for example, bumps 106 (FIG. 6), that are coupled to active areas 105. As thermal vectors rise toward the electrical contacts, they tend to spread out, exiting the surface of the active area at approximately a 45 degree angle. The relatively large distance of separation between each active area 105 may allow for efficient heat dissipation without creating excessive hotspots due to constructive buildup of thermal energy due to clustering of transistor cells in a single region.

In some embodiments, dielectric structure 110 may surround each active area 105. As will be discussed further below, surrounding the active area 105 with dielectric structure 110 assists in inducing planar breakdown in the transistor cells within each active area 105, and therefore, may increase the resulting breakdown voltage of the transistors within each active area 105. In other embodiments, dielectric structure 110 may be located adjacent to the active area, but not surround the active area.

Figure 2:
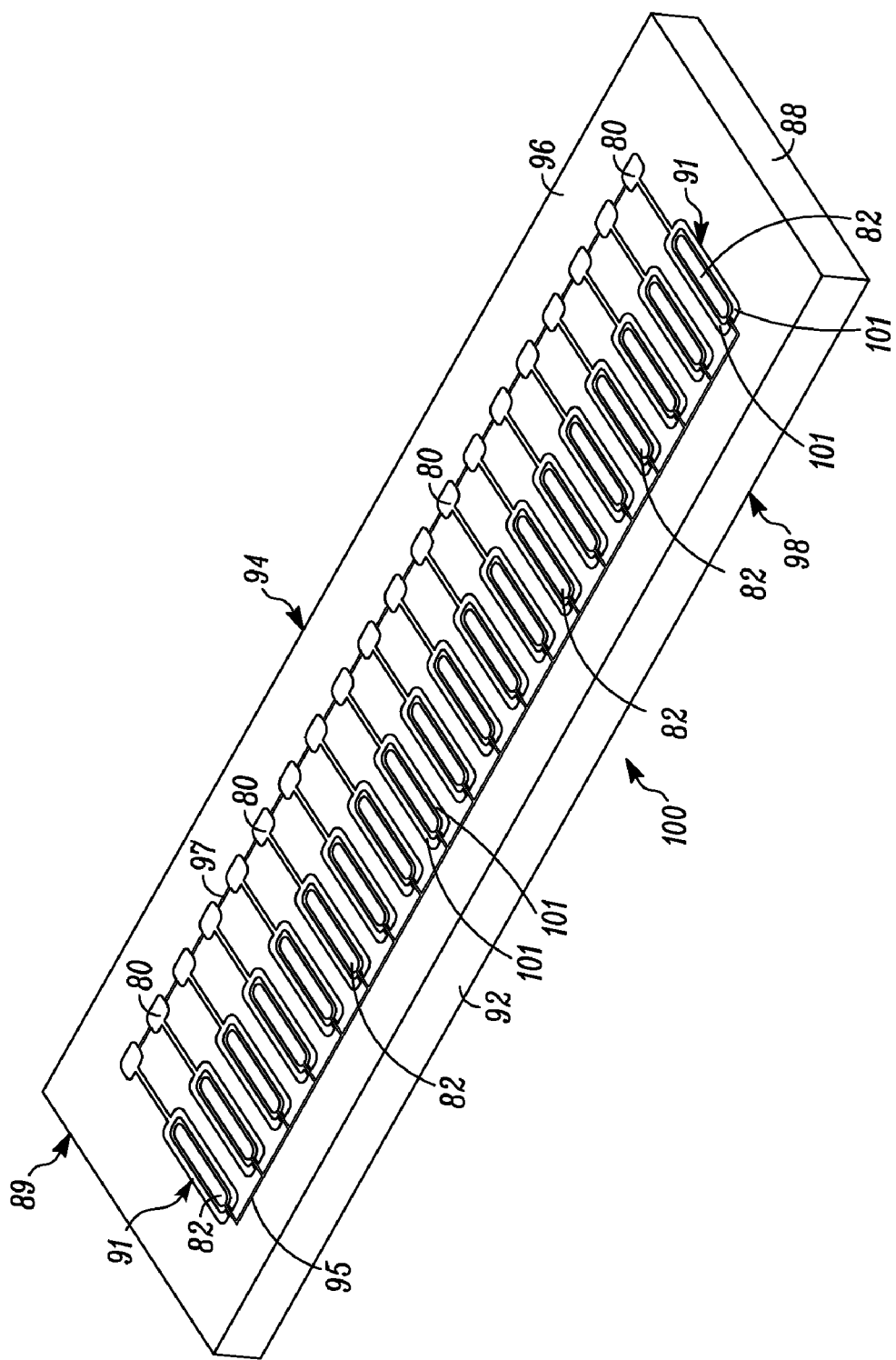
FIG. 2 is an isometric view of the device of FIG. 1 at a later stage of manufacture.

FIG. 2 is an isometric view of device or die 100 at a later stage of fabrication. Die 100 has sides or edges 92 and 94 that are substantially parallel to each other, edges 88 and 89 that are substantially parallel to each other, and a top surface 96 and a bottom surface 98 that are substantially parallel to each other. Semiconductor die 100 may comprise a semiconductor material such as, for example, silicon (Si) or gallium arsenide (GaAs).

Although the scope of the present invention is not limited in this respect, in some embodiments, the length of semiconductor die 100, that is, the distance between edges 88 and 89 is about 5,080 micrometers (μm). The width of semiconductor die 100, that is, the distance between edges 92 and 94 is about 1,270 μm. The thickness of semiconductor die 100, that is, the distance between surfaces 96 and 98 ranges from about 125 μm to about 625 μm.

Semiconductor die 100 includes an electrical interconnect layer 95 and an electrical interconnect layer 97. Electrical interconnect layer 95 includes electrical pads 82 and may be a metal layer comprising, for example, aluminum, copper, or gold. Similarly, electrical interconnect layer 97 includes electrical pads 80 and may be a metal layer comprising, for example, aluminum, copper, or gold.

Portions of interconnection 95 are formed over active areas 105 (FIG. 1) and over dielectric structure 110 (FIG. 1). Electrical interconnection 97 is formed over a portion of dielectric structure 110 (FIG. 1).

In some embodiments, each active area 105 (FIG. 1) includes a plurality of field effect transistors (FETs). Electrical pads 82 of electrical interconnect layer 95 may be coupled to a portion of the transistors formed in active areas 105. For example, electrical pads 82 may be coupled to source regions of the FETs formed in active areas 105. Electrical pads 80 of electrical interconnect layer 97 may be coupled to gates of the FETs formed in the active areas 105.

Referring to both FIGS. 1 and 2, in one example, gate interconnect layer 97 is formed over dielectric platform 110 to reduce parasitic capacitance between the gate interconnect layer 97 and the substrate 115.

Semiconductor die 100 is comprised of twenty transistor cell regions 91, wherein each transistor cell region 91 comprises a plurality of active devices such as, for example, transistors, although the methods and apparatuses described herein are not limited in this regard.

Figure 14:
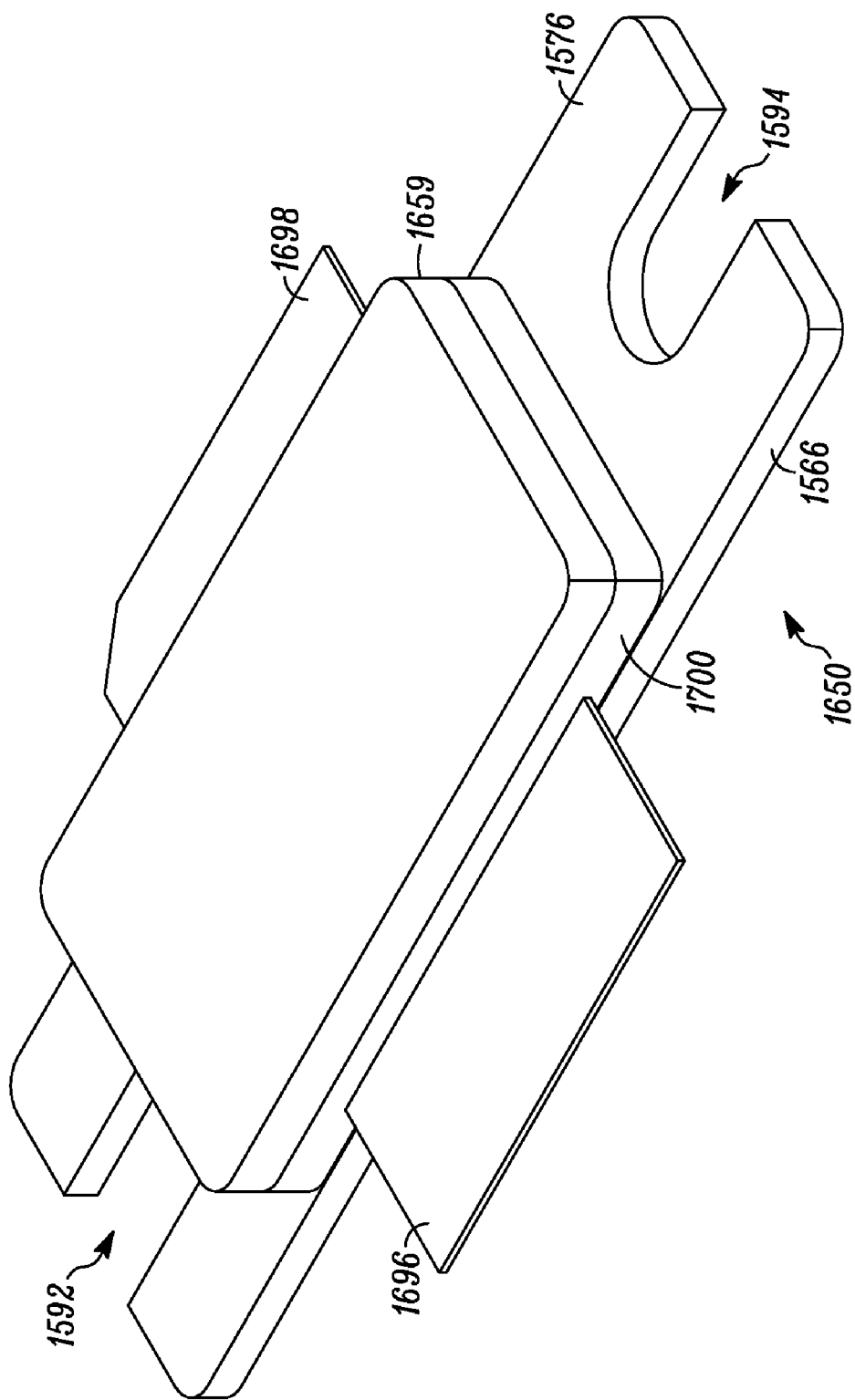
FIG. 14 is an isometric view of a semiconductor component in accordance with an embodiment of the present invention.

In some embodiments, semiconductor die 100 is a discrete transistor such as a discrete power transistor, wherein each transistor cell region 91 comprises, for example, a plurality of vertical metal oxide semiconductor field effect transistors (MOSFETs) or vertical bipolar transistors (not shown). The transistors of the multiple transistor cell regions 91 are coupled to each other to function as a single transistor. For example, the gates of the transistors may be coupled together, the source electrodes may be coupled together, and the drain electrodes may be coupled together to function as a single or discrete FET. In these embodiments, semiconductor component 1650 (FIG. 14) may be referred to as discrete semiconductor device, having an input lead 1696 (FIG. 14), an output lead 1698 (FIG. 14), and a common lead 1566 (FIG. 14). Leads 1696, 1698, and 1566 are electrically isolated from each other and may also be referred to as terminals, interconnects, or interconnections.

A power transistor is a device that may be capable of handling a relatively large amount of electrical current such as, for example, at least about 100 milliamps (mA) of electrical current or greater in some embodiments. In addition a power transistor is a device that can be coupled to relatively large operating voltage potentials of, for example, at least about 20 volts to over 100 volts, and may be used in power amplifiers to generate at least about one watt of output power.

Although the scope of the present invention is not limited in this respect, in some embodiments, semiconductor die 100 is a radio frequency (RF) power transistor constructed to operate at frequencies of greater than about one megahertz (MHz) and to have a power output greater than about one watt. RF power transistors can be used in RF power amplifiers that may be used in wireless communications applications such as, for example, cellular base stations, high frequency (HF), very high frequency (VHF) and ultra high frequency (UHF) broadcast transmitters, microwave radar systems, and avionics systems. Some RF power amplifiers (RFPAs) provide from about five watts (W) to more than about 200 W of output power. In some embodiments, semiconductor die 100 is a RF power transistor adapted to operate at frequencies of greater than about 500 megahertz (MHz) and has an output power greater than about five watts.

In the embodiments wherein semiconductor die 100 includes vertical MOSFETs (not shown), these vertical MOSFETs each have a source region (not shown), a drain region (not shown), a channel region between the source and drain regions, and a gate (not shown). Die 100 may include an active layer in active area 105 such as, for example, epitaxial layer 504 (FIG. 21), and the source, drain, and channel regions may be formed in the active layer. Electrical pads 82 may be coupled to the source regions of the vertical MOSFETs and may be referred to as source pads, contacts, terminals, interconnects, or interconnections. Further, source pads 82 are coupled together to function as a single source interconnect. Electrical pads 80 may be coupled to the gates of the vertical MOSFETs and may be referred to as gates pads, contacts, terminals, interconnects, or interconnections. Further, gate pads 80 are coupled together to function as a single gate interconnect. In addition, semiconductor die 100 includes a drain interconnect or terminal 99 (FIG. 13) over surface 98 of die 100, wherein the drain interconnect 99 is coupled to the drain regions of the vertical MOSFETs.

The vertical MOSFET is vertical in that the source pads 82 and drain terminal 99 are on or adjacent opposite surfaces of semiconductor die 100. The gate pads 80 are formed on the same surface 96 of die 100 as the source pads 82. During operation, the electrical current flow from the source pads 82 to the drain terminal 99 in the discrete vertical power transistor may be substantially perpendicular to the surfaces 96 and 98 of semiconductor die 100. In other words, current flows essentially vertically through the vertical MOSFET from the source pads 82 located adjacent one surface 96 of semiconductor die 100 to a drain interconnect 99 located adjacent to the opposite surface 98 of semiconductor die 100. An example of a vertical power transistor is described in U.S. patent application Ser. No. 10/557,135, entitled "POWER SEMICONDUCTOR DEVICE AND METHOD THEREFOR," filed Nov. 17, 2005, which claims priority to Patent Cooperation Treaty (PCT) International Application Number PCT/US2005/000205 entitled "POWER SEMICONDUCTOR DEVICE AND METHOD THEREFOR," having an International Filing Date of Jan. 6, 2005 and an International Publication Date of Jul. 28, 2005, the contents of both of these patent applications are incorporated herein by reference in their entirety.

In other embodiments, the transistors in semiconductor die 100 may be vertical bipolar transistors such as insulated gate bipolar transistors (IGBTs). In such embodiments, one side of semiconductor die 100 may have an emitter region and a base region. The other side of the die may have a collector region.

Although semiconductor die 100 is described as including vertical transistors in some embodiments, this is not a limitation of the present invention. In alternate embodiments, semiconductor die 100 may include lateral transistor structures such as, for example, a laterally diffused metal-oxide-semiconductor (LDMOS) transistor structure. In an LDMOS power transistor, the gate, source region, and the drain region are located adjacent the same surface of a semiconductor die and electrical current flows laterally through the transistor between the source and drain regions of the LDMOS power transistor. In other words, in lateral transistor embodiments, during operation, the electrical current flow from a source region to a drain region in the lateral transistor may be substantially parallel to the surfaces 96 and 98 of semiconductor die 100.

Generally, transistors such as bipolar transistors and field effect transistors (FETs) discussed herein are understood to provide a conduction path between first and second conduction electrodes when a control signal is applied to a control electrode. For example, in a FET a channel region formed between the drain and source provides the conduction path which is controlled in accordance with the magnitude of the control signal. The gate electrode of a FET may be referred to as a control electrode and the drain and source electrodes of a FET may be referred to as current carrying electrodes or conduction electrodes. Likewise, the base of a bipolar transistor may be referred to as the control electrode and the collector and emitter electrodes of the bipolar transistor may be referred to as conduction electrodes or current carrying electrodes. In addition, the drain and source electrodes of a FET may be referred to as power electrodes and the collector and emitter electrodes of a bipolar transistor may also be referred to as power electrodes.

Figure 3:
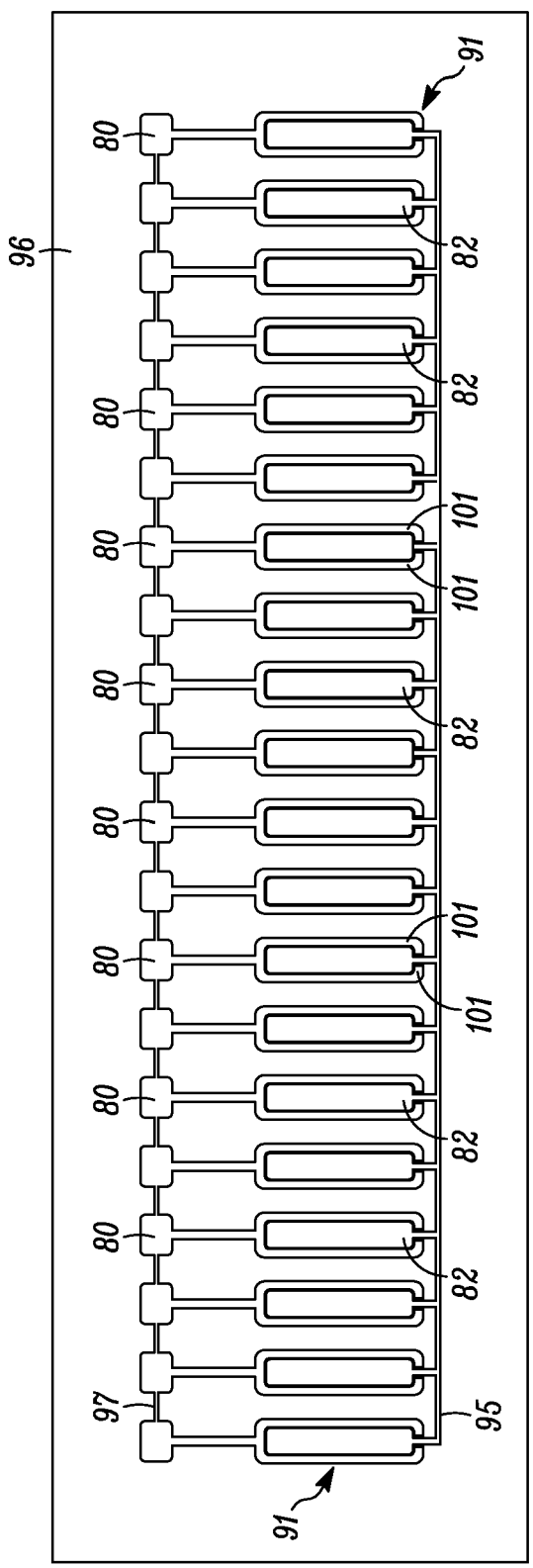
FIG. 3 is a top view of the device of FIG. 3.

FIG. 3 is a top view of semiconductor die 100. Electrical interconnect layer 97 includes extensions 101 that are spaced apart from source bond pads 82. Extensions 101 surround three sides of source bond pads 82 and are laterally adjacent a fourth side of source bond pads 82.

Figure 4:
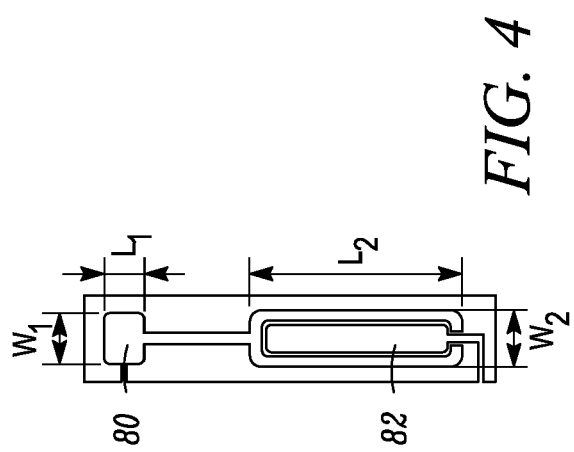
FIG. 4 is a top view of a single gate pad and source pad of the device of FIG. 3.

FIG. 4 is a top view of a single gate pad 80 and source pad 82 of semiconductor die 100. FIG. 4 shows a width, labeled $W_2$, and a length, labeled $L_2$ and shows electrical pad 80 having a width, labeled $W_1$, and a length, labeled $L_1$. In some embodiments, the width $W_1$ is approximately 94 um, the length $L_1$ is approximately 83 um, the width $W_2$ is approximately 120 um, and the length $L_2$ is approximately 493 um.

Figure 5:
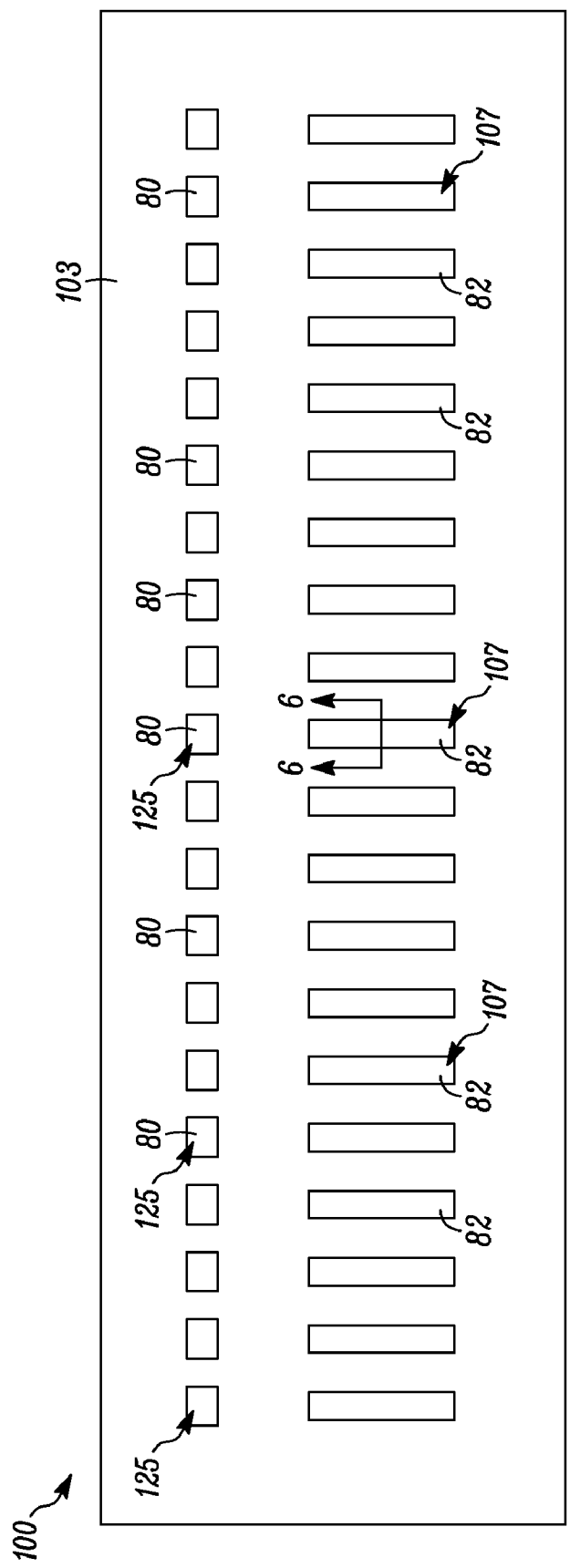
FIG. 5 is a top view of the device of FIG. 3 at a later stage of manufacture.

FIG. 5 is a top view of semiconductor die 100 at a later stage of manufacturing. A passivation layer 103 is formed over die 100. Passivation layer 103 is patterned to form openings 125 and 107 to expose portions of bond pads 80 and 82 for subsequent assembly processing to connect wafer bumps 104 (FIG. 6) and 106 (FIG. 6) to bond pads 80 and 82, respectively. In some embodiments, passivation layer 103 may be an oxide layer.

Openings 125 that expose gate bond pads 80 are within the lateral boundaries of gate bond pads 80 and openings 107 that expose source bond pads 82 are within the lateral boundaries of source bond pads 82.

Figure 6:
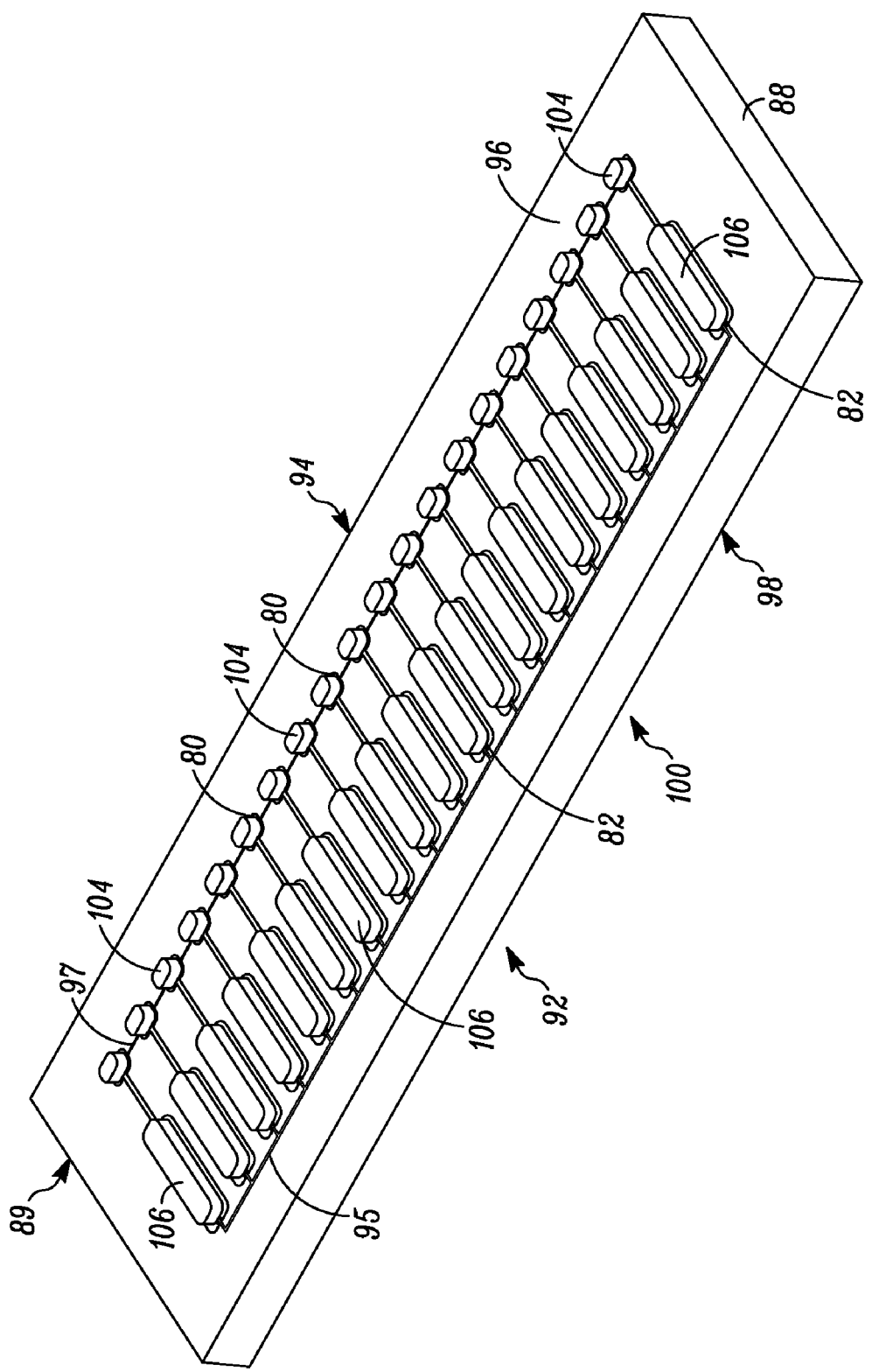
FIG. 6 is an isometric view of the device of FIG. 3 at a later stage of manufacture.

FIG. 6 is an isometric view of semiconductor die 100 at a later stage of manufacturing. For purposes of clarity, passivation layer 103 is not shown in FIG. 6 to illustrate the formation of wafer bumps 104 and 106.

Gate bumps 104 are formed contacting gate bond pads 80 and source bumps 106 may be formed contacting source bond pads 82 using, for example, eutectic bonding. Bumps 104 and 106 may be referred to as wafer bumps that may be formed on die 100 while die 100 is still part of a wafer.

Figure 10:
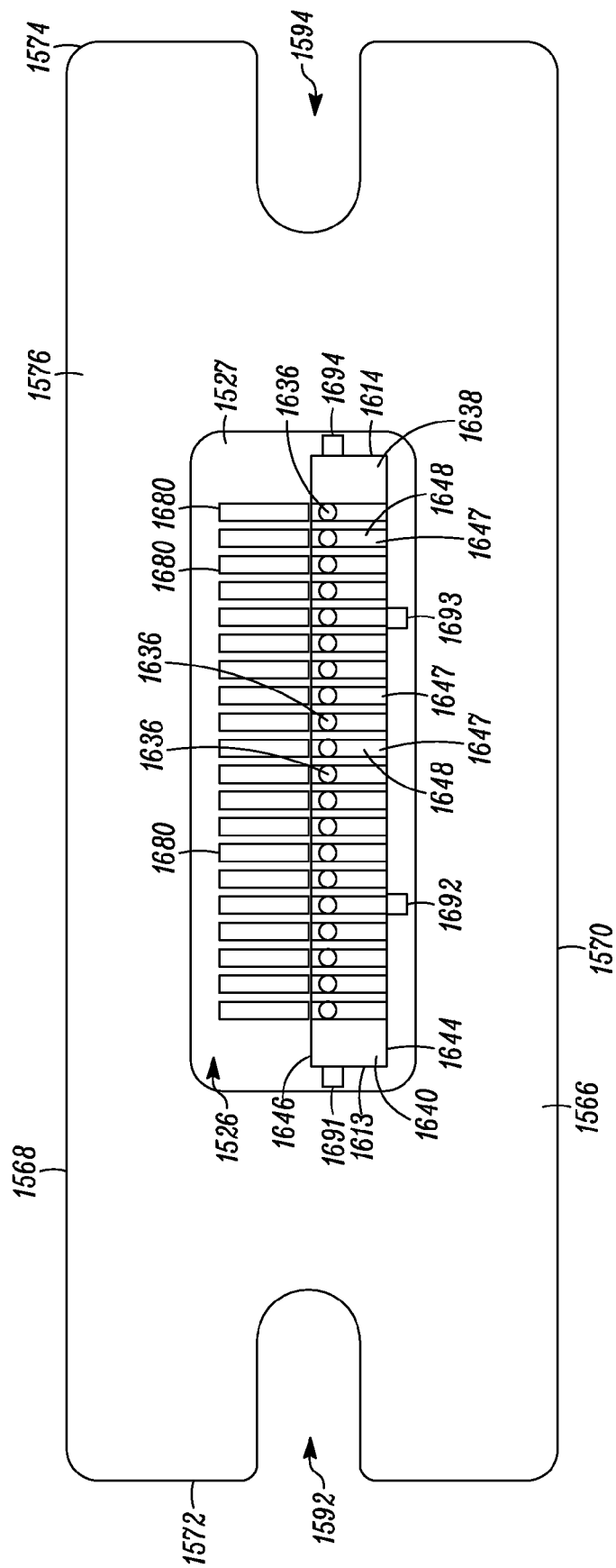
FIG. 10 is a plan view of the flange of FIG. 8 at a later stage of manufacture.

Although not shown in FIG. 6, drain interconnect 99 (FIG. 13) of die 100 may be a layer of an electrically conductive material such as, for example, gold or copper, that may be formed overlying surface 98 of die 100 prior to coupling die 100 to interposer 1638 (FIG. 10) and flange 1566 (FIG. 10). Source terminals 106, gate terminals 104, and drain terminal 99 are electrically isolated from each other.

In some embodiments, wafer bumps 106 may each have a length of about 500 μm and a width of about 120 μm and wafer bumps 104 may each have a length of about 80 μm and a width of about 80 μm. In addition, bumps 104 and 106 may have a height or thickness ranging from about 25 μm (about 1 mil) to about 100 μm (about 4 mils). As may be appreciated, a mil is one-thousandth of an inch. Further, bumps 106 may be spaced apart from each other by about 60 microns, although the methods and apparatuses described herein are not limited in this regard.

Bumps 104 and 106 may be useful for coupling elements of the active area of die 100 to other electrical elements or components within or external to a package employed to encapsulate and protect die 100 and attendant circuitry from environmental insults, such as chemical attack, physical abrasion and the like.

The height of wafer bumps 104 and 106 may be set to provide a predetermined amount of space or air between die 100 and flange 1566 (FIG. 10). In embodiments wherein die 100 comprises a plurality of transistors coupled together to function as a discrete power transistor, spacing die 100 further from flange 1566 (FIGS. 10 and 11) can increase the standoff voltage of die 100. As a general guideline, for every 25 μm (1 mil) of air or space, this may result in about 50 volts of standoff voltage. Thus, forming bumps 104 and 106 to have a height of at least about 50 μm may result in die 100 being capable of having a standoff voltage of at least about 100 volts. As is generally understood, the standoff voltage is typically designed to be greater than the desired breakdown voltage of the device. For example, if the desired breakdown voltage of die 100 is about 100 volts, then the standoff voltage of die 100 should be at least about 100 volts or greater. In some embodiments, the heights of the wafer bumps 104 and 106 are substantially similar, although other arrangements are possible.

In the embodiments wherein semiconductor die 100 is a discrete power transistor, spacing flange 1566 (FIGS. 10 and 11) further away from the edges of semiconductor die 100 may be advantageous to increase the breakdown voltage of a semiconductor component that includes die 100.

In some embodiments, flange 1566 (FIGS. 10 and 11) may be coupled to ground and the drain terminal 99 of die 100 may be coupled to a relatively high voltage of, for example, a voltage potential ranging between at least about 20 volts (V) to over 100 V. During operation, electric field potentials may be concentrated at the edges of semiconductor die 100, and therefore, it may be advantageous to position flange 1566 (FIGS. 10 and 11) spaced apart at a predetermined distance from the edges of semiconductor die 100 to prevent arcing between die 100 and flange 1566 (FIGS. 10 and 11) which may adversely affect the breakdown voltage of the power transistor of die 100. As was discussed above, wafer bumps 104 and 106 are formed to have a predetermined height ranging from approximately 25 μm to approximately 100 μm to provide this amount of spacing between die 100 and flange 1566 (FIGS. 10 and 11) to support drain-to-source breakdown voltages (BVds) ranging from about 50 volts to about 200 volts.

Further, forming dielectric underfill material (not shown) such as, for example, a polyimide, in the spaces between flange 1566 (FIGS. 10 and 11) and die 100 may further increase the standoff and breakdown voltages of die 100.

Figure 11:
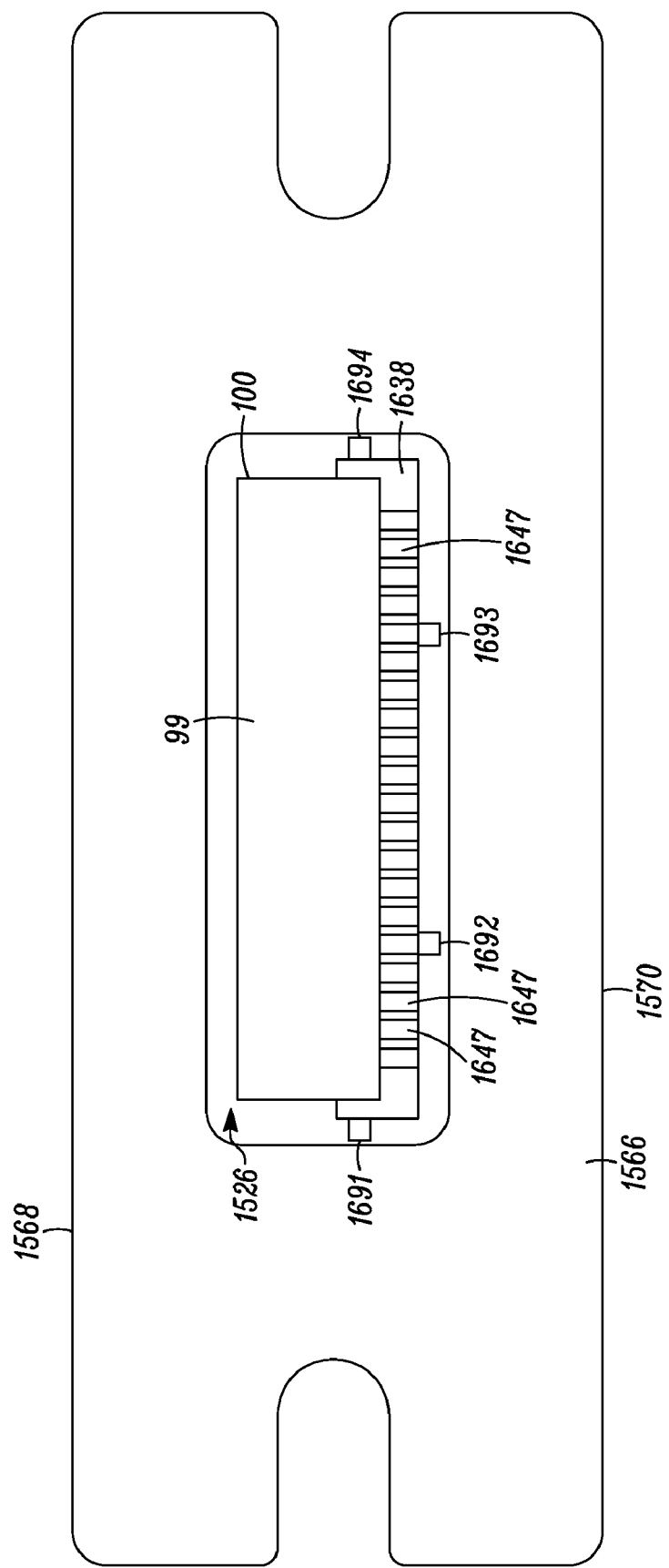
FIG. 11 is a plan view of the semiconductor die of FIG. 6 bonded to the subassembly illustrated in FIG. 10.

Wafer bumps 106 may be relatively high current-carrying contacts for a power electrode of a gain element such as a transistor. For example, wafer bumps 106 may be current carrying contacts for a source of a discrete power field effect transistor (FET). In addition, bumps 106 may also function as a thermal path to transfer heat from the die 100 to a heat sink or heat spreader such as, for example, flange 1566 (FIGS. 10 and 11). For example, bumps 106 may be coupled to the source regions of transistors formed in active areas 105 (FIG. 1) and heat generated in active areas 105 during the operation of the transistors may be transferred from the active areas 105 to a heat sink or heat spreader via bumps 106. As may be appreciated, contact between all of bumps 106 and flange 1566 (FIGS. 10 and 11) may enhance the thermal conductivity to remove heat generated by die 100. If contact to only some, but not all, of bumps 106 is made by flange 1566 (FIGS. 10 and 11), then optimal removal of heat from die 100 may not be achieved.

Dielectric structure 110 (FIG. 1) provides mechanical support for wafer bump 104 and dielectric structure 110 also reduces parasitic capacitance between wafer bump 104 and substrate 115. Wafer bump 104 may also assist to some extent with heatsinking of die 100.

In control electrode contact scenarios, the example illustrated in FIG. 6 provides wafer bumps 104 capable of providing electrical interconnections having reduced parasitic reactance in comparison to conventional control electrode contact methodologies and structures since wafer bumps 104 are formed over dielectric structure 110 (FIG. 1). As a result, such is capable of contributing to reduced gate-to-drain, base-to-collector or control-to-output electrode capacitance, and thus favoring relatively reduced "Miller" capacitance with respect to associated active elements, including, for example, field effect transistors (FETs) formed in active areas 105 (FIG. 1), formed such that the conductive substrate material 115 provides a distributed power or drain region.

Wafer bumps 104 and 106 may be referred to as interconnects, interconnections, or semiconductor die attach elements. As discussed herein, advantages of forming wafer bumps 104 and 106 having a thickness of at least about 25 microns or greater include increasing the standoff voltage of die 100 to support relatively higher drain-to-source breakdown voltages (BVds) and reducing the drain-to-source capacitance ("Cds"). Increasing the standoff and breakdown voltages of die 100 results in devices that may be operated with relatively higher voltages and reducing the parasitic capacitances of component 1650 (FIG. 14) may increase the operating frequency of component 1650. Further, forming relatively large wafer bumps 104 and 106 such as described herein, provide bumps that have a relatively high electrical current conduction and thermal conduction capability. In addition, if bumps 104 and 106 comprise a relatively malleable material such as, for example, gold or a gold alloy, this may aid in the manufacturing and operation of semiconductor component 1650 (FIG. 14), as bumps 104 and 106 may deform or absorb mechanical stress that may be caused by a CTE mismatch of the material of die 100, the material of flange 1566, and the material of interposer 1638 (FIG. 10).

Figure 7:
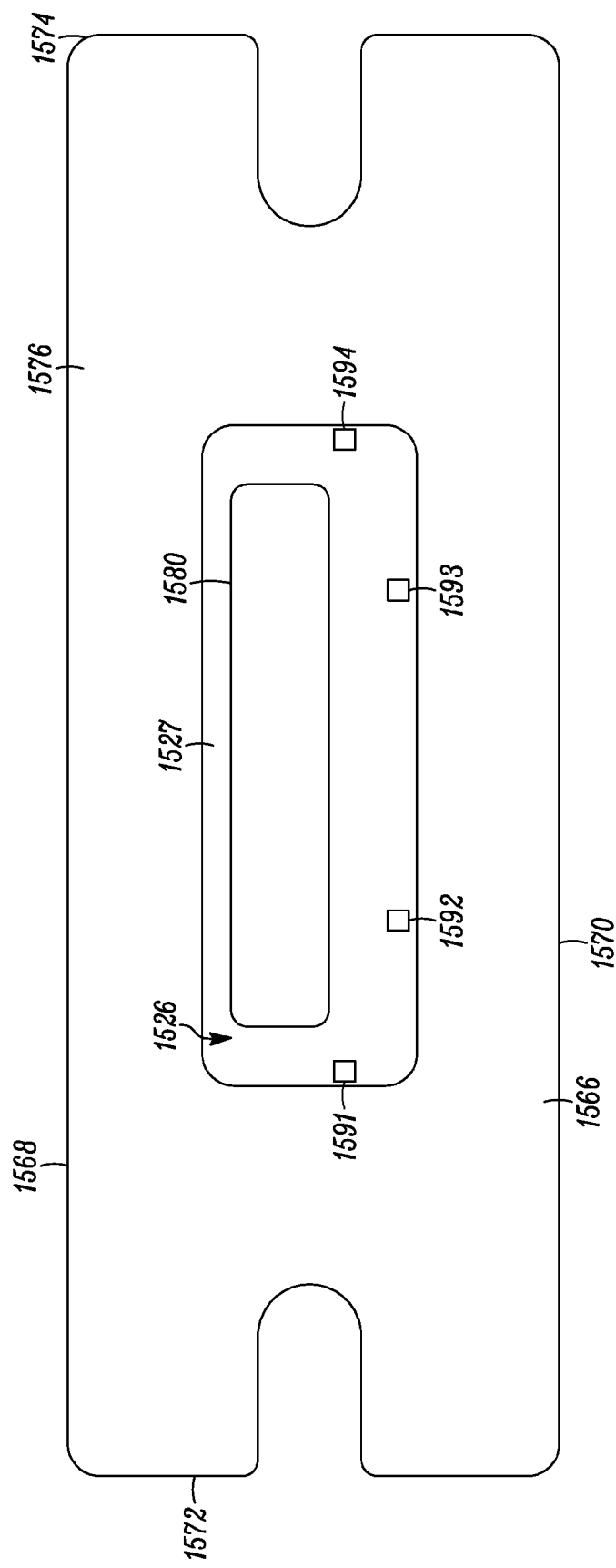
FIG. 7 is a plan view of a flange used in the manufacture of a the semiconductor component illustrated in FIG. 14 in accordance with an embodiment of the present invention.

FIG. 7 is a plan view of a flange 1566 used in the manufacture of a semiconductor component 1650 (FIG. 14) in accordance with an embodiment of the present invention. Flange 1566 may be a heat sink or heat spreader. Flange 1566 has opposing surfaces or sides 1568 and 1570 that are substantially parallel to each other, opposing sides 1572 and 1574 that are substantially parallel to each other, and a top surface 1566. In some embodiments, flange 1566 is made from a material having a CTE matching, or substantially matching, that of silicon or ceramic. Examples of suitable materials for flange 1566 include copper, an alloy such as a copper alloy, or a copper-tungsten alloy. In addition, the material for flange 1566 may include metal laminates such as, for example, a copper-molybdenum-copper laminate. The material for flange 1566 is not a limitation of the present invention. Thus, flange 1566 can be made from materials having CTEs that do not match those of silicon or ceramic.

In some embodiments, flange 1566 is formed from a substrate comprising a copper layer having a thickness of about six mils (about 150 μm), a copper-molybdenum-copper layer over the copper layer having a thickness of about twenty-eight mils (about 700 μm), and another copper layer over the copper-molybdenum-copper layer having a thickness of about six mils (about 150 μm). In other embodiments, flange 1566 is formed from a substrate comprising a silver layer having a thickness of about six mils (about 150 μm), a silver-diamond-silver layer over the silver layer having a thickness of about twenty-eight mils (about 700 μm), and another silver layer over the silver-diamond-silver layer having a thickness of about six mils (about 150 μm).

A slot, groove, or cavity 1526 having a lower surface 1527 is formed in flange 1566. Cavity 1526 extends inward from top surface 1576 toward surface 1527. In other words, cavity 1526 extends from top surface 1576 into flange 1566. Surface 1527 is parallel to, or substantially parallel to, top surface 1576 of flange 1566. Surface 1527 is a lower boundary of cavity 526.

Cavity 1526 may be formed by machining, milling, etching, grinding, or stamping. Cavity 1526 may have a rectangular shape, a quadrilateral shape, or other polygonal shape. In addition, cavity 1526 may have an oval shape. The shape of cavity 1526 is not a limitation of the present invention. Cavity 1526 may have a depth of about 6 mils (about 150 μm) or about 12 mils (about 150 μm), although the scope of the present invention is not limited in this respect.

A pedestal structure 1580 and pillar structures 1591, 1592, 1593, and 1594 are formed from flange 1566 in cavity 1526. Pedestal 1580 and pillars 1591, 1592, 1593, and 1594 may be formed using photolithographic and etching processes. In embodiments wherein flange 1566 comprises a base copper layer, a copper-molybdenum-copper layer over the copper layer, and an upper copper layer over the copper-molybdenum-copper layer, the photolithography and etching may include forming a layer of a radiation-sensitive material, such as photoresist (not shown), over the upper copper layer, then exposing the photoresist using, for example, ultraviolet (UV) radiation to form a mask, and then etching a portion of the upper copper layer using the photoresist mask stopping at the copper-molybdenum-copper layer to form cavity 1526, pedestal 1580, and pillars 1591, 1592, 1593, and 1594.

Figure 8:
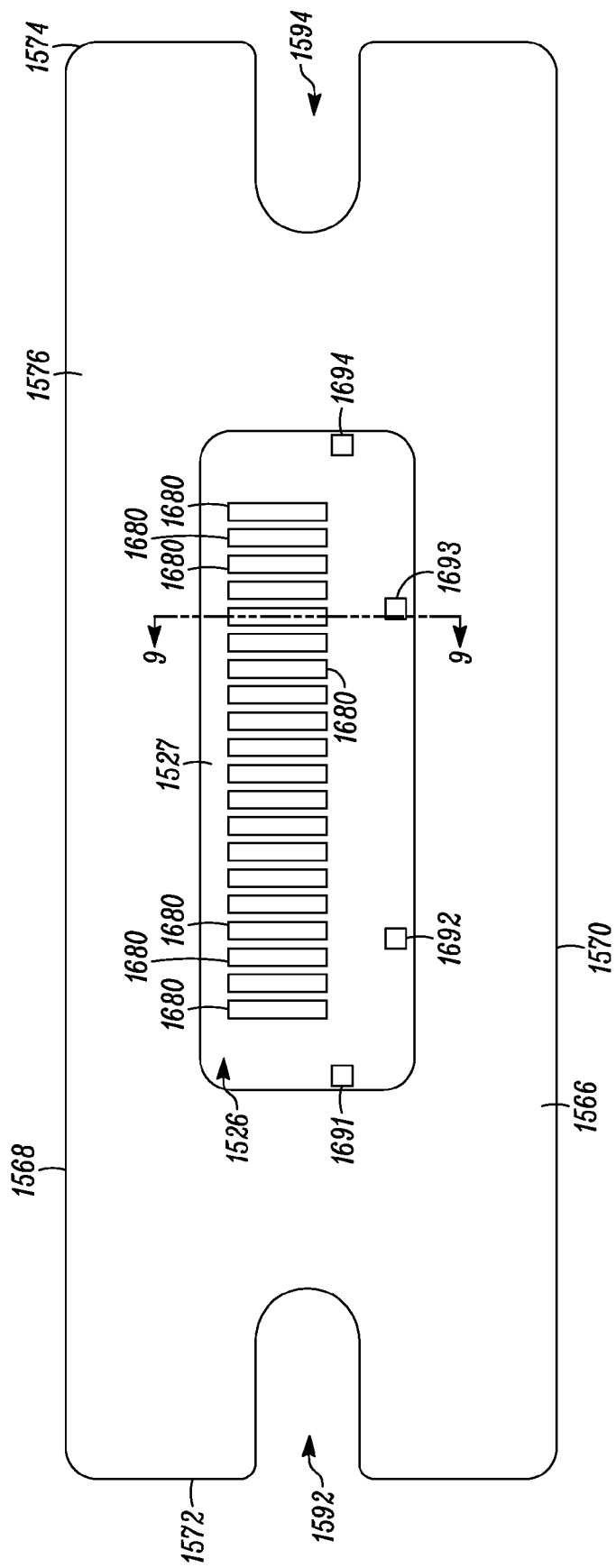
FIG. 8 is a plan view of the flange of FIG. 7 at a later stage of manufacture.

FIG. 8 is a plan view of flange 1566 at a later stage of fabrication. A coining or stamping operation is performed to form pedestal structures 1680 from pedestal structure 1580 (FIG. 7) and to form pillar structures 1691, 1692, 1693, and 1694 from pillar structures 1591 (FIG. 7), 1592(FIG. 7), 1593(FIG. 7), and 1594(FIG. 7), respectively.

Pedestals 1680 are integral to flange 1566 and may be referred to as platforms, pedestal portions, protrusions, projections, projection portions, or extension portions. Similarly, pillars 1691, 1692, 1693, and 1694 are also integral to flange 1566 and may be referred to as protrusions, projections, projection portions, or extension portions. Although pedestals 1680 and pillars 1691, 1692, 1693, and 1694 are shown as rectangular shaped, this is not a limitation of the present invention. For example, pedestals 1680 and pillars 1691, 1692, 1693, and 1694 may be trapezoidal shaped in other embodiments.

Figure 9:
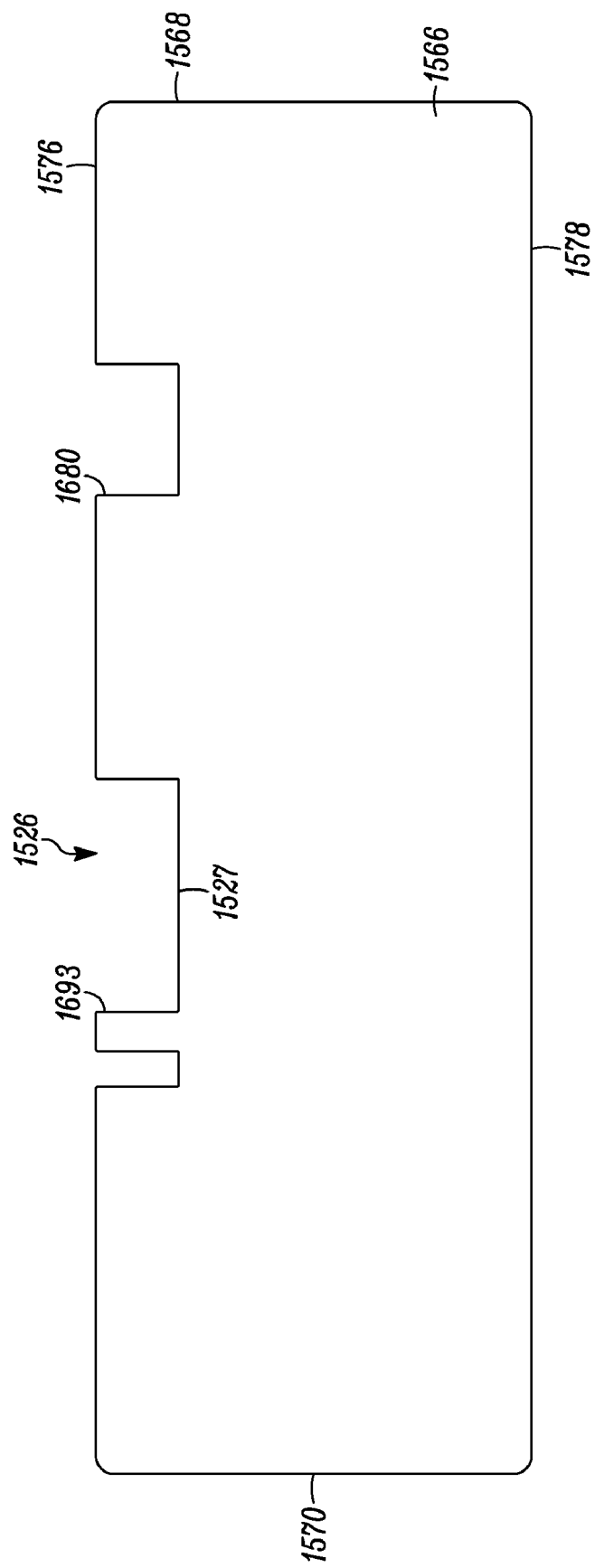
FIG. 9 is a cross-sectional side view of the flange of FIG. 8 taken along section line 9-9 of FIG. 8.

Turning briefly to FIG. 9, FIG. 9 is a cross-sectional side view of flange 1566 of FIG. 8 taken along section line 9-9 of FIG. 8. Pedestal 1680 is in cavity 1526 and extends upward from surface 1527 of flange 1566. In other words, pedestal 1680 extends upward from a lower portion of cavity 1526. A top surface of pedestal 1680 is coplanar to, or substantially coplanar to, top surface 1576 of flange 1566 and the top surface of pillar 1693. Surface 1527 is parallel to, or substantially parallel to, top surface 1576 and a bottom surface 1578 of flange 1566. In addition, surface 1527 is noncoplanar to surfaces 1576 and 1578 of flange 1566. In some embodiments, pedestals 1680 and pillars 1691, 1692, 1693, and 1694 extend from surface 1527 a distance of about 12 mils (about 300 μm).

Referring back to FIG. 8, notches 1592 and 1594 extend inward from sides 1572 and 1574, respectively, into flange 1566 and are typically used for securing semiconductor component 1650 (FIG. 14) to another structure such as, for example, a printed circuit board (PCB) or heat sink, using, for example, a fastener means such as a screw or bolt. Notches 1592 and 1594 are optional, as other means may be used to secure flange 1566 to other structures.

FIG. 10 is a plan view of flange 1566 at a later stage of fabrication. A solder preform (not shown) is placed in cavity 1526, on surface 1527, between pedestals 1680 and pillars 1691, 1692, 1693, and 1694. The solder preform may have a thickness of about one mil (about 25 μm). Suitable materials for the solder preform include a gold-germanium solder, a tin-silver-copper solder, a tin-silver solder, or a tin-copper solder. Alternatively, a high temperature adhesive such as, for example, an epoxy, may be placed in cavity 1526 rather than a solder preform. The solder preform materials and the adhesive materials are not limitations of the present invention.

An interposer 1638 is placed on the solder perform. Interposer 1638 may also be referred to as a connector. In some embodiments, interposer 1638 comprises a rectangular shaped dielectric material having a top surface 1640, opposing sides 1644 and 1646 that are parallel to, or substantially parallel to, each other, and opposing sides 1613 and 1614 that are parallel to, or substantially parallel to, each other. Surface 1640 may also be referred to as a bonding pad surface. Suitable materials for interposer 1638 include ceramic, polyimide, FR4, printed circuit board material, semiconductor material such as, for example, silicon or gallium arsenide, or organic polymers. The dimensions of interposer 1638 are selected so that it fits in cavity 1526. Structures 1680, 1691, 1692, 1693, and 1694 act as registration structures to position interposer 1638 in cavity 1526. For example, side 1644 of interposer 1638 may contact or abut pillars 1692 and 1693, side 1614 of interposer 1638 may contact or abut pillar 1694, side 1613 of interposer 1638 may contact or abut pillar 1691, and side 1646 of interposer 1638 may contact or abut one or more of pedestal structures 1680. In some embodiments, cavity 1526 has a length ranging from about 5 millimeters (mm) to about 12 mm, a width ranging from about 1 mm to about 2 mm, and a depth or thickness ranging from about 0.4 mm to about 0.6 mm. In these embodiments, interposer 1638 has a length ranging from about 4 millimeters (mm) to about 10 mm, a width ranging from about 0.8 mm to about 1.8 mm, and a thickness of about 10 mils (about 250 μm).

Interposer 1638 may include gate interconnect pads 1647 that are formed on bond pad surface 1640. By way of example, gate interconnect pads 1647 are rectangular metal strips that are substantially parallel to each other. Gate interconnect pads 1647 have bonding surfaces 1648. In addition, solder balls 1636 may be formed on a portion of gate interconnect pads 1647. Solder balls 1636 may have a thickness of about three mils (about 75 μm) in some embodiments.

Techniques for forming interconnect pads such as gate interconnect pads 1647 on top surface 1640 of interposer 1638 may include, for example, forming a layer of electrically conductive material such as, for example, copper or aluminum over surface 1640 of interposer 1638, and subsequently removing portions of this layer of electrically conductive material by, for example, an etching process to form pads 1647. Although the material disposed on surface 1640 has been described as being metal strips, it should be noted that this is not a limitation of the present invention. Rather than metal strips, in alternate embodiments, metal strips 1647 on surface 1640 may be a single continuous piece of electrically conductive material such as, for example, a layer of material comprising copper that overlies a substantial portion of surface 1640. However, in some embodiments, such as embodiments wherein a discrete transistor semiconductor die such as, die 100 (FIG. 6), is coupled to interposer 1638 and flange 1566, an advantage of using metal strips is that it reduces the amount of gate metal on interposer 1638 that can capacitively couple to the drain of die 100, thereby lowering the gate-to-drain capacitance ("Cgd").

A heater (not shown) may be used to apply heat to the subassembly shown in FIG. 10. The heat may melt the solder preform (not shown) that is under interposer 1638, thereby attaching interposer 1638 to flange 1566. Another stamping operation may be used to flatten the upper portions of pedestals 1680 and pillars 1691, 1692, 1693, and 1694 so that the top surfaces of pedestals 1680 and pillars 1691, 1692, 1693, and 1694 are coplanar, or substantially coplanar, with each other. In some embodiments, the top surfaces of pedestals 1680 and pillars 1691, 1692, 1693, and 1694 are within approximately 5 microns (μm) of each other in terms of height or vertical distance. In addition, this stamping operation may be performed after interposer 1638 is attached to flange 1566. For example, this stamping operation may flatten the tops of solder balls 1636 during the same operation that is used to flatten the tops of pedestals 1680 and pillars 1691, 1692, 1693, and 1694 so that the top surfaces of solder balls 1636, pedestals 1680, and pillars 1691, 1692, 1693, and 1694 are coplanar, or substantially coplanar, with each other.

FIG. 11 is a plan view of semiconductor die 100 (FIG. 6) bonded to interposer 1638 and to flange 1566. Referring to both FIGS. 10 and 11, more particularly, semiconductor die 100 is flipped and aligned so that gate bumps 104 (FIG. 6) contact corresponding solder balls 1636 (FIG. 10) and so that source bumps 106 (FIG. 6) contact the top surfaces of pedestals 1680 (FIG. 10).

Gate bumps 104 (FIG. 6) and source bumps 106 (FIG. 6) may be respectively attached to solder balls 1636 (FIG. 10) and to the top surfaces of pedestals 1680 using, for example, eutectic bonding. For example, a die bonder (not shown) may be used to pick up die 100 and place die 100 on the subassembly shown in FIG. 10 so that gate bumps 104 (FIG. 6) contact corresponding solder balls 1636 (FIG. 10) and so that source bumps 106 (FIG. 6) contact the top surfaces of pedestals 1680 (FIG. 10). Then, heat and pressure, and optionally ultrasonic energy, may be applied to form the eutectic bond at the points where gate bumps 104 (FIG. 6) contact corresponding solder balls 1636 (FIG. 10) and at the points where source bumps 106 (FIG. 6) contact the top surfaces of pedestals 1680 (FIG. 10).

Because of the planarity between the top surfaces of pedestals 1680 (FIG. 10) and solder balls 1636 (FIG. 10), semiconductor die 100 having source terminals 106 (FIG. 6) and gate terminals 104 (FIG. 6) on the same surface of the semiconductor die can be attached such that source terminals 106 (FIG. 6) are bonded to pedestals 1680 (FIG. 10) and gate terminals 104 (FIG. 6) are bonded to solder balls 1636 (FIG. 10).

Although the scope of the present invention is not limited in this respect, in some embodiments, flange 1566 may comprise copper and may be gold-plated with about 30 microinches (about 0.762 microns) of gold. During the eutectic bonding process, some of the gold from the gold plating of flange 1566 may be consumed during the bonding process to form the eutectic bond.

Although flange 1566 is described as being a copper flange that is gold-plated, the scope the present invention is not limited in this regard. In other embodiments, flange 1566 may be a tin-plated copper flange. A barrier material such as, for example, nickel, may be formed on flange 1566 prior to plating flange 1566 with tin.

Figure 12:
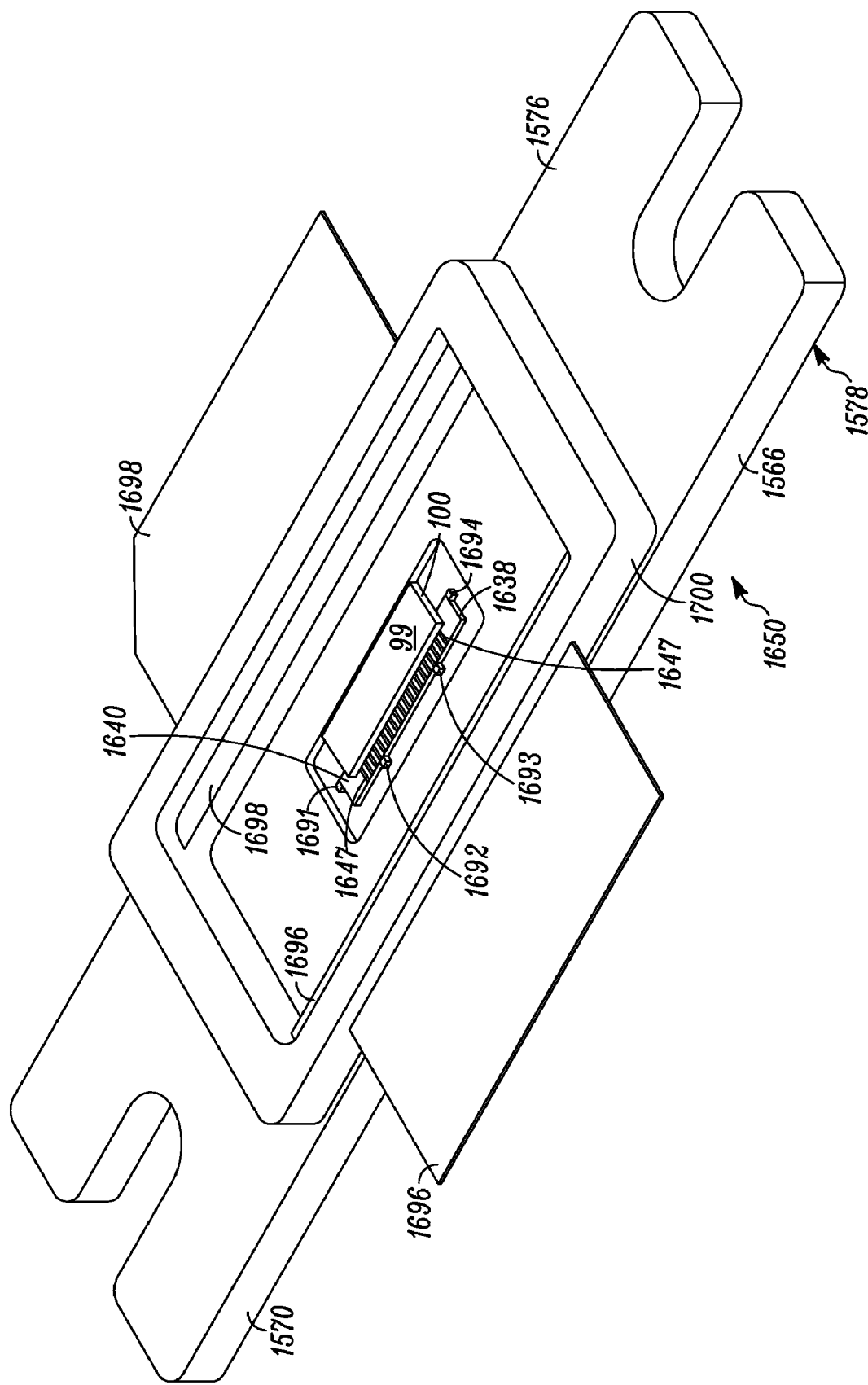
FIG. 12 is an isometric view of the semiconductor component of FIG. 14 during assembly.

FIG. 12 is an isometric view of semiconductor component 1650 during assembly. Prior to attaching the subassembly shown in FIG. 11 to a dielectric ring 1700, dielectric ring 1700 is formed, for example, by an injection molding process to couple dielectric ring 1700 to electrically conductive leads 1696 and 1698. Examples of suitable materials for the dielectric ring 1700 include ceramic, polyimide, or glass. In some embodiments, leads 1696 and 1698 may be part of a leadframe (not shown), and rings of dielectric material 1700 may be formed on the leadframe that includes leads 1696 and 1698 using an injection molding process.

After forming dielectric ring 1700, the subassembly shown in FIG. 11 that includes flange 1566, interposer 1638, and semiconductor die 100 may be attached to dielectric ring 1700 using an epoxy. Heat may be applied to the subassembly shown in FIG. 12 to cure the epoxy. Dielectric ring 1700 electrically isolates lead 1696, lead 1698, and flange 1566 from each other.

As discussed above, in some embodiments, semiconductor die 100 is a discrete transistor and lead 1696 is a gate lead electrically coupled to gate bumps 104 (FIG. 6) of die 100, lead 1698 is a drain lead electrically coupled to drain terminal 99 of die 100, and flange 1566 is a source contact electrically coupled to source bumps 106 (FIG. 6) of die 100. Lead 1696 has a top surface that is coplanar to, or substantially coplanar to, a top surface of lead 1698 and is noncoplanar to top surface 1576 of flange 1566 and bottom surface 1578 of flange 1566. In addition, lead 1696 has a bottom surface that is coplanar to, or substantially coplanar to, a bottom surface of lead 1698 and is noncoplanar to top surface 1576 of flange 1566 and bottom surface 1578 of flange 1566.

Figure 13:
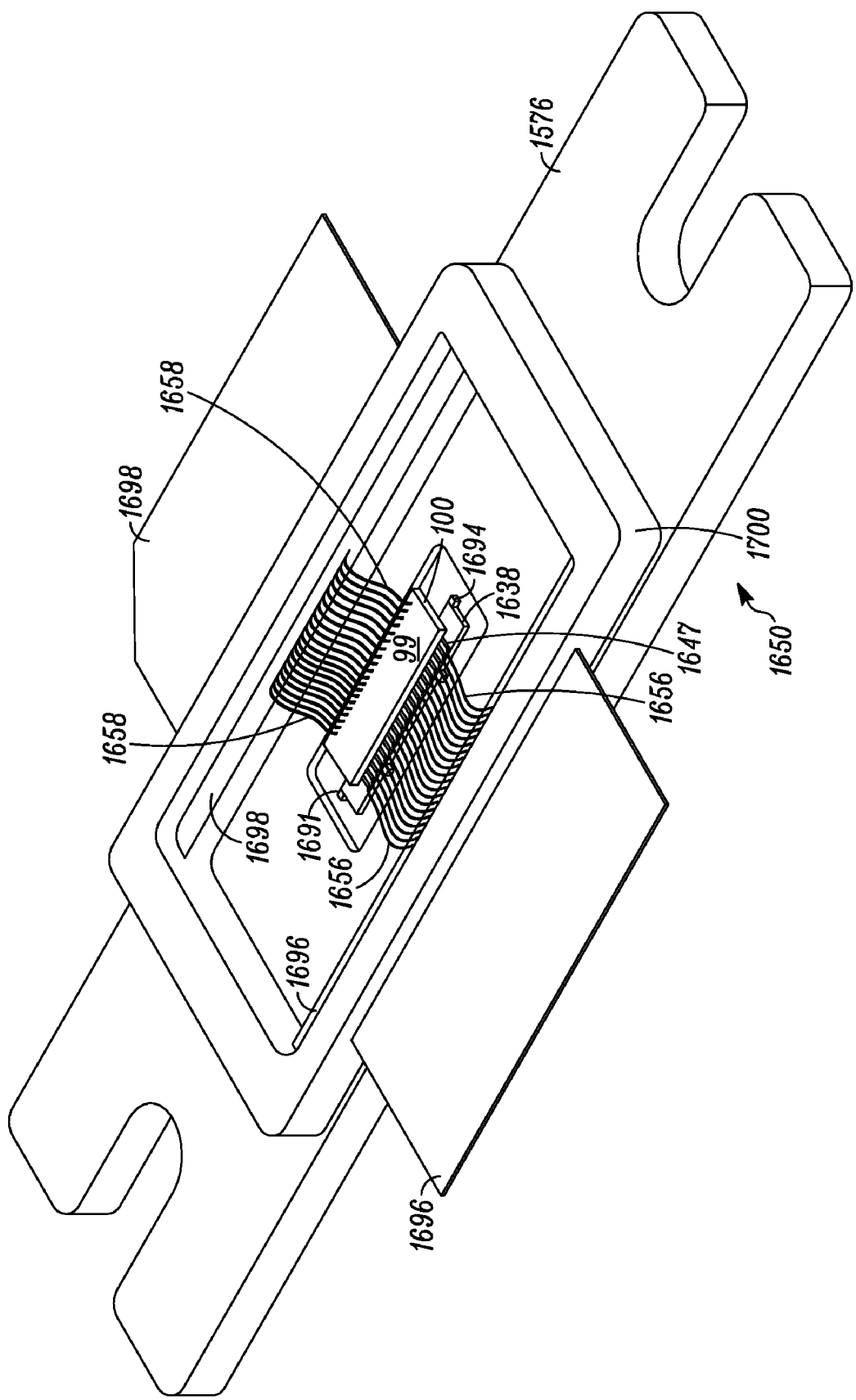
FIG. 13 is an isometric view of the semiconductor component of FIG. 14 during assembly.

FIG. 13 is an isometric view of semiconductor component 1650 at a later stage of assembly. Wirebonds 1656 are formed from gate interconnect pads 1647 to gate leads 1696 and wirebonds 1658 are formed from drain terminal 99 of semiconductor die 100 to drain leads 1698. Wirebonds 1656 and 1658 may have a diameter ranging from about 25 microns to about 50 microns and are also referred to as bonding wires or bond wires. Suitable materials for wirebonds 1656 and 1658 include gold, copper, or aluminum. In alternate embodiments, rather than using wirebonds 1656 and 1658, a metal clip (not shown) may be used to couple gate lead 1696 to gate interconnect pads 1647 and another metal clip (not shown) may be used to couple drain interconnect 99 to drain lead 1698. Not using wire bonds may reduce parasitic inductance in semiconductor component 1650.

FIG. 14 is an isometric view of semiconductor component 1650 at a later stage of assembly. A lid 1659 comprising a dielectric material such as, for example, ceramic or plastic, is attached to dielectric ring 1700 using for example, an epoxy, thereby completing the assembly of semiconductor component 1650.

A portion of gate lead 1696 is partially exposed external to semiconductor component 1650 to provide electrical coupling of an external bias signal such as, for example, a voltage ranging from about one volt to about four volts, from an external source (not shown) to gate bond pads 80 (FIGS. 2 and 3) of semiconductor die 100 via gate lead 1696, wirebonds 1656 (FIG. 13), pads 1647 (FIG. 10), solder balls 1636 (FIG. 10), and gate bumps 104 (FIG. 6). A portion of drain lead 1698 is partially exposed external to semiconductor component 1650 to provide electrical coupling of an external bias signal such as, for example, a voltage ranging from about 20 volts to about 100 volts, from an external source (not shown) to drain interconnect 99 (FIG. 13) of semiconductor die 100 via drain lead 1698 and wirebonds 1658 (FIG. 13). Flange 1566 is partially exposed external to semiconductor component 1650 to provide electrical coupling of an external bias signal such as, for example, ground, to source bond pads 82 (FIGS. 2 and 3) of semiconductor die 100 via pedestals 1680 (FIG. 10) of flange 1566 and source bumps 106 (FIG. 6). Flange 1566 is also partially exposed to allow coupling of flange 1566 to a thermally conductive material having a relatively low thermal resistance such as, for example, a metal heat sink (not shown) to provide a thermal path for removing heat generated by semiconductor die 100.

Although semiconductor component 1650 (FIG. 14) and semiconductor die 100 (FIG. 6) are described as a discrete devices in some embodiments, this is not a limitation of the present invention. In alternate embodiments, semiconductor die 100 may be an integrated circuit (IC) rather than a discrete device. For example, semiconductor die 100 may be an integrated circuit having high density digital logic and a power device such as, for example, a power transistor, integrated together on the same die. In the example wherein semiconductor die 100 is an IC, semiconductor component 1650 (FIG. 14) comprising IC die 100 may be referred to as an integrated circuit or integrated component and may have more than three leads.

Accordingly, the packages described above may provide cost, electrical, and thermal performance advantages, such as providing a relatively low thermal resistance path to remove heat generated by semiconductor die 100. Further, electrical performance may be improved by not using wire bonds in some embodiments. Not using wire bonds may reduce parasitic inductance. Further some of the package configurations described above may allow for relatively high breakdown voltages. In addition, some of the package configurations described above may provide a relatively low interelectrode parasitic capacitance between the gate and drain or between the drain and source, thereby increasing the operating frequency of the semiconductor component.

Figure 15:
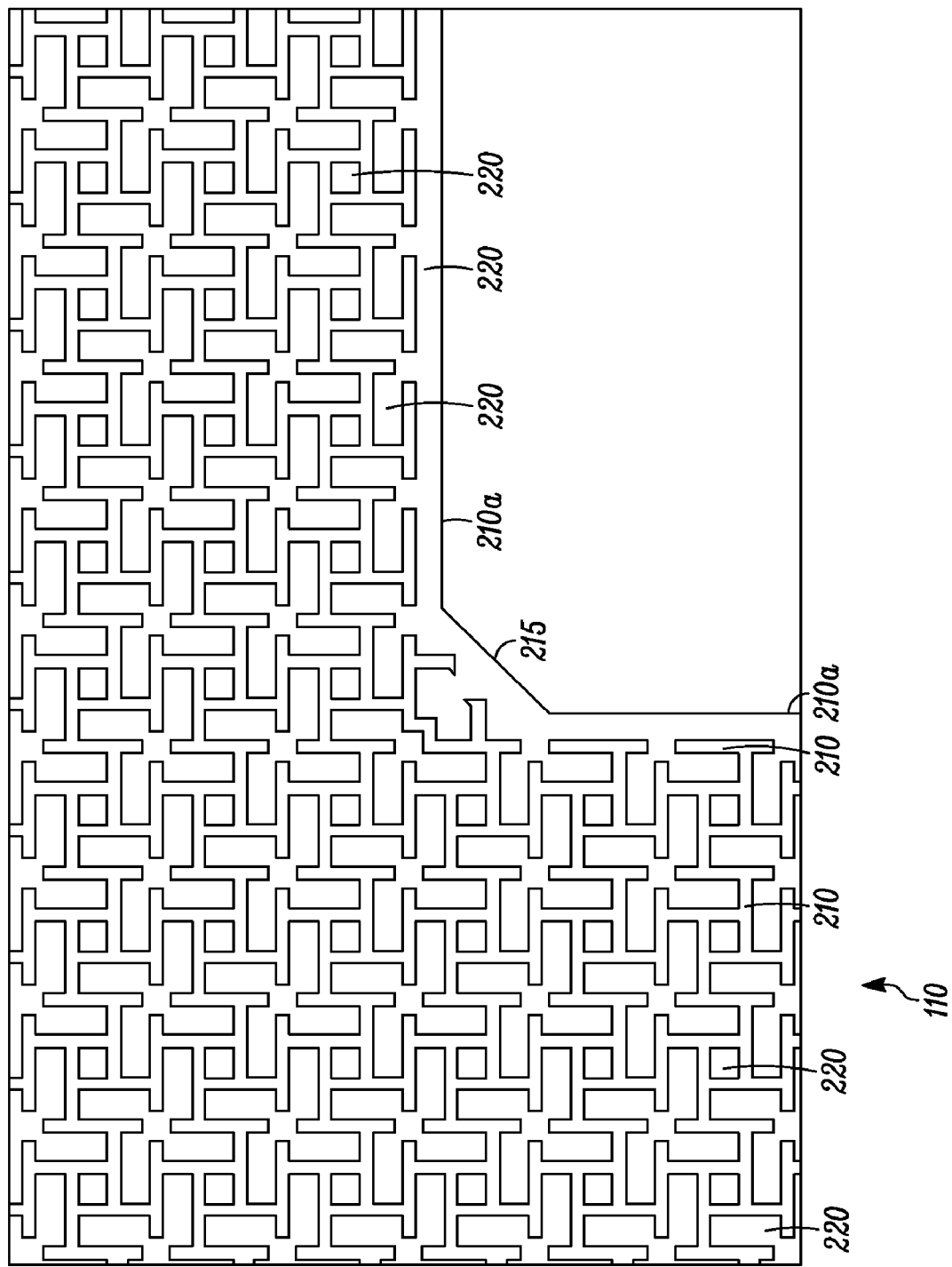
FIG. 15 is a top view of an embodiment of a portion of the device of FIG. 1 during manufacture.

FIG. 15 shows an embodiment of portion 170 (FIG. 1) of device 100 at one stage during manufacturing. In this example, dielectric structure 110 includes a plurality of walls 210 and voids 220. In some embodiments, the dielectric structure 110 includes repeating patterns of walls 210 and voids 220. In the example shown in FIG. 15, dielectric structure 110 includes a wall 210*a* that is adjacent to, and surrounds the active area 105. Walls 210 may be referred to as elements, sections, structures, substructures, portions, or segments. Wall 210*a* may be referred to as a dielectric bulkhead.

Optionally, in one embodiment, corners of wall 210*a* include mitered or chamfered portions 215. In some embodiments, these mitered areas 215 may also include a small "lip", and, as a result, substantially right-angled junctures, and particularly compound right-angled junctures (where multiple right angles intersect in three dimensions) between silicon and silicon dioxide are avoided.

The mitered portions 215 may be employed to obviate thermal stresses originating in thermal expansion coefficient mismatch between silicon dioxide and silicon, which stresses may be exacerbated at compound right-angled junctions and which in turn may initiate generation of dislocations in the silicon. Dislocations act as recombination-generation sites and thus may engender increased undesirable leakage currents in the resulting device.

Figure 16:
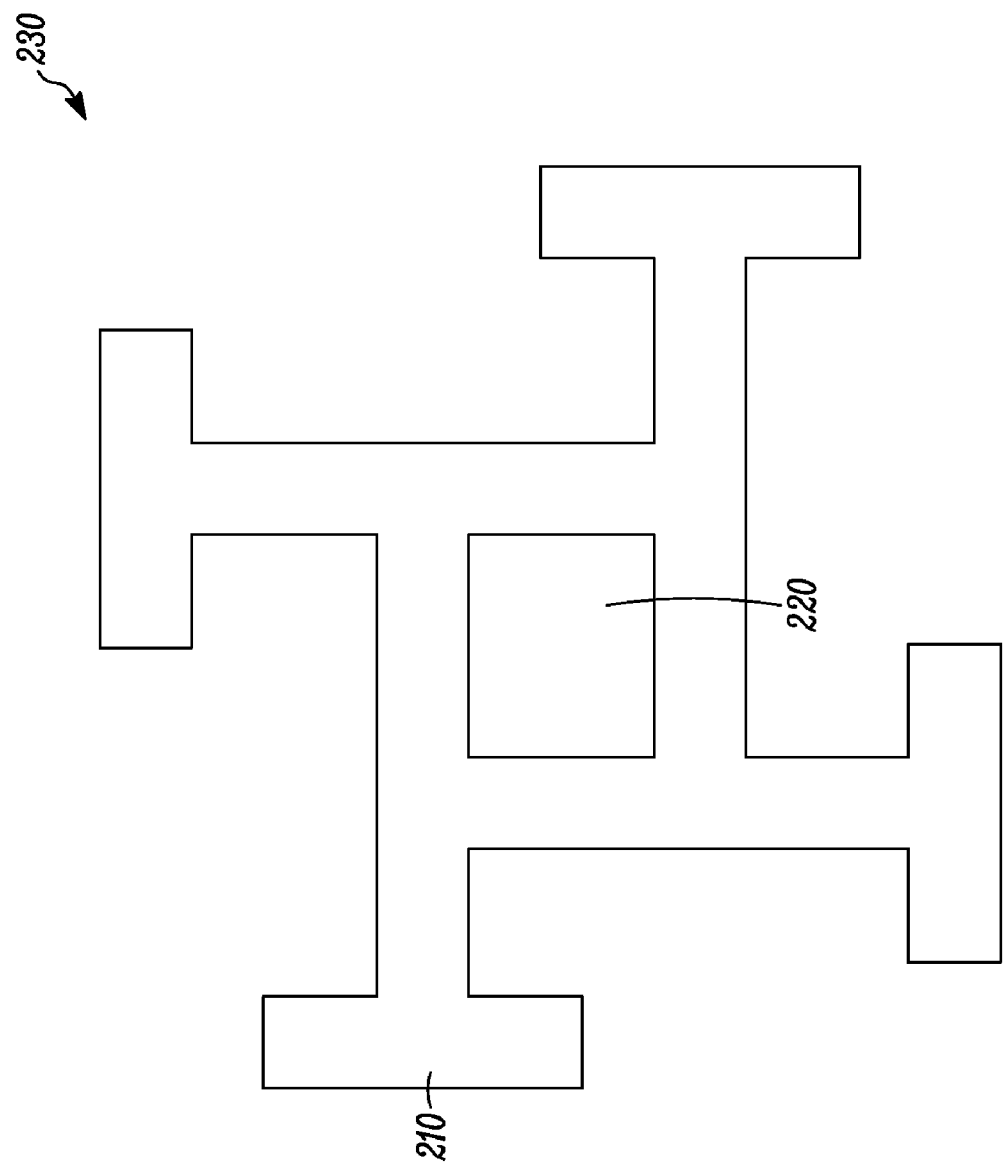
FIG. 16 is a top view of a basic pattern structure of the structure of FIG. 15.

Dielectric structure 110 includes a plurality of basic pattern structures or substructures 230 (FIG. 16) that are coupled to each other to form a dielectric structure 110 that includes a plurality of orthogonally walled structures as is seen in FIG. 15. Referring briefly to FIG. 16, FIG. 16 is a top view of a basic pattern structure 230 of the dielectric structure 110 that may be repeated throughout dielectric structure 110. The dielectric pattern structure 230 may also be referred to as a single cell of dielectric structure 110 and the length and width of the cell 230 may be about 5.4 microns by about 5.4 microns in some embodiments. The basic pattern structure 230 in this example resembles a pinwheel and may be referred to as a pinwheel structure. Other examples of structures having a pinwheel structure or a pinwheel configuration include structures 2110 (FIG. 48), 2310 (FIG. 49), and 2610 (FIG. 50) described below.

In the example illustrated in FIG. 15, dielectric structure 110 may be referred to as a rectilinear structure in that dielectric stricture 110 includes a plurality of rectilinear, straight line, or substantially straight line, elements, sections, substructures, portions, or segments. However, it will be appreciated that other shapes might be usefully employed in dielectric structure 110 as described below with various alternate embodiments. In addition, the sidewalls of dielectric structure 110 are rectilinear and the sidewalls and segments of dielectric structure 110 intersect or meet at right angles, or substantially right angles. In other words, segments and sidewalls of dielectric structure 110 orthogonally intersect at least one other segment or sidewall of dielectric structure 110.

In the example illustrated in FIG. 15, each rectilinear segment 210 of dielectric structure 110 is perpendicular to, or substantially perpendicular to, another rectilinear segment 210 of dielectric structure 110. In other words, each of the rectilinear segments 210 of dielectric structure 210 perpendicularly, or substantially perpendicularly, intersects another rectilinear segment 210 of dielectric structure 110.

The combination of walls 210 and voids 220 reduces the overall permittivity of the dielectric structure 110 so that dielectric structure 110 has a relatively low dielectric constant. In some embodiments, the walls 210 may comprise silicon dioxide, and in these embodiments a dielectric constant of at least about 2.5 or lower may be achieved.

Silicon dioxide has a dielectric constant of about 3.9. Accordingly, a solid or filled dielectric structure that includes no voids and includes silicon dioxide may have a dielectric constant of about 3.9.

In some embodiments described herein, dielectric platform 110 includes voids occupying in excess of 40% of the total volume of dielectric platform 110. This may result in an effective dielectric constant reduction of about 30% or greater, from a dielectric constant of about 3.9 to an effective dielectric constant of about 2.74. In one embodiment, dielectric platform 110 includes voids occupying in excess of 50% of the total volume. This may result in an effective dielectric constant reduction of about 39%, from a dielectric constant of about 3.9 to an effective dielectric constant of about 2.39. Increasing the volume of air or empty space in dielectric platform 110 may result in a dielectric platform 110 having a dielectric constant of as low as 1.5 or less. As a result, conductive elements such as passive elements (not shown) or interconnects (not shown) formed over dielectric platform 110 have reduced parasitic capacitances to the substrate 115 (FIG. 1). The parasitic substrate capacitance is reduced by both the reduced effective dielectric constant of dielectric platform 110 and the increased thickness of dielectric platform 110. The passive elements or interconnects formed over the dielectric platform 110 may include a layer of electrically conductive material comprising aluminum, copper, or doped polycrystalline silicon, wherein at least a portion of the electrically conductive material, or all of, or substantially all of, the electrically conductive material is over dielectric platform 110 so that dielectric platform 110 is between substrate 115 and at least a portion of the electrically conductive material.

Repeatedly terminating oxide sidewalls such as, for example, the orthogonally terminating oxide sidewalls of the dielectric structure 110, may provide protection from bending and rupture since stress vectors do not propagate orthogonally.

The walls of a single cell structure 230 (FIG. 16) may expand toward walls of adjacent cell structures during heating and cooling of the dielectric structure 110 and the adjacent active area 105. In some embodiments, the active area comprises silicon and the walls 210 of dielectric structure 110 comprise silicon dioxide, and the coefficient of thermal expansion of silicon dioxide is about 0.2 and the coefficient of thermal expansion of silicon is about 2.3. If the silicon dioxide is formed using a thermal oxidation process that heats device 100 to about 1100 degrees Celsius (° C.), and then device 100 is cooled to about 25° C., the silicon in active area 105 will contract at about four to five times the rate as the silicon dioxide of dielectric structure 110 to cause thermal stress in device 100 which may lead to dislocations and undesirable excessive leakage currents in device 100.

Figure 17:
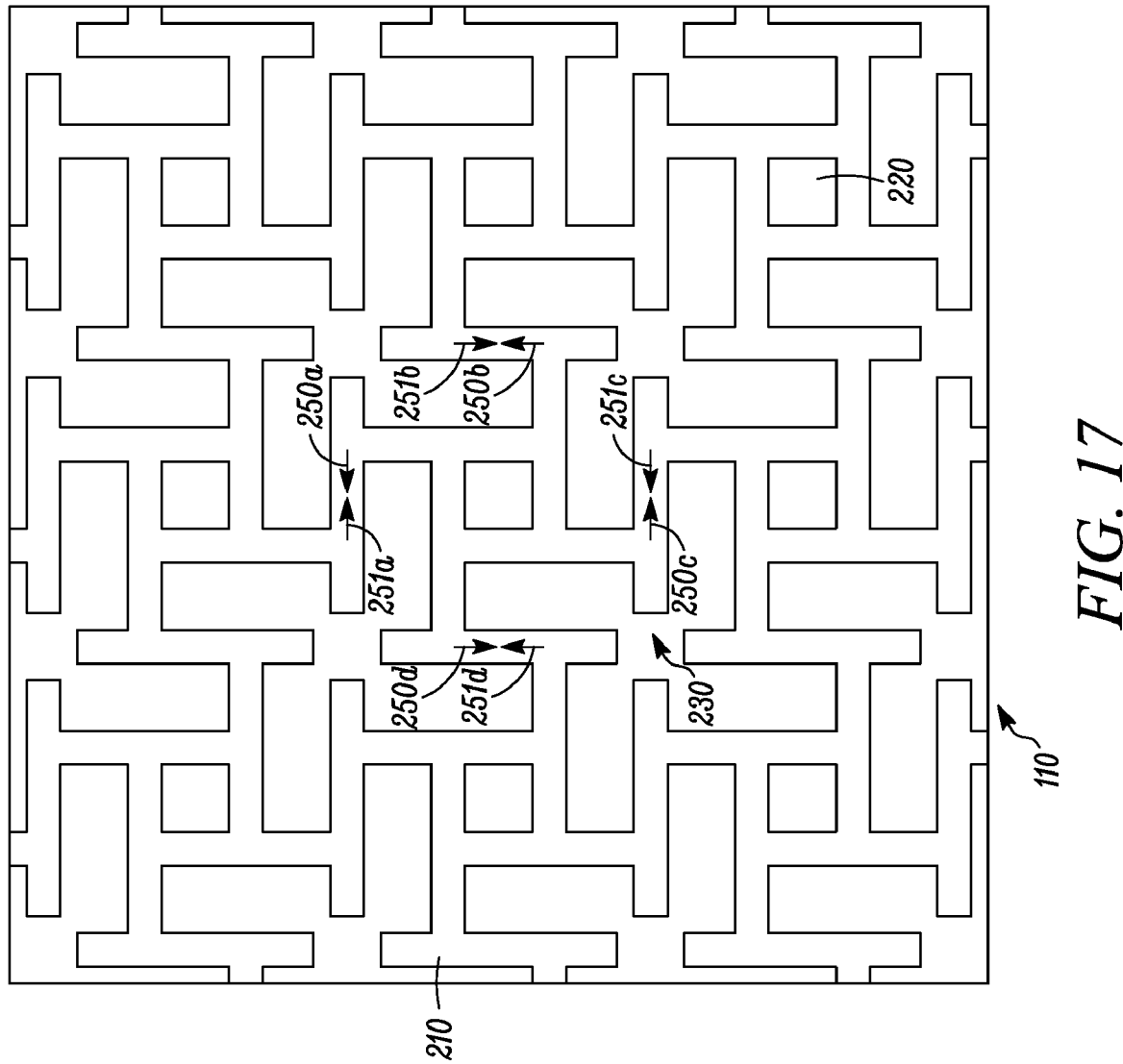
FIG. 17 is a top view of a portion of the structure 110 of FIG. 15.

FIG. 17 shows a portion of dielectric structure 110 of FIG. 15, and includes stress vectors (denoted with arrows) to illustrate stress in dielectric structure 110 during the manufacturing of device 100. During the thermal cycling of device 100, that is, during the heating and cooling of device 100, stress vectors 250a, 250b, 250c, 250d, 251a, 251b, 251c, and 251d are a result of the expansion and contraction of walls 230.

Stress vectors 250a, 250b, 250c, and 250d illustrate the direction of expansion of the walls of a single cell 230 of dielectric structure 110, and if there were no cells abutting cell 230, a spiral or torsion stress vector into or out of a plane parallel to a surface of the substrate may result. However, the example of dielectric structure 110 illustrated in FIGS. 15 and 17 provides stress relief since stress vectors from cells abutting cell 230 cancel the stress vectors 250a, 250b, 250c, and 250d by imposing on the single cell structure 230 equal and opposite forces. For example, stress vector 250a is countered by a stress vector 251a of equal magnitude exerted in the opposite direction as 250a from an adjacent cell resulting in a net stress vector of zero. Similarly, stress vector 250b is countered by a stress vector 251b of equal magnitude exerted in the opposite direction as 250b; stress vector 250c is countered by a stress vector 251c of equal magnitude exerted in the opposite direction as 250c; and stress vector 250d is countered by a stress vector 251d of equal magnitude exerted in the opposite direction as 250d. In addition, since stress vectors do not propagate at 90 degrees, orthogonally terminating walls for each cell of dielectric structure 110 will further reduce stress in device 100.

A center portion of a single cell structure 230 may be described as a tube portion and the external portions of cell structure 230 may be described as arm portions. Forming multiple pinwheel cell structures together as shown will have the result of cancelling stresses in structure 110 so that stress does not translate across structure 110, and will reduce or eliminate stress from being translated into areas adjacent to structure 110. Specifically, during thermal cycling of structure 110 the arm portions of cell structure 230 may twist in a counterclockwise direction and the central tube portion of structure 110 may twist in a clockwise direction with equal and opposite force, so that the net accumulation of stress is zero.

Referring back to FIG. 15, the cells of dielectric structure 110 have a closed-cell configuration in that the voids 220 of dielectric structure 110 may be physically isolated from each other by walls 210. As will be discussed further below, in some embodiments, a capping layer such as, for example, an oxide layer (for example, a tetraethylorthosilicate (TEOS) oxide layer), may be formed over all of the cells of dielectric structure 110 to further isolate the voids 220 from each other. Accordingly, if the capping layer experiences a rupture or fracture, contamination from any gases in the voids 220 of dielectric structure 110 may be contained in a limited area due to the closed-cell configuration, wherein voids 220 are physically isolated from each other.

As will be discussed further below, a seal layer (not shown in FIG. 15) such as, for example, a nitride layer, may be formed over the capping layer (not shown in FIG. 15) of the dielectric structure 110 to prevent any gases such as, for example, oxygen from propagating into voids 220 after the capping layer is formed. The nitride layer may fill in any cracks in the capping layer, and in general prevent the propagation of gases into voids 220 of dielectric structure 110. As an example, a nitride layer may be formed using a low pressure chemical vapor deposition (LPCVD) process to form a seal layer over capping layer. A partial vacuum is sealed in voids 220 as part of the LPCVD process. In other words, the pressure in voids 220 is below atmospheric pressure. As an example, the pressure in voids 220 ranges between approximately 0.1 Torr and approximately 10 Torr.

Figure 18:
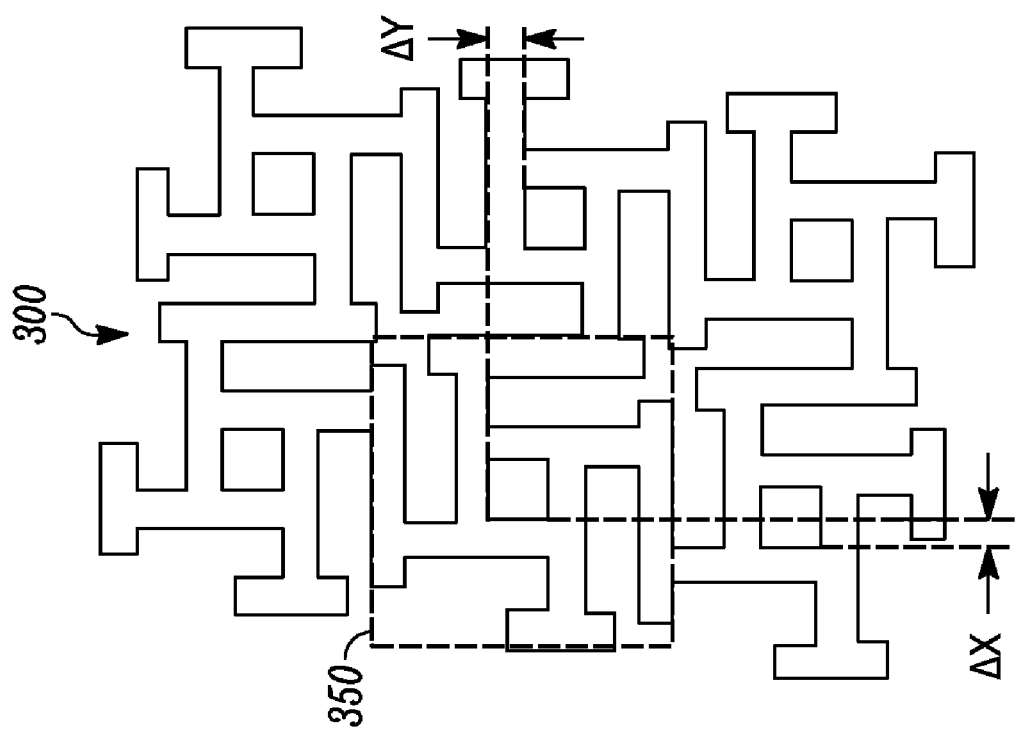
FIG. 18 is a top view of another embodiment of a portion of the device of FIG. 1 during manufacture.

FIG. 18 is a plan view of an alternate embodiment of dielectric structure 110, similar to the embodiment illustrated in FIG. 15. The dielectric structure 110 illustrated in FIG. 18 provides a tile or mosaic element or cell, generally indicated via reference character 350 and shown via dashed outline. However, in contrast to the arrangement of FIG. 15, a vertical offset ΔY and a horizontal offset ΔX are shown via dashed lines. The example of FIG. 18 employs different offsets for the vertical offset ΔY and the horizontal offset ΔX, however, the offsets need not be different. Additionally, the offsets ΔY and ΔX need not be constant, but may vary from one region to another.

Figure 19:
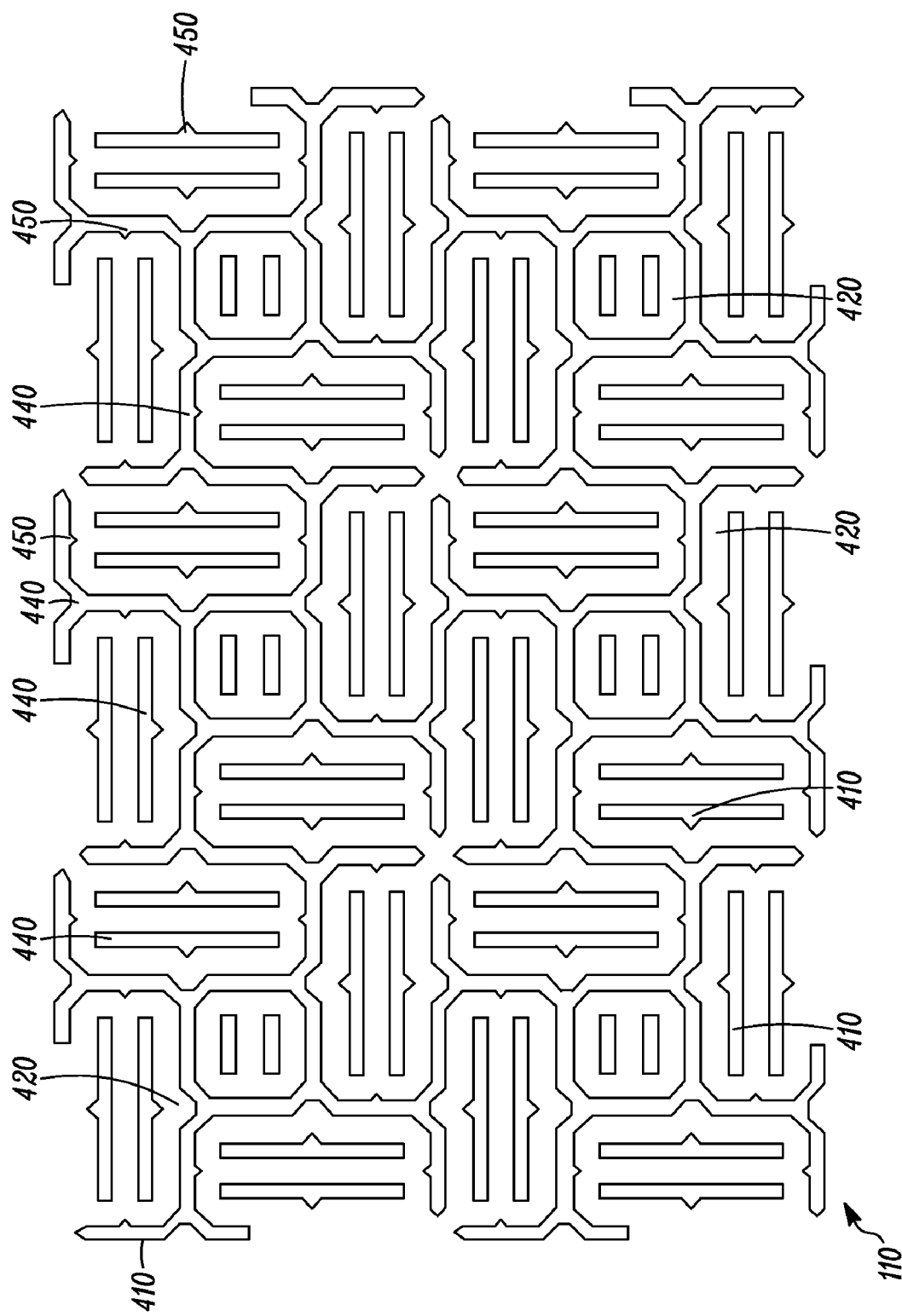
FIG. 19 is a top view of another embodiment of a portion of the device of FIG. 1 during manufacture.

FIG. 19 is a plan view of alternate embodiment of dielectric structure 110 at one stage during manufacturing. In this example, dielectric structure 110 includes repeating patterns of walls 410 and voids 420. In the example shown in FIG. 19, dielectric structure 110 includes a plurality of basic pattern structures 430 (FIG. 20) that are coupled to each other to form the dielectric structure 110 shown in FIG. 19.

Figure 20:
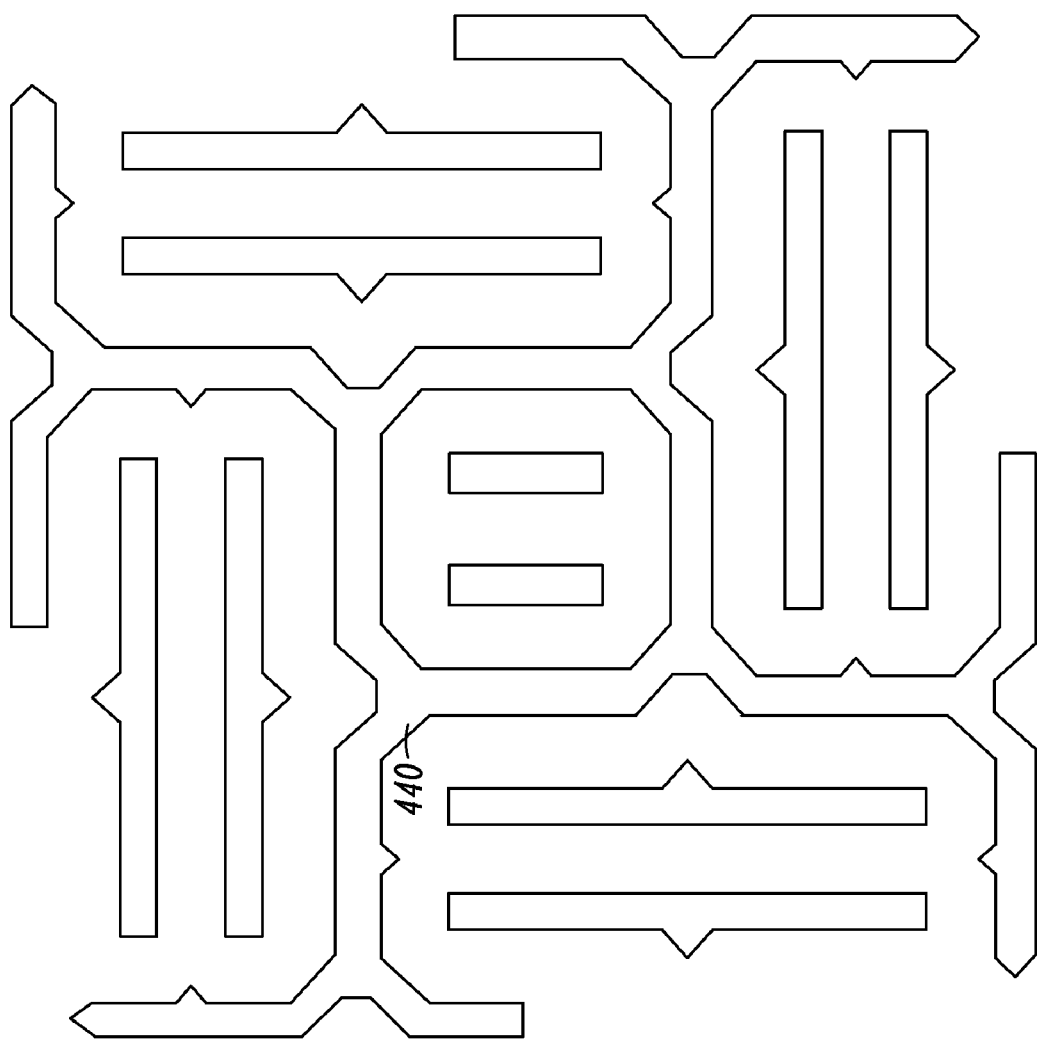
FIG. 20 is a top view of a portion of the structure of FIG. 19.

Referring briefly to FIG. 20, FIG. 20 is a top view of a basic pattern structure 430 of the dielectric structure 110 shown in FIG. 19 that may be repeated throughout dielectric structure 110. The dielectric pattern structure 430 may also be referred to as a single cell of dielectric structure 110. The basic pattern structure 430 includes a portion 440 that resembles a pinwheel.

Similar to the embodiment of dielectric structure 110 illustrated in FIGS. 15 and 17, the "pinwheel" configuration of the embodiment of dielectric structure 110 in FIG. 19 provides stress relief in device 100 since stress vectors from the abutting cells in dielectric structure 110 cancel each other by imposing equal and opposite forces. As discussed above, cancelling or reducing stress in device 100 may reduce dislocations in device 100 and reduce or prevent undesirable leakage currents in device 100.

In addition, the embodiment of dielectric structure 110 of FIG. 19 has a closed-cell configuration similar to the embodiment of dielectric structure 110 of FIG. 15, wherein the voids 420 may be physically isolated from each other by walls 410. The closed-cell configuration may be advantageous to contain any undesirable gases within a limited area of dielectric structure and prevent these gases from spreading throughout dielectric structure 110.

Referring back to FIG. 19, some of the walls of cell 430 include protrusions 450, which may be formed to maintain constant distances between the sidewalls of the walls 410. In other words, the width of the trenches or voids 420 of dielectric structure 110 may be formed to have a substantially uniform width by forming protrusions 450. As will be discussed further below, in some embodiments, dielectric structure 110 may be formed by etching a silicon substrate to form silicon walls 410 and voids 420 as shown in the embodiment illustrated in FIG. 19.

A thermal oxidation process may be performed to form silicon dioxide on any exposed silicon area. In some embodiments, the silicon of silicon walls 410 of FIG. 19 may be partially, or completely, converted to silicon dioxide forming silicon dioxide walls 410. In other words, the silicon between the sidewalls of walls 410 may be substantially converted to silicon dioxide. If substantially all of the silicon of silicon walls 410 is converted to silicon dioxide, then the width of the resulting silicon dioxide walls 410 will be approximately 2.2 times the width of the silicon walls 410 since the molecular ratio of silicon to silicon dioxide is 2.2. Thus, as a result of the thermal oxidization process, the widths of the voids 420 will decrease due to the growth of the thermal oxide in walls 410. Protrusions 450 are formed to maintain a constant width for voids 420 after the thermal oxidation process, which may be advantageous in embodiments wherein the voids 420 are backfilled with a material such as, for example, polysilicon or an oxide. If the voids 420 are not filled, then air gaps will remain in dielectric structure 110, which may also provide stress relief in device 100.

FIGS. 21 to 28 are used to describe at least one embodiment of a dielectric structure 510 (FIG. 27), and a method of making dielectric structure 510. This method of making dielectric structure 510 may be used to manufacture the alternate embodiments of dielectric structure 110 described with reference to FIGS. 15 and 19.

Figure 21:
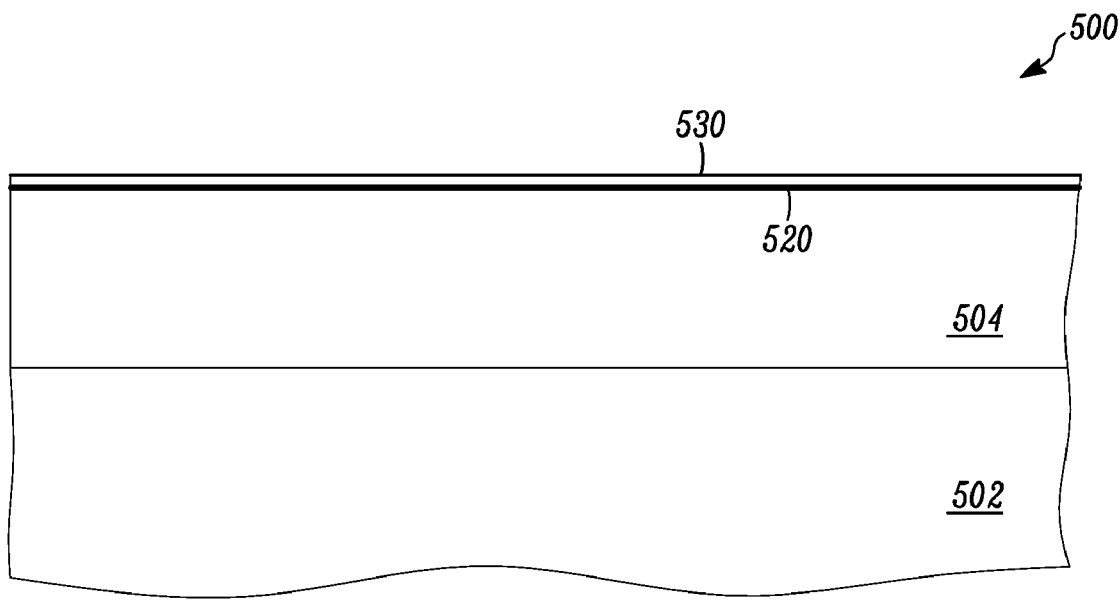
FIG. 21 is a cross-sectional view of a structure at an early stage of manufacture.

FIG. 21 is a cross-sectional view of a portion of structure 500 at one stage during manufacturing in accordance with an embodiment of the present invention. Structure 500 includes an n-type silicon substrate 502 and an n-type epitaxial layer 504 and may be referred to as a semiconductor structure.

A dielectric layer 520 is formed at a surface of layer 504. In an embodiment of the wafer process, dielectric layer 520 comprises silicon dioxide ($SiO_2$). The layer 520 of silicon dioxide is thermally grown at a surface of layer 504 using thermal oxidation, wherein the silicon dioxide layer has a thickness of about 1000 Angstroms (Å).

Another dielectric layer 530 such as, for example, a silicon nitride ($Si_3N_4$) layer, may be formed over silicon dioxide layer 520. Silicon nitride layer 530 may be formed using a low pressure chemical vapor deposition (LPCVD) and may have a thickness of about 1500 Angstroms. Silicon nitride layer 530 may be useful as an etch stop, and/or as a protective layer during the processing of dielectric structure 510 (FIG. 27) in region 550 (FIG. 22).

Figure 22:
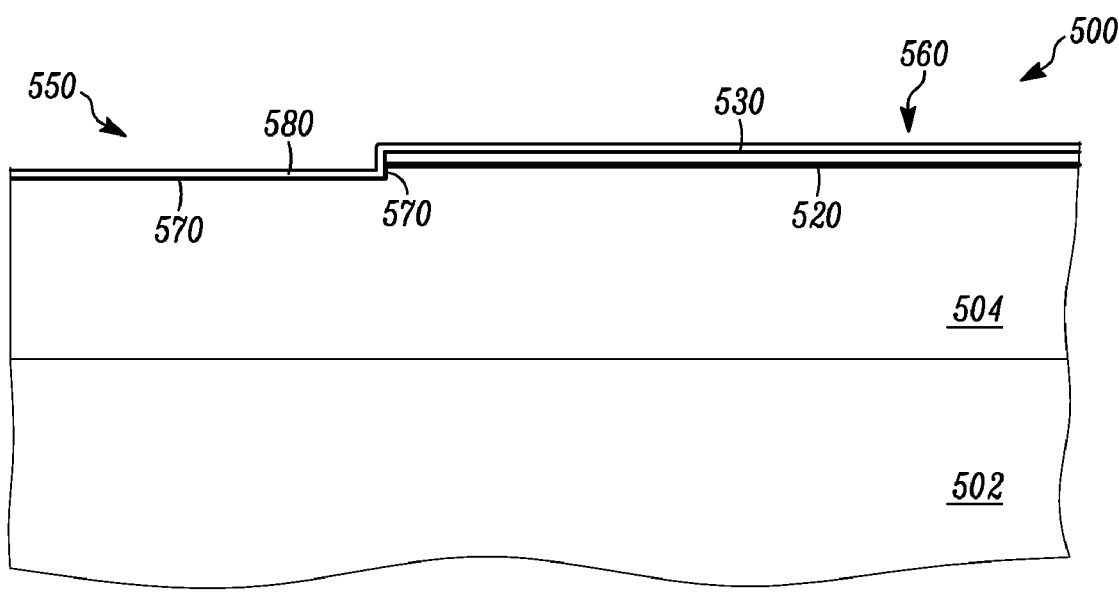
FIG. 22 is a cross-sectional view of the structure of FIG. 21 at a later stage of manufacture.

FIG. 22 is a cross-sectional view of structure 500 at a later stage during manufacturing. Layers 504, 520, and 530 may be patterned using photolithography and etching processes. Photolithography processes or operations may sometimes be referred to as masking operations or acts. The photolithography and etching may include forming a layer of a radiation-sensitive material, such as photoresist (not shown), over the silicon nitride layer 530, then exposing the photoresist using, for example, ultraviolet (UV) radiation to form a mask, and then etching portions of layers 530, 520, and 504 using the photoresist mask and an anisotropic etch, stopping in epitaxial layer 504 to form a recessed area over a region 550 of structure 500. Alternatively, rather than using photolithography to form a mask, a masking operation may include using electron beam exposure of a photoresist layer.

The region 550 of structure 500 is a region in which dielectric structure 510 (FIG. 27) is to be formed and the region 560 is a region of structure 500 in which the active area of structure 500 is to be formed. In various embodiments, the anisotropic etch removes about 0.3 microns to about one micron of epitaxial layer 504 in region 550 as measured from a bottom surface of silicon dioxide layer 520. This masking and anisotropic etching operations may be employed in order to later aid in planarization of the resultant structure.

After the anisotropic etching operation, a relatively thin layer of thermally-grown silicon dioxide 570 is formed at the exposed surface of epitaxial layer 504 using a thermal oxidation process. This layer of silicon dioxide 570 may have a thickness ranging in some embodiments from about 50 Angstroms to about 150 Angstroms. Layer 570 is optional and may be used to prevent damage that may result from forming polysilicon on epitaxial layer 504. A layer of polycrystalline silicon 580 having a thickness of approximately 1500 Angstroms is conformally formed on the silicon dioxide layer 570 and on silicon nitride layer 530 using a deposition process.

Figure 23:
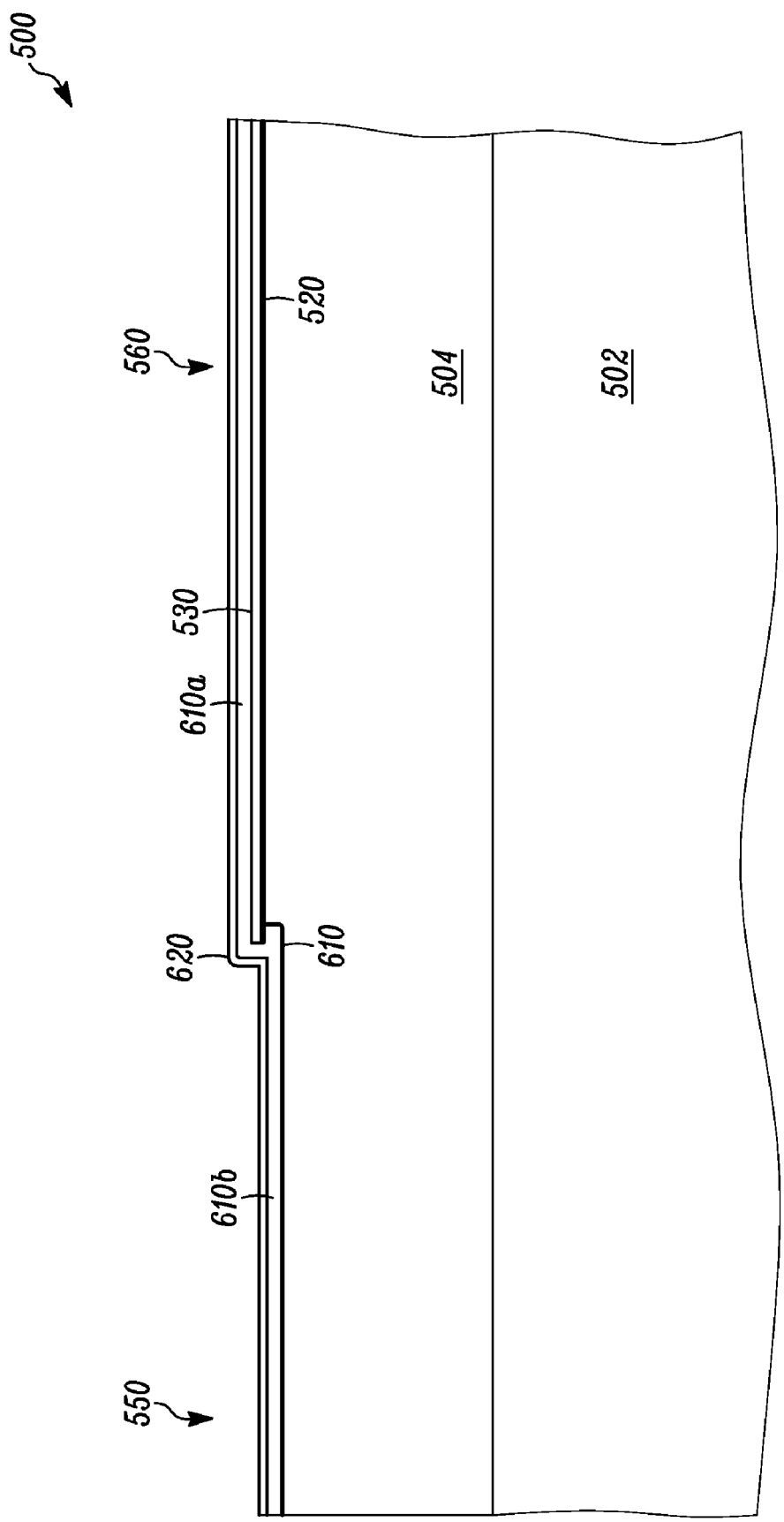
FIG. 23 is a cross-sectional view of the structure of FIG. 22 at a later stage of manufacture.

FIG. 23 is a cross-sectional view of structure 500 at a later stage during manufacturing. A thermal oxidation process is used to generate thermal oxide layer 610 having a portion 610a in region 560 which has a thickness of about 3300 Angstroms and a portion 610b in region 550 which has a thickness of about 5000 Angstroms. More specifically, a thermal oxidation process is performed to convert all of the 1500 Angstrom polysilicon layer 580 (FIG. 22) to a silicon dioxide layer 610a having a thickness of about 3300 Angstroms, and the thermal oxidation process may continue to consume portions of epitaxial layer 504 to form thermal oxide layer 610b having any desired thickness greater than 3300 Angstroms such as, for example, a thickness of about 5000 Angstroms. Although portions 610a and 610b are described as having different thicknesses, the methods and apparatuses described herein are not limited in this regard. In other embodiments, portions 610a and 610b may have substantially the same thickness. As may be appreciated, silicon dioxide layer 570 (FIG. 22) is a portion of silicon dioxide layer 610 as a result of the thermal oxidation process used to generate silicon dioxide layer 610.

After the formation of thermal oxide layer 610, a layer 620 of polysilicon may be conformally deposited on thermal oxide layer 610. In some embodiments, the thickness of polysilicon layer 620 is about 1800 Angstroms.

Figure 24:
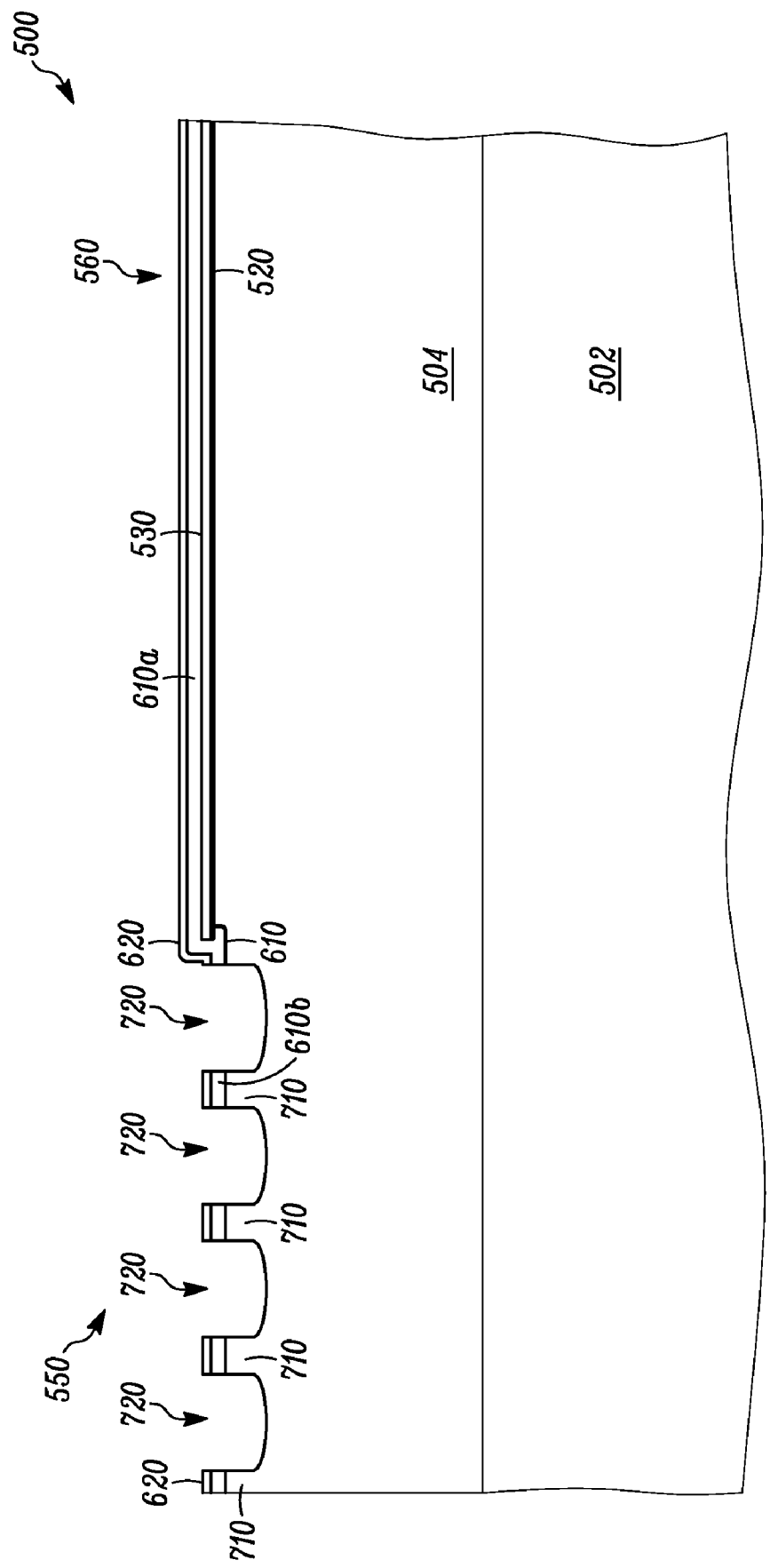
FIG. 24 is a cross-sectional view of the structure of FIG. 23 at a later stage of manufacture.

FIG. 24 is a cross-sectional view of structure 500 at a later stage during manufacturing. A second masking and etching operation is performed to form a plurality of walls 710 and openings 720. Openings 720 may also be referred to as voids, cavities, or trenches. In particular, an anisotropic etching operation is performed in a portion of region 550 to remove portions of polysilicon layer 620, portions of silicon dioxide layer 610, and portions of epitaxial layer 504 to form openings 720 and walls 710. In one embodiment, openings 720 have a width of about 1.2 microns, and walls 710 have a width of about 0.6 microns. In various embodiments, the depths of openings 720 may range from about 0.15 microns to about 0.4 microns.

Figure 25:
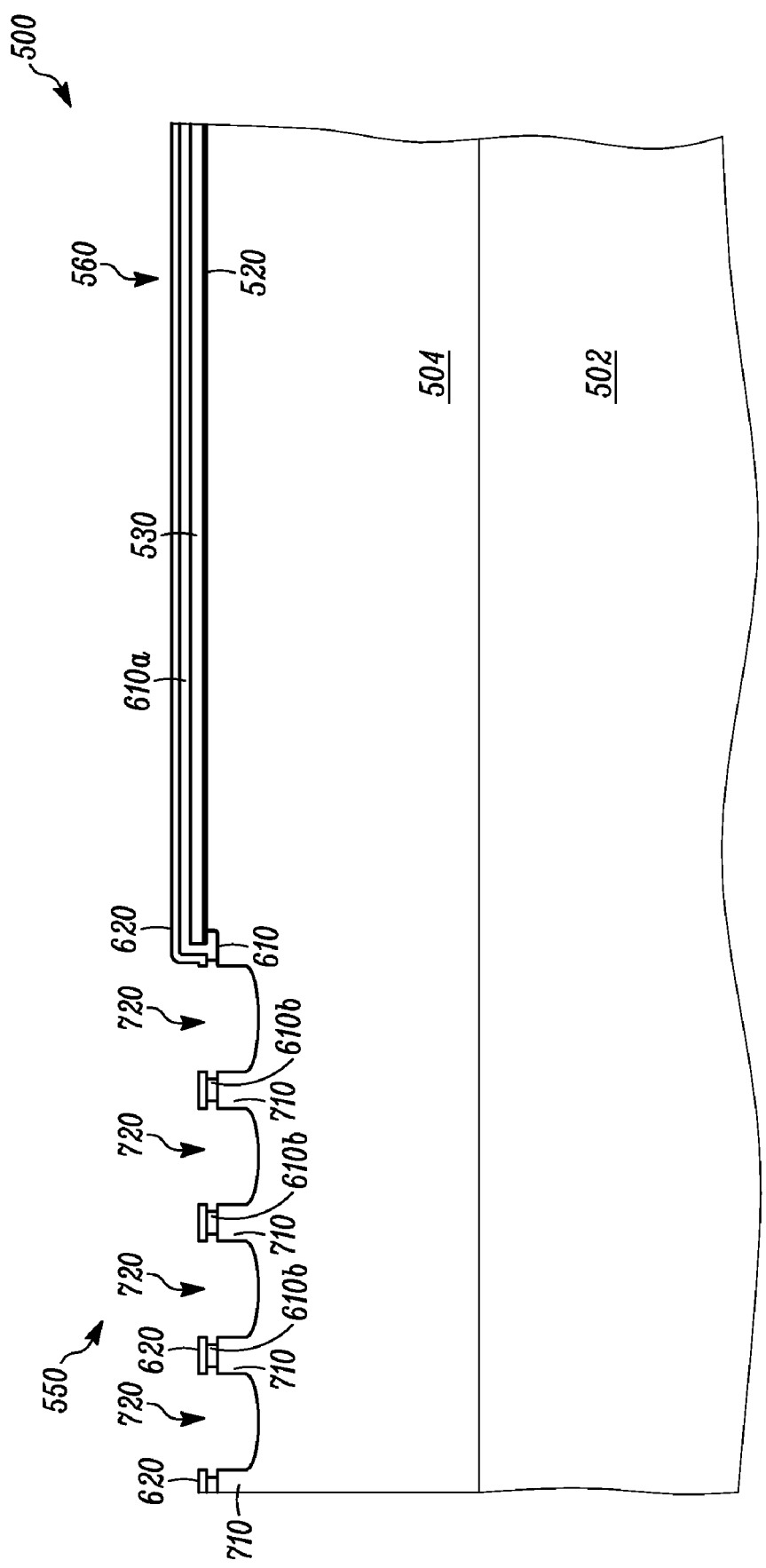
FIG. 25 is a cross-sectional view of the structure of FIG. 24 at a later stage of manufacture.

FIG. 25 is a cross-sectional view of structure 500 at a later stage during manufacturing. A wet oxide etch is performed to reduce the widths of the oxides 610b from about 0.6 microns to about 0.3 microns. For example, the etching may be performed using hydrofluoric (HF) acid having a 50 to 1 selectivity ratio of oxide to silicon to reduce the widths of oxide portions 610b from about 0.6 microns to about 0.3 microns. After this wet oxide etch, portions 610b may be used as an etch mask to subsequently etch silicon in region 550 as is illustrated in FIG. 26.

Figure 26:
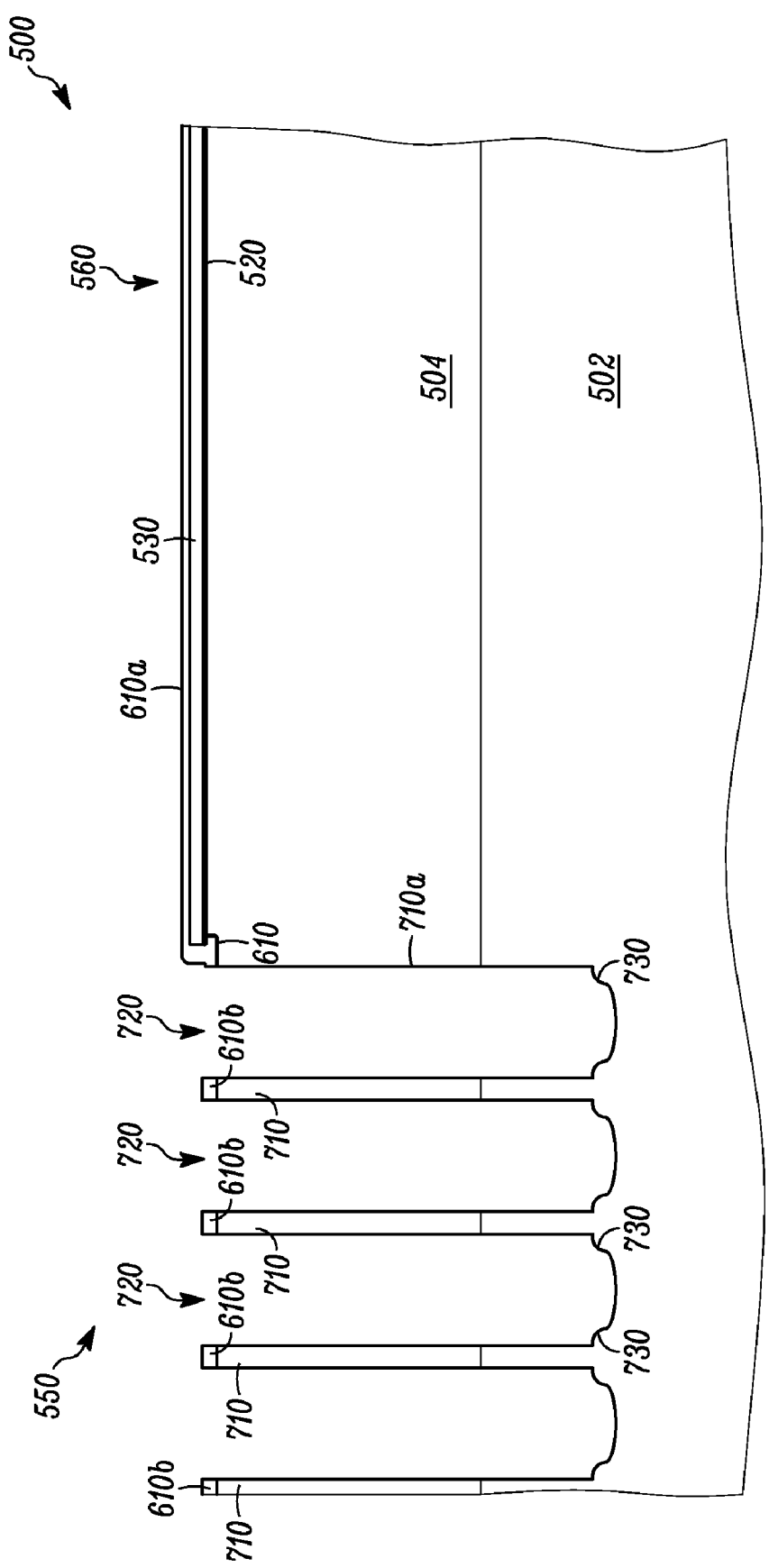
FIG. 26 is a cross-sectional view of the structure of FIG. 25 at a later stage of manufacture.

FIG. 26 is a cross-sectional view of structure 500 at a later stage during manufacturing. A silicon etch is performed to remove portions of walls 710, and increase the depth and width of the openings 720. In some embodiments, the depth of openings 720 is about ten microns, and in other embodiments the depth is about twelve microns, although the depth of openings 720 is not a limitation of the present invention.

In the embodiment illustrated in FIG. 26, an anisotropic etching process is used to etch substantially vertically through at least the epitaxial layer 504 and at least part way into substrate 502, although the methods and apparatuses described herein are not limited in this regard. In alternate embodiments, openings 720 may not extend into substrate 502, and the etching may be performed so that the openings 720 extend into layer 504 but not into substrate 502. In some embodiments, anisotropic etching is effectuated via conventional etching using high-speed anisotropic etching in a plasma formed from known mixtures of $HBr/NF_3/He/O_2$.

After the silicon etch, openings 720 are approximately 1.5 microns wide and spaced 0.3 microns apart from one another and define a matrix of vertically extending structures or walls, that may have a pinwheel configuration and a closed-cell configuration when viewed from above, similar to the structures 110 described above with reference to FIGS. 15 and 19. Using the anisotropic etching process, openings 720 may be etched to a depth ranging from approximately three microns to approximately 60 microns. Accordingly, an aspect ratio or ratio of widths to depths of openings 720 may exceed one to two (1:2), and in some embodiments may exceed one to four (1:4). In other embodiments, the ratio of widths to depths of openings 720 may exceed one to twenty (1:20). The etching of openings 720 forms silicon walls 710 having a width between the sidewalls of walls 710 of about 0.3 microns. A sidewall 710a is adjacent to an outer portion of the active area region 560.

This silicon etch also removes polysilicon layer 620 (FIG. 25), and during the removal of polysilicon layer 620, step portions 730 are formed at the bottom of openings 720. In other words, the shape of the bottom portions of openings 720 are formed as a result of the silicon etch that is initially performed with an etch mask having a width of about 0.6 microns (which is the width of the portions of polysilicon layer 620 in region 550), and then as the polysilicon layer 620 is removed as part of this silicon etch, the etch mask is essentially reduced from about 0.6 microns to about 0.3 microns to shape the bottom portions of openings 720 as shown in FIG. 26.

The two etch operations discussed with reference to FIGS. 24 and 25 are optional, and may be used in processes where the minimum feature size of the available processing equipment is insufficient to form a wall of a desired minimum width. For example, if the photolithography equipment is limited to forming dimensions no smaller than about 0.6 microns, the etching operations discussed with reference to FIGS. 24 and 25 may be used to form a relatively smaller etch mask with a dimension of, for example, about 0.3 microns which may be used to form silicon walls 710 in region 550 having a width of about 0.3 microns as was discussed with reference to FIGS. 24, 25, and 26.

Although not shown, openings 720 may be enlarged by another etching operation. For example, a conventional isotropic etch may be performed to reduce the thickness of walls 710 to a thickness ranging between about 0.1 microns to about 0.3 microns. Etching agents used for conventional isotropic etch becomes less effective as they move toward the bottom of openings 720, resulting in a slower etch rate. Therefore, the width of walls 720 may be tapered, wherein the thickness of the walls 710 increases in thickness from the top to the bottom of the openings 720. In other words, the isotropic etch of walls 710 may result in tapered silicon walls 710, with the top portions of walls 710 being thinner than the bottom portions since the silicon at the top portions is exposed to the etch chemistry for the whole duration of the etch, whereas at the bottom portions, the silicon at the bottom portions of walls 710 is only exposed for the very final part of the etch.

Figure 27:
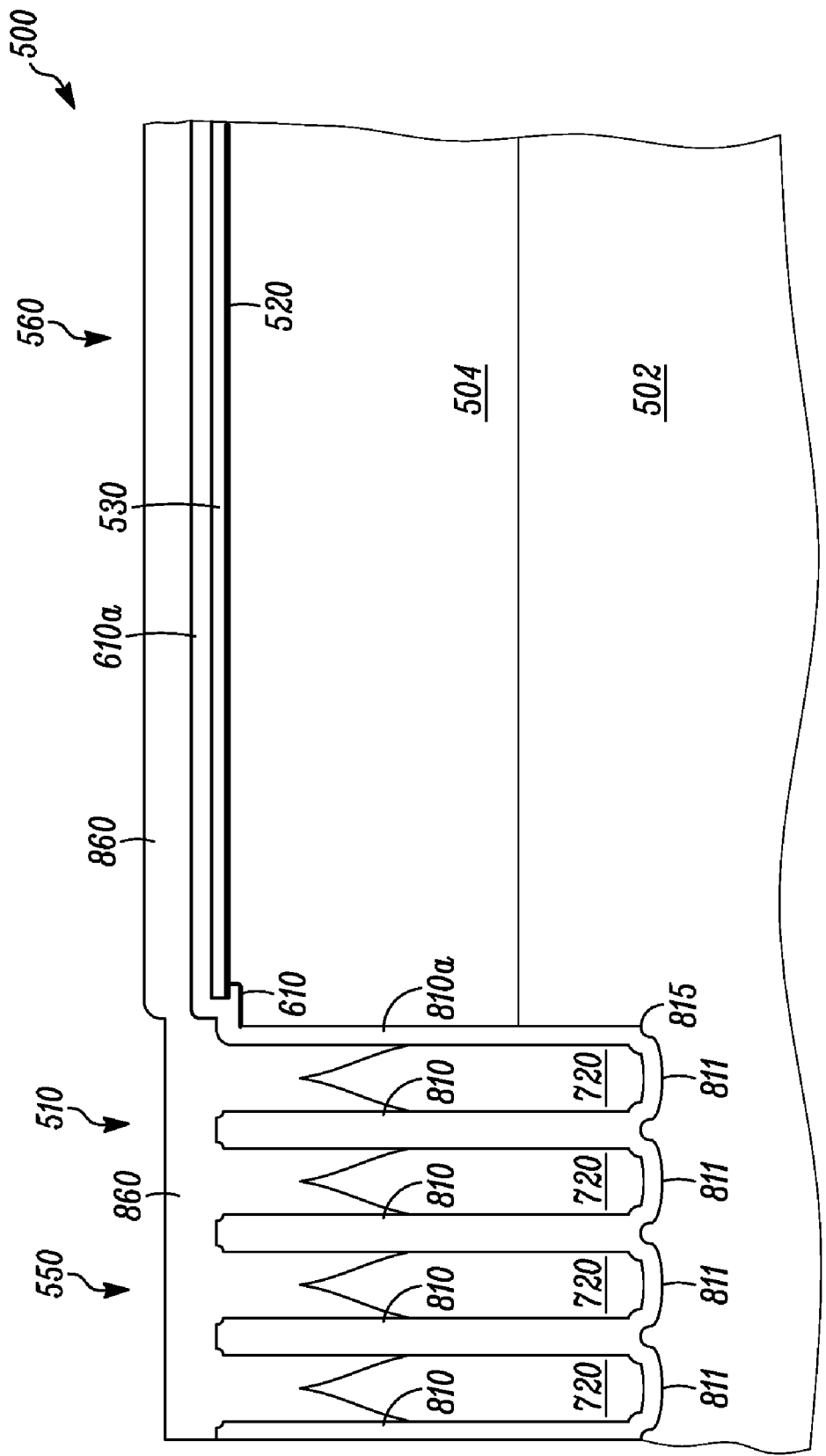
FIG. 27 is a cross-sectional view of the structure of FIG. 26 at a later stage of manufacture.

FIG. 27 is a cross-sectional view of structure 500 at a later stage during manufacturing. FIG. 27 illustrates dielectric structure 510 in region 550 formed in some embodiments using a thermal oxidation process and a dielectric material deposition process. Dielectric structure 510 is in region 550 of structure 500 and includes silicon dioxide walls 810 and 810a, bottom portions 811, openings 720, and capping material 860.

In some embodiments, a thermal oxidation process is performed that forms silicon dioxide at any exposed silicon surface. In particular, the silicon of silicon walls 710 (FIG. 26) may be partially, or in the embodiment illustrated in FIG. 27 completely converted, to silicon dioxide forming silicon dioxide walls 810. In other words, the silicon between the sidewalls of walls 710 may be substantially converted to silicon dioxide in some embodiments. In other embodiments, the silicon of silicon walls 710 (FIG. 26) may be partially converted to silicon dioxide so that the resulting walls of dielectric structure 510 comprise silicon and silicon dioxide. In yet other embodiments, no thermal oxidation process is performed and the resulting walls of structure 510 may remain silicon walls, and as may be appreciated, the dielectric constant of such a structure will be relatively higher than a structure having silicon dioxide walls since the dielectric constant of silicon is higher than the dielectric constant of silicon dioxide.

In addition, as shown in FIG. 27, during the thermal oxidation process, the exposed silicon surface of the innermost wall (labeled 710a in FIG. 26) and the bottom of openings 720 are likewise converted to thermal oxide materials 810a and 811, respectively. Thermal oxide materials 810, 810a, and 811 collectively may be referred to as oxide material 815. Depending on the application, it may be desirable to form additional dielectric material to increase the thickness of dielectric material 815. For example, in some embodiments, the thickness of thermal oxide layer 815 may be increased through optional additional polysilicon deposition and thermal oxidation processes, or in other embodiments, by the deposition of a dielectric material such as, for example, a TEOS oxide or a nitride.

After the thermal oxidation process is performed, the silicon dioxide material formed on the sidewalls of openings 720 may be represented as a homogeneous dielectric silicon dioxide material 815 in subsequent figures, wherein the portions of dielectric structure 510 between openings 720 are labeled 810 in subsequent figures, the portion of dielectric structure 510 nearest the active area region 560 is labeled 810a, and the bottom portions of dielectric structure 510 are labeled 811.

If silicon walls 710 (FIG. 26) have a thickness of about 3000 Angstroms and if the silicon walls 710 are completely converted to silicon dioxide, then after the thermal oxidation process is performed the silicon dioxide walls 810 will have a thickness or width of about 6600 Angstroms since about 2.2 Angstroms of thermal oxide may be formed from about one Angstrom of silicon. Although the thickness of the thermal oxide of walls 810 is limited to about 6600 Angstroms in this example, the thermal oxidation process may continue longer to increase the thickness of the silicon dioxide of wall 810a. For example, in the example wherein the width of silicon dioxide walls 810 is about 6600 Angstroms, the thickness of thermal oxide wall 810a may be about 3300 Angstroms or greater. In different embodiments, the thickness of thermal oxide wall 810a may range from about 4400 Angstroms to about 10,000 Angstroms.

Using chemical vapor deposition (CVD) or gas deposition techniques, a dielectric layer such as, for example, an oxide layer 860, is formed to enclose, cap, or seal openings 720. For example, a hot wall TEOS or plasma TEOS oxide may be deposited such that the deposited oxide material builds up in each opening 720, gradually reducing the size of the opening until opening 720 is closed forming a dielectric layer 860 at the upper portions of openings 720, wherein the remaining lower portions of openings 720 are not filled. After openings 720 are sealed using oxide layer 860, openings 720 may be referred to as chambers, voids, closed cells, or sealed air gaps. The thickness of oxide layer 860 may range from about 8,000 Angstroms to about 12,000 Angstroms, and in one example may be about 9,000 Angstroms. Oxide layer 860 may seal openings 720 to isolate openings 720 from potential contamination from undesirable gases.

As may be appreciated, the width of openings 720 may be adjusted to facilitate forming oxide layer 860 at the upper portions of openings 720 and not in the lower portions of openings 720. For example, the widths of openings may be reduced to prevent the formation of oxide layer 860 at the bottom or lower portions of openings 720.

Cap layer 860 may be formed using a plasma TEOS or hot wall TEOS to form a capping oxide that seals off the closed-cell chambers. As discussed above, cap layer 860 may have a thickness of about 9,000 Angstroms. As a result, the closed-cell dielectric structure 510 traps and encapsulates a low vacuum, a partial vacuum, or a solid matter that does not compromise further processing or subsequent device operational parameters. In some embodiments, the pressure in openings 720 is below atmospheric pressure. As an example, the pressure in openings 720 ranges between approximately 0.1 Torr and approximately 10 Torr.

Figure 28:
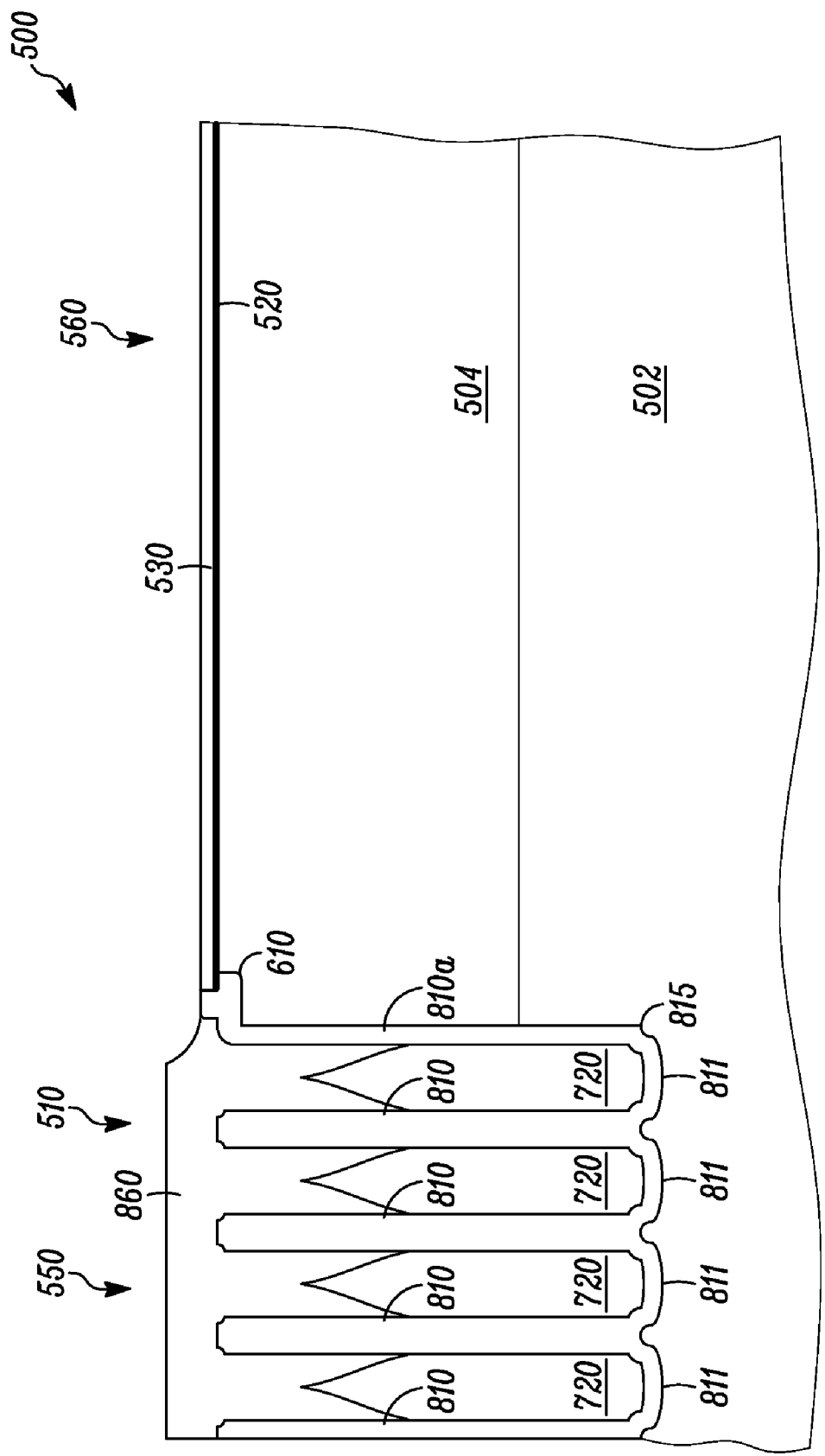
FIG. 28 is a cross-sectional view of the structure of FIG. 27 at a later stage of manufacture.

FIG. 28 is a cross-sectional view of structure 500 at a later stage during manufacturing. A third masking and etching operation is performed to remove portions of cap layer 860 and oxide layer 610a (FIG. 26) in region 560. As an example, an isotropic etch may be performed to remove portions of cap layer 860 and oxide layer 610a as is shown in FIG. 28. Optional planarization of the resultant structure may be performed, to provide a planar upper surface for structure 500. For example, a chemical mechanical planarization (CMP) process may be used to planarize the upper surface of structure 500. A sufficiently planar surface may prevent step coverage problems with subsequent wafer processing steps.

As may be appreciated, by forming a recessed area using an initial masking and etching operation as described with reference to FIG. 22, the amount of dielectric material 860 above a plane coplanar to a top surface of layer 530 is reduced compared to a structure which did not form this recessed area. The exact amount of material 860 above the plane coplanar to the top surface of layer 530 will depend on the depth of the recessed area formed as shown in FIG. 22 and the thicknesses of layers 860, 530, and 520. In some embodiments, the amount of material 860 above the plane coplanar to the top surface of layer 530 may be about 3000 Angstroms. Accordingly, due to this recessed area, after the masking and etching operations are performed to etch portions of cap layer 860 as discussed with reference to FIG. 28, the amount of material above a surface coplanar to the top surface of nitride layer 530 may be reduced to minimize or reduce a substantial height difference between the top surface of nitride layer 530 and the top surface of cap layer 860, which may aid subsequent processing steps, such as, for example, processing steps associated with the formation of layers over these top surfaces.

Although not shown, to prevent any gasses from entering voids 720 through cap layer 860, a silicon nitride layer may be formed over cap layer 860 to seal cap layer 860. The silicon nitride layer may fill in any cracks in the capping layer 860, and in general prevent the propagation of gases into voids 720. Further, a layer of an electrically conductive material such as for example, a layer comprising aluminum, copper, or doped polycrystalline silicon, may subsequently be formed over dielectric structure 510, wherein this layer may be used as part of a passive element or as an interconnect.

The embodiment for making a dielectric structure 510 discussed with reference to FIGS. 21 to 28 used three masking operations, and therefore, may be referred to as a "three-mask process" for making a dielectric structure 510. The three masking operations were described with reference to FIGS. 22, 24, and 28. Although dielectric structure 510 was described as being formed using a three-mask process, the methods and apparatuses described herein are not limited in this regard. In alternate embodiments, a one mask process may be used to form dielectric structure 510. For example, the masking operations described with reference to FIGS. 22 and 28 may be omitted in alternate embodiments and in these embodiments, no initial recessed area is formed in region 550 and after a capping dielectric layer is formed to seal openings 720, the resultant structure may planarized, using for example, a CMP process to provide a planar upper surface for structure 500.

Dielectric structure 510 may be referred to as an embedded dielectric structure since it is formed substantially within a silicon substrate or below a top surface of the silicon substrate which can include epitaxial layer 504. In other words, substantially all of, or a majority of, dielectric structure 510 is formed below a plane that is coplanar to a top surface of epitaxial layer 504. As discussed above, in some embodiments, optional planarization of the resultant structure may be performed, to provide a planar upper surface for structure 500. Accordingly, in some embodiments, a top surface of the active area region 560 may be substantially coplanar to a top surface of the dielectric structure region 550. In other words, a top surface of dielectric structure 510 may be substantially coplanar to a top surface of epitaxial layer 504 in some embodiments, or substantially coplanar to a top surface of some layer above the top surface of epitaxial layer 504, such as, for example, oxide layer 520 or nitride layer 530.

The dielectric structure 510 may be adjacent to, abutting, and/or surrounding, the active area region 560 to provide edge termination to for terminating equipotential lines in the active areas, which may result in relatively higher breakdown voltages for some kinds of active devices such as, for example, vertical transistors, formed in the active area region 560.

Power transistors having relatively high breakdown voltages, and consequently relatively high power output, may be realized by forming a vertical transistor in an active region 560 adjacent to dielectric structure 510, as dielectric structure 510 may provide edge termination for the equipotential lines from an electric field in active region 560 that is adjacent to dielectric structure 510. Higher breakdown voltages may be achieved as the edge termination provided by dielectric structure 510 may reduce curvature of the equipotential lines. As is generally understood, curvature of the equipotential lines results in lower breakdown voltages. To maximize breakdown voltage, the equipotential lines are parallel, or substantially parallel, to an upper surface of epitaxial layer 504, and these equipotential lines are planar with little, to no curvature.

If relatively high breakdown voltages are desired, then the lateral dielectric wall 810a of dielectric structure 510 that contacts the active region 560 is formed to be substantially perpendicular relative to the upper surface of epitaxial layer 504 to allow the equipotential lines to terminate substantially perpendicular at wall 810a of dielectric structure 510. If silicon dioxide wall 810a is angled relative to the upper surface of epitaxial layer 504, then this may not reduce curvature of the equipotential lines as desired.

In addition, if dielectric structure 510 surrounds active area region 560, then dielectric structure 510 may also be used to provide electrical isolation. For example, dielectric structure 510 may be used to electrically isolate active regions from each other, which may also result in electrical isolation between any active devices formed in the isolated active regions.

The dielectric structure 510 may be used to support passive electrical components such as, for example, electrical interconnections formed from metals or doped polycrystalline silicon. The dielectric structure 510 also may accommodate inductors and thin film resistors such as doped polycrystalline silicon or metal resistors. The dielectric structure 510 may also be used to support capacitors with two conductive plates separated by an insulating dielectric. The dielectric structure 510 reduces capacitance of passive components to the conductive silicon substrate. Smaller parasitic capacitance means less power is required to switch electrical signals in conductors and other components formed over, or in conjunction with, the dielectric structure 510.

Forming dielectric structures to have a relative dielectric constant ER of that of silicon dioxide (for example, about 3.9) or less may be desirable, and in some instances a dielectric structure incorporating sealed voids to provide a relative dielectric constant $\in_R$ as low as about 1.5 or lower may be desired. Other considerations for a dielectric structure, such as dielectric structure 510, include thermal coefficients of expansion of the dielectric structure and the materials adjacent the dielectric structure and mechanical stability.

In some embodiments, dielectric structure 510 may be formed greater than five microns wide and greater than three microns deep. In various embodiments, dielectric structure 510 may have a width ranging from approximately five microns to approximately 300 microns and may have a depth or height ranging from approximately three microns to about 60 microns. In one example, the width of dielectric structure 510 may be about ten microns and the depth of dielectric structure 510 may be about ten microns. In another example, the depth of dielectric structure 510 may be about sixty microns.

Passive devices and/or electrical interconnects, electrodes, or contacts may be formed overlying dielectric structure 510. In some embodiments, dielectric structure 510 is formed to a depth greater than three microns. Moreover, dielectric structure 510 can be formed at these dimensions or greater without significant stress being added to the die.

As mentioned previously, optional polysilicon deposition and thermal oxidation processes may be performed to increase the thickness of the dielectric material of dielectric structure 510. For example, in some embodiments, prior to forming dielectric capping layer 860, polysilicon is deposited along the sidewalls of oxide walls 810 and 810a forming a polysilicon layer on the bottom portions and sidewalls of walls 810 and 810a. For example, about 1000 Å of polysilicon may be deposited on the sidewalls of walls 810 and 810a. The polysilicon may then be oxidized to form a 2200 Å thermal oxide layer on the sidewalls of walls 810 and 810a. Other techniques can also be applied that increase the amount of dielectric material. For example, a dielectric material, such as TEOS oxide, may be deposited on the sidewalls of walls 810 and 810a. For capping or sealing voids 720, the upper portions of voids 720 should not be made so large that they cannot be closed by a process step such as a TEOS oxide deposition.

In some embodiments, dielectric structure 510 is a nonconductive structure having a relatively low dielectric constant. From a structural perspective, stress may be reduced in structure 500 if the thickness of the oxide material formed adjacent the bottom portions of voids 720 and on the sidewall 810a adjacent to the active area 560 are controlled to where stress is not induced into the substrate that produces warpage or dislocation defects in the wafer. As discussed above, dielectric structure 510 is designed to reduce stress imparted to the wafer when the dielectric structure comprises a substantial portion of the die area.

The dielectric structure 510 may serve as a support structure that has sufficient structural strength to allow the formation of interconnects, passive components, or active devices over the dielectric structure 510. To achieve this, in some embodiments, vertical support structures such as walls 810 are formed that support a top surface layer such as layer 860. The vertical support structures and top surface layer may comprise a dielectric material. In one embodiment, empty compartments such as voids 720 underlying the top surface layer are formed between the vertical support structures to form air gaps that lower the dielectric constant of the dielectric platform. The diameter of the openings 720 may be selected to allow the build up of deposited dielectric material near the upper portion of openings 720 to close off and seal the voids without filling the voids with the deposited dielectric material.

The dielectric structure 510 may also reduce parasitic capacitances of devices formed using the wafer, thereby extending the frequency response of any devices built using structure 500. Dielectric structure 510 may be used to separate conductive regions from one another, and thus, a relatively low dielectric constant is realized to minimize the capacitance. A relatively low dielectric constant for a dielectric structure may be achieved by maximizing the volume of empty space in the dielectric structure between conductive regions which form the parasitic capacitance.

The dielectric structure 510, and specifically, wall 810a, may be used to provide edge termination for equipotential lines by forming dielectric structure 510 adjacent a transistor that is subsequently formed in active area region 560, to realize a transistor that has increased breakdown voltage relative to conventional devices. Wall 810a may be referred to as a dielectric bulkhead.

Although dielectric structure 510 has been described as being formed adjacent to, or abutting an active area region, this is not a limitation of the present invention. For example, in some embodiments, it may not be necessary to use dielectric structure 510 for edge termination, and therefore, dielectric structure 510 may not be formed near an active area. Further, in some embodiments, dielectric structure 510 may be used mainly to form passive devices, such as inductors and capacitors, having a relatively high Q, or quality factor, compared to, for example, other implementations of passive devices formed using a silicon substrate. Embedded dielectric structure 510 can provide adequate isolation for passive elements from the conductive substrate, and may have advantages over other implementations such as implementations that form an inductor over a relatively thick, solid dielectric layer that is formed above the upper surface over the silicon material (for example, over the upper surface of the top epitaxial layer) to provide isolation between the inductor and the conductive silicon substrate. Such an implementation that uses a relatively thick, solid dielectric layer has a substantially nonplanar surface, which can interfere with subsequent semiconductor process steps such as photoligthographic processes employed for definition of other circuit elements.

Dielectric structure 510 of FIG. 28 may correspond to dielectric structure 110 of FIG. 15. For example, dielectric structure 110 of FIG. 15 may be a top view of structure 500 at the stage of manufacturing illustrated in either of FIG. 26 or FIG. 27 prior to the formation of cap layer 860. In other words, FIG. 26 or 27 (prior to the formation of cap layer 860) may be cross-sectional views of a portion of dielectric structure 110 of FIG. 15. For example, walls 710 (FIG. 26) or 810 (FIG. 27) may correspond to walls 210 (FIG. 15) and openings 720 (FIGS. 26 and 27) may correspond to openings 220 (FIG. 15), although the methods and apparatuses described herein are not limited in this regard.

Accordingly, the dielectric structure 510 (FIG. 28), which may correspond to dielectric structure 110 of FIG. 15, is a closed-cell structure, includes a dielectric bulkhead adjacent to an active area, and a plurality of air gaps having an aspect ratio of at least 1:4. The dielectric bulkhead portion 810a of dielectric structure 510 may provide termination for equipotential lines from an electric field in active area region 560 formed adjacent to the dielectric structure 510. Dielectric structure 510 may be referred to as an embedded structure since it is formed substantially below a surface of a silicon substrate. In addition, the plurality of air gaps 720 of dielectric structure 510 may be spaced to facilitate sealing of the air gaps using a suitable cap layer material 860.

Although dielectric structure 510 is described as having a plurality of air gaps 720, the methods and apparatuses described herein are not limited in this regard. For example, in alternate embodiments, openings 720 could be filled, or partially filled, with a material, such as, for example, a material comprising an oxide, nitride, or silicon if so desired, to form a solid or filled dielectric structure 510. Such a solid or filled dielectric structure 510 would have a relatively higher dielectric constant compared to an air-gap dielectric structure 510 since the material used to fill the openings 510 would have a higher dielectric constant compared to an opening or void. Examples of materials that may be used to fill, or backfill, openings 720 may include silicon nitride, polycrystalline silicon, or an oxide material formed using, for example, a hot wall TEOS process.

Figure 29:
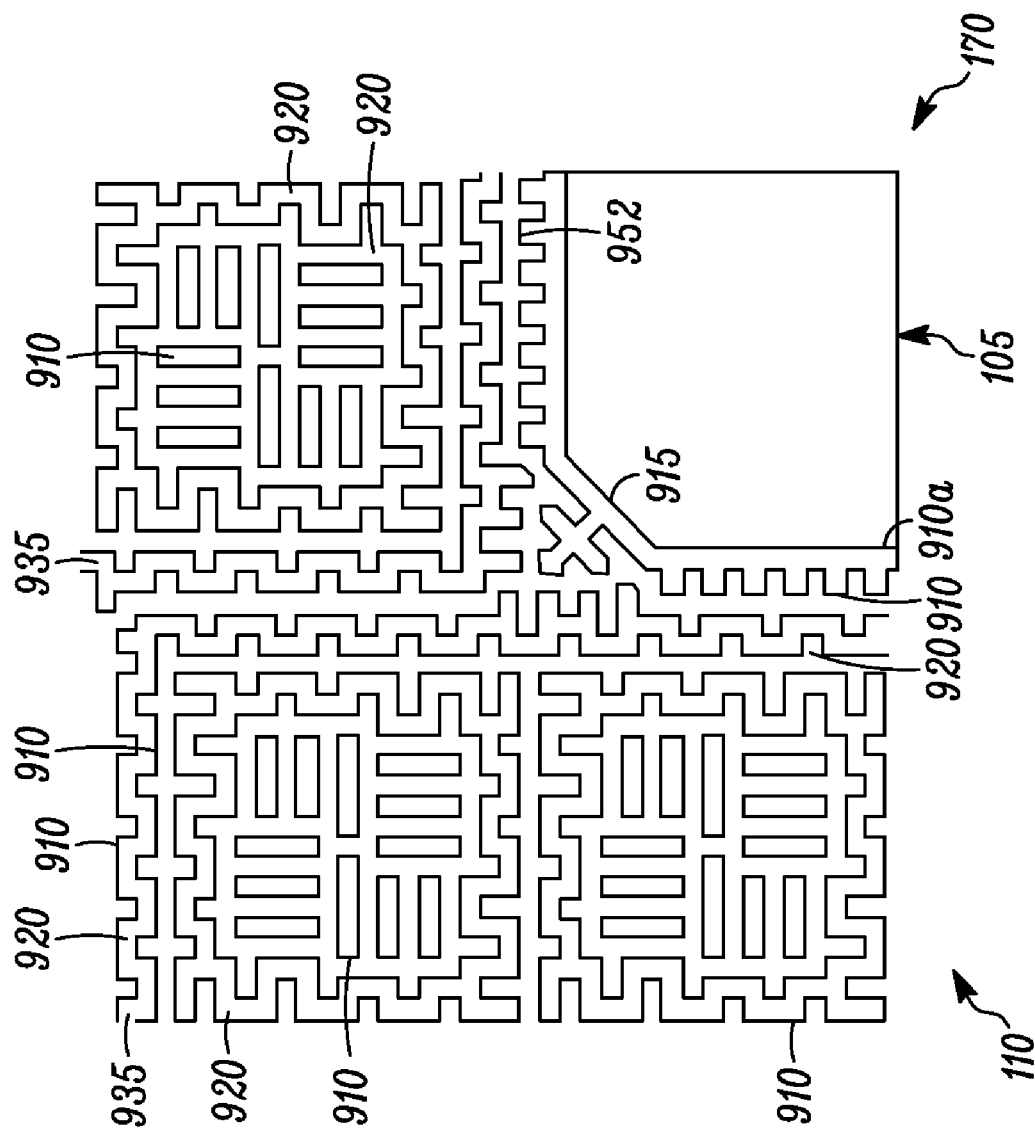
FIG. 29 is a top view of another embodiment of a portion of the device of FIG. 1 during manufacture.

FIG. 29 shows another embodiment of portion 170 (FIG. 1) of device 100 at one stage during manufacturing. In this example, dielectric structure 110 includes a plurality of walls 910 and voids 920. In some embodiments, the dielectric structure 110 includes repeating patterns of walls 910 and voids 920. In the example shown in FIG. 29, dielectric structure 110 includes a wall 910*a* that is adjacent to, and surrounds the active area 105. Wall 910*a* may be referred to as a dielectric bulkhead.

Optionally, in one embodiment, corners of wall 910*a* include mitered or chamfered portions 915. In some embodiments, these mitered areas 915 may also include a small "lip", and, as a result, substantially right-angled junctures, and particularly compound right-angled junctures (where multiple right angles intersect in three dimensions) between silicon and silicon dioxide are avoided.

The mitered portions 915 may be employed to obviate thermal stresses originating in thermal expansion coefficient mismatch between silicon dioxide and silicon, which stresses may be exacerbated at compound right-angled junctions and which in turn may give rise to increased dislocation density in the silicon. Dislocations act as generation-recombination sites and thus may engender increased undesirable leakage currents in the resulting device.

Some of the walls 910 and voids 920 form border portions 935 which will be discussed further below with reference to FIG. 31. Dielectric structure 110 includes a plurality of basic pattern structures 930 (FIG. 30), wherein each pattern structure 930 includes a plurality of walls 910 and voids 920.

Figure 30:
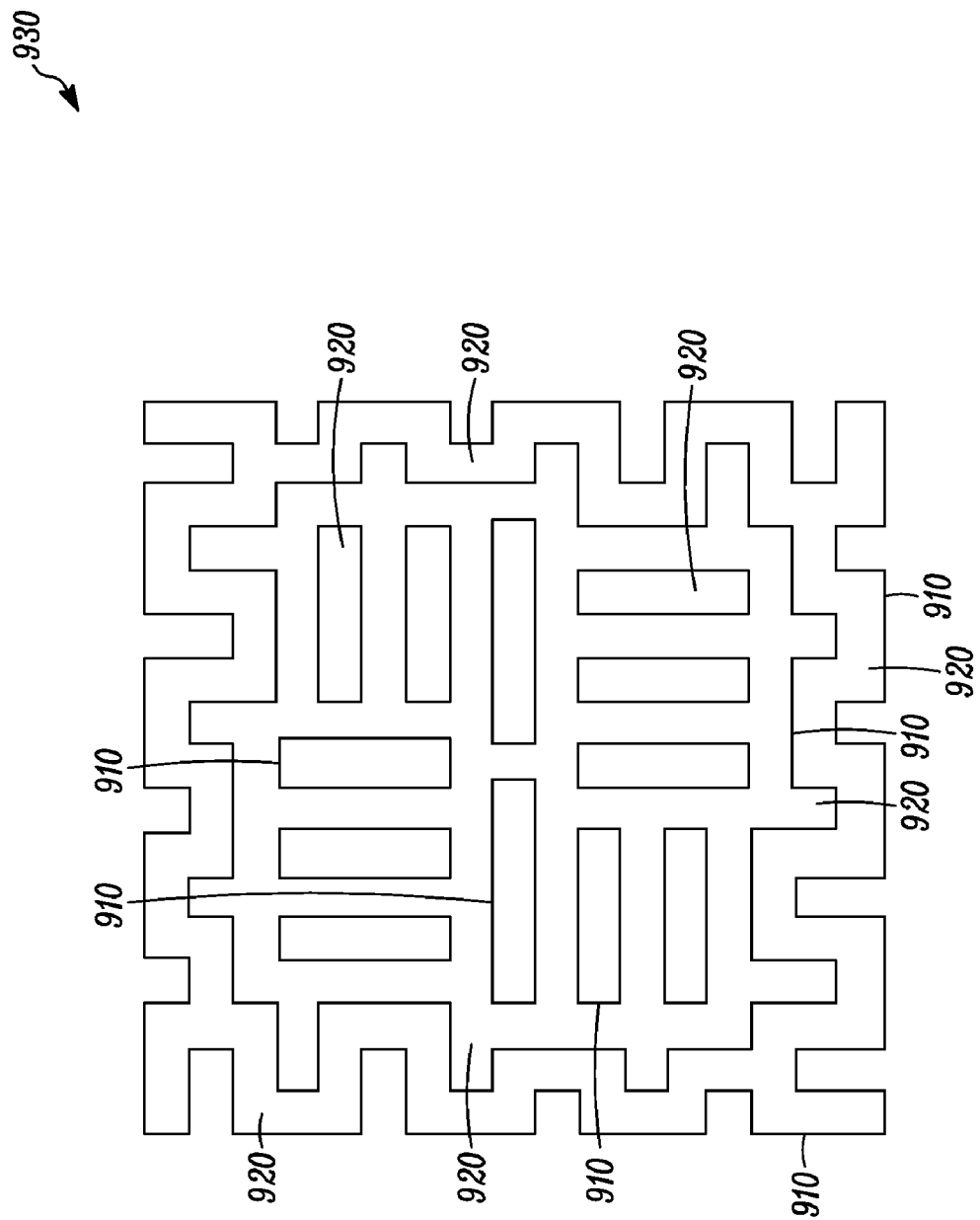
FIG. 30 is a top view of a portion of the structure of FIG. 29.

Referring to FIG. 30, FIG. 30 is a plan view of a basic pattern structure 930 of the dielectric structure 110 that may be repeated throughout dielectric structure 110. The dielectric pattern structure 930 may also be referred to as a single cell of dielectric structure 110 and the length and width of the cell 930 may be about 19.8 microns by about 19.8 microns in some embodiments. In the example illustrated in FIG. 30, pattern structure 930 may include a plurality of walls 910 in its interior portion that may be related by inversion symmetry, although the methods and apparatuses described herein are not limited in this regard.

Figure 31:
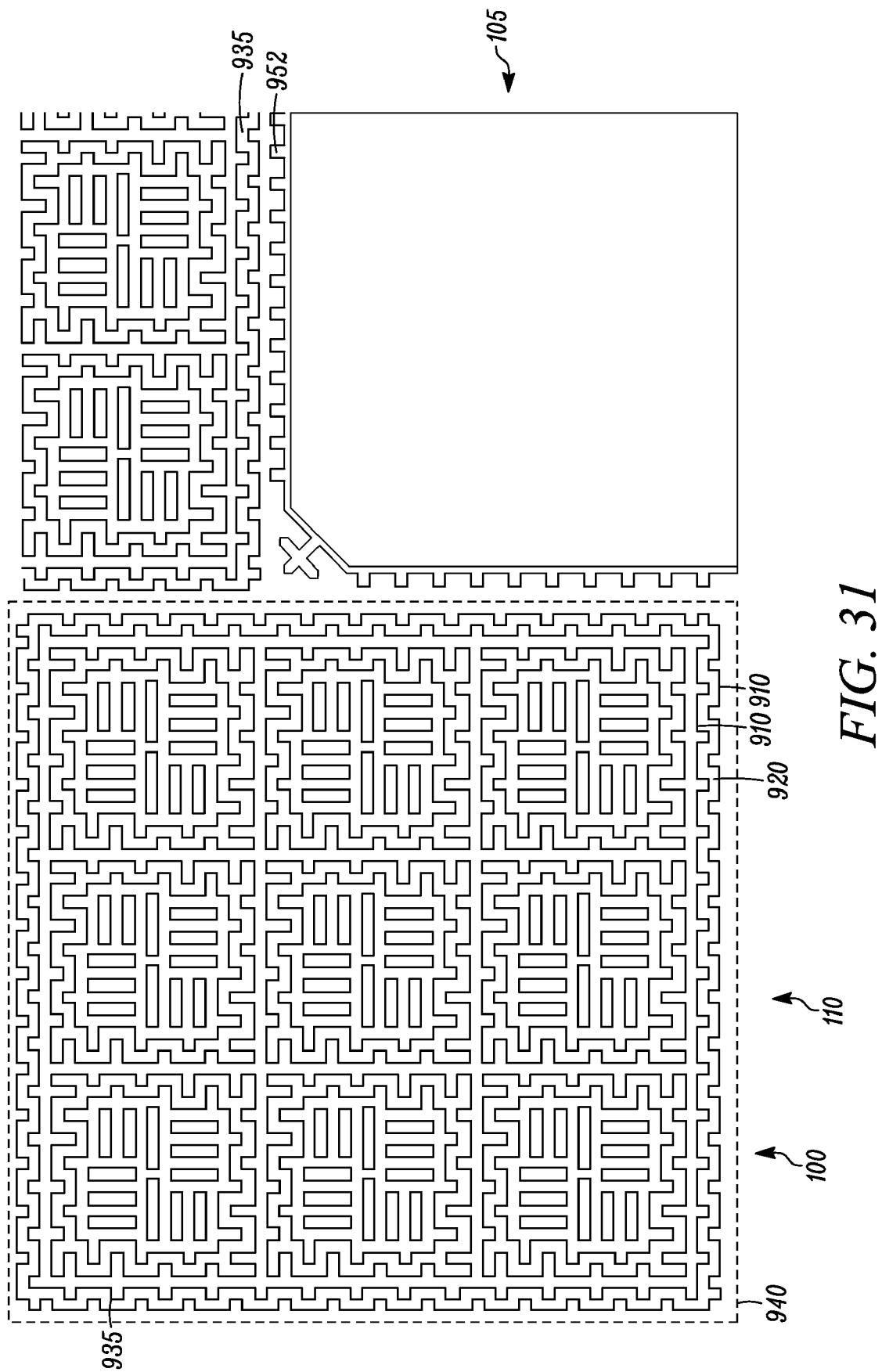
FIG. 31 is a larger top view of the structure of FIG. of FIG. 29.

FIG. 31 shows a larger portion of device 100 (FIG. 1) compared to portion 170 shown in FIG. 29. In the example illustrated in FIG. 31, pattern structures 930 (FIG. 30) may be arranged in groups and surrounded by an optional border portion 935. As is shown in FIG. 31, in some embodiments, six pattern structures 930 may be surrounded by a border portion 935 and this grouping may be denoted with a reference character 940 and a dashed outline. Border portion 935 includes walls 910 and a void 920. This basic pattern 940 may be repeated throughout dielectric structure 110.

Referring to FIGS. 29 through 31, dielectric structure 110 in this example has a closed-cell configuration in that the voids 920 of dielectric structure 110 may be physically isolated from each other by walls 910. As will be discussed further below, in some embodiments, a capping layer such as, for example, an oxide layer (e.g., a tetraethylorthosilicate (TEOS) oxide layer) may be formed over all of the cells of dielectric structure 110 to further isolate the voids 920 from each other. Accordingly, if the capping layer experiences a rupture or fracture, contamination from any gases in the voids 920 of dielectric structure 110 may be contained in a limited area due to the closed-cell configuration, wherein voids 920 are physically isolated from each other. As may be appreciated, walls 910 of border portion 935 provide another means for limiting contamination in dielectric structure 110 by isolating groups of pattern structures 930 from each other.

In the example illustrated in FIG. 31, the combination of walls 910 and voids 920 reduces the overall permittivity of dielectric structure 110 so that dielectric structure 110 has a relatively low dielectric constant. In some embodiments, walls 910 may comprise silicon dioxide, and in these embodiments a dielectric constant approaching about 1.5 or lower may be achieved.

The dielectric structure 110 illustrated with reference to FIGS. 29 through 31 comprises a plurality of structures 930, a plurality of border portions 935, and a corrugated border portion 952. Corrugated border portion 952 surrounds active area 105 and may be referred to as a dentil-shaped, crenellated or castellated portion. Corrugated portions 952 may be used as a border for dielectric structure 110 so that in the event of a defect in the dielectric structure 110, then, bordering portion 952 may contain any contamination from, for example, gases in the voids 910 of dielectric structure 110.

Dielectric structure 110 shown in the example illustrated in FIGS. 29 through 31 may use a design rule for a minimum spacing between adjacent walls 910. In some embodiments, no rectilinear or straight-line portion of the walls 910 is more than 4.5 times (4.5×) this minimum spacing. In other words, the length of the rectilinear portions of dielectric structure 110 illustrated in FIGS. 29 through 31 is equal to or less than about 4.5 times (4.5×) the minimum spacing between the rectilinear portions of dielectric structure 110. In one embodiment, the minimum spacing between walls 910 is about 1.1 microns, and the length of a straight-line sidewall portion of any wall 910 is less than, or equal to, about four times (4×) the minimum spacing of about 1.1 microns, that is, less than, or equal to, about 4.4 microns. Forming walls 910 in this manner may reduce or avoid potential bowing of walls 910 due to thermal stresses.

FIGS. 32 to 47 are used to describe at least one embodiment of a dielectric structure 1110 (FIG. 47), and a method of making dielectric structure 1110. This method of making dielectric structure 1110 may be used to manufacture the alternate embodiments of dielectric structure 110 described with reference to FIGS. 29 through 31.

Figure 32:
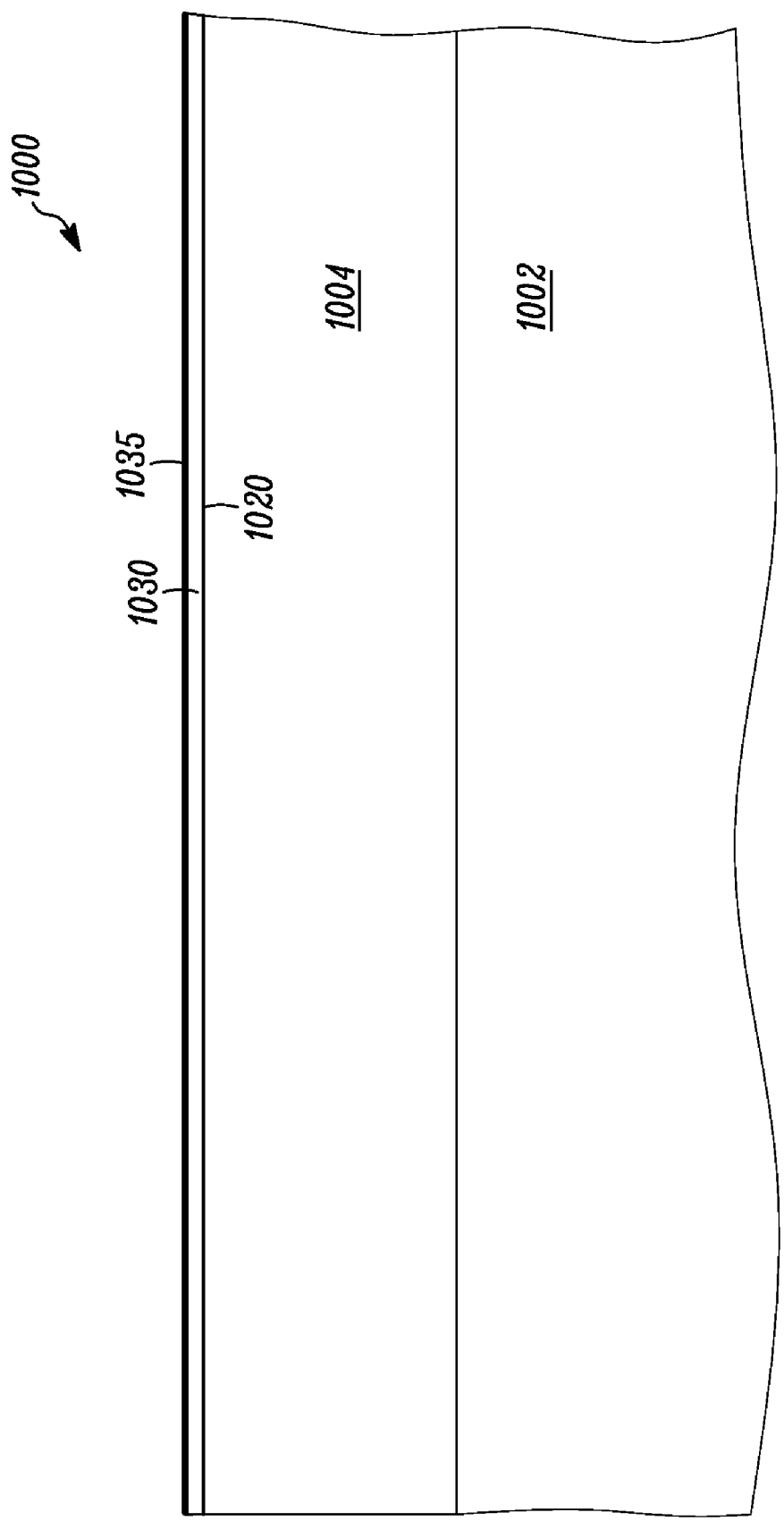
FIG. 32 is a cross-sectional view of a structure at an early stage of manufacture.

FIG. 32 is a cross-sectional view of a portion of structure 1000 at one stage during manufacturing in accordance with an embodiment of the present invention. Structure 1000 includes an n-type silicon substrate 1002 and an n-type epitaxial layer 1004.

A dielectric layer 1020 is formed at a surface of layer 1004. In an embodiment of the wafer process, dielectric layer 1020 comprises silicon dioxide ($SiO_2$). Layer 1020 of silicon dioxide is thermally grown at a surface of layer 1004 using thermal oxidation, wherein the silicon dioxide layer has a thickness ranging from approximately 670 Angstroms to approximately 1000 Angstroms (Å).

Another dielectric layer 1030 such as, for example, a silicon nitride ($Si_3N_4$) layer, may be formed over silicon dioxide layer 1020. Silicon nitride layer 1030 may be formed using a low pressure chemical vapor deposition (LPCVD) and may have a thickness of about 1250 Angstroms. Silicon nitride layer 1030 may be useful as an etch stop, a protective layer, and/or mask layer during the processing of dielectric structure 1110 (FIG. 47) in region 1050 (FIG. 33).

Another dielectric layer 1035 such as, for example, an oxide layer, may be formed over silicon nitride layer 1030. Dielectric layer 1035 may comprise, for example, a thermal oxide layer having a thickness of about 1100 Angstroms formed, for example, via conventional hot-wall reaction of TEOS (tetraethylorthosilicate) or, alternatively formed by a deposition of, for example, about 500 Angstroms of polycrystalline silicon, and then performing a thermal oxidation of the polycrystalline silicon to form a silicon dioxide layer 1035 having a thickness of about 1100 Angstroms.

Figure 33:
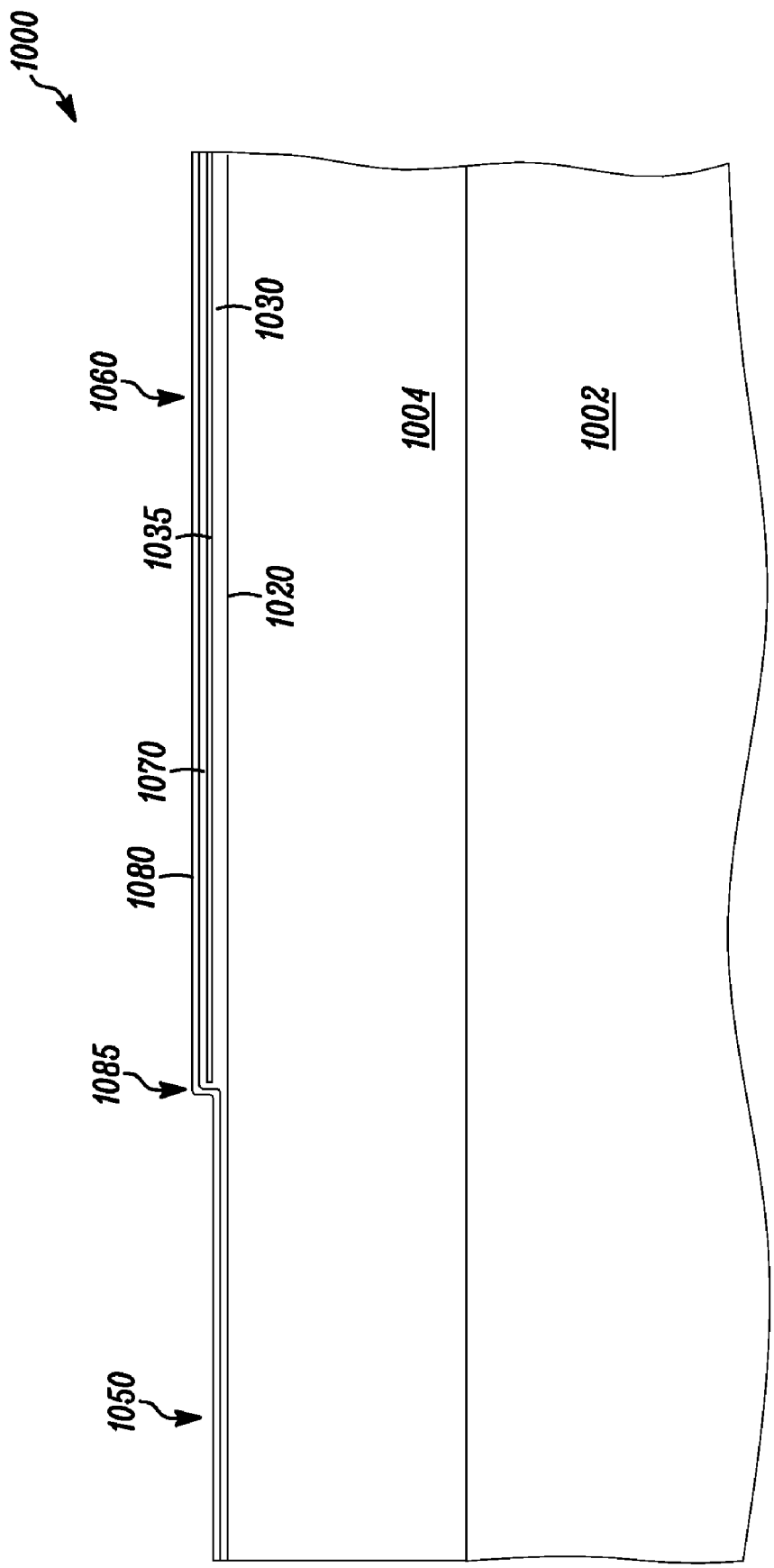
FIG. 33 is a cross-sectional view of the structure of FIG. 32 at a later stage of manufacture.

FIG. 33 is a cross-sectional view of structure 1000 at a later stage during manufacturing. A region 1050 of structure 1000 is a region in which dielectric structure 1110 (FIG. 47) is to be formed and a region 1060 is a region of structure 1000 in which the active area of structure 1000 is to be formed.

Layers 1020, 1030, and 1035 may be patterned using photolithography and etching processes. The photolithography and etching may include forming a layer of a radiation-sensitive material such as, for example, photoresist (not shown), over oxide layer 1035, then exposing the photoresist using, for example, ultraviolet (UV) radiation to form a mask, and then etching portions of layers 1020, 1030, and 1035 using the photoresist mask and an anisotropic etch, stopping at epitaxial layer 1004. In some embodiments, a plasma etching process may be used to etch dielectric layers 1020, 1030, and 1035. After the etching of layers 1020, 1030, and 1035, the photoresist may be stripped or removed.

After the anisotropic etching operation, a dielectric layer 1070 such as, for example, a silicon nitride ($Si_3N_4$) layer, may be conformally formed on the exposed surface of epitaxial layer 1004 and on the etched oxide layer 1035. Silicon nitride layer 1070 may be formed using a low pressure chemical vapor deposition (LPCVD) and may have a thickness ranging from about 500 Angstroms to about 750 Angstroms. Although not shown, an optional layer of thermal oxide (not shown) having a thickness ranging in some embodiments from about 50 Angstroms to about 150 Angstroms may be formed at the exposed surface of epitaxial layer 1004 prior to the formation of silicon nitride layer 1070, wherein this thermal oxide layer is between epitaxial layer 1004 and silicon nitride layer 1070 to prevent damage that may result from forming silicon nitride layer 1070 on epitaxial layer 1004.

After the formation of silicon nitride layer 1070, a dielectric layer 1080 such as, for example, an oxide layer, may be conformally formed over silicon nitride layer 1070. Oxide layer 1080 may have a thickness of about 1100 Angstroms and may be formed by depositing a TEOS oxide (for example, an oxide layer formed by a hot-wall reaction of TEOS), or in other embodiments, may be formed by depositing a layer of polysilicon having a thickness of about 500 Angstroms followed by a thermal oxidation process to convert the layer of polysilicon to silicon dioxide to form layer 1080 of silicon dioxide having a thickness of about 1100 Angstroms.

Figure 34:
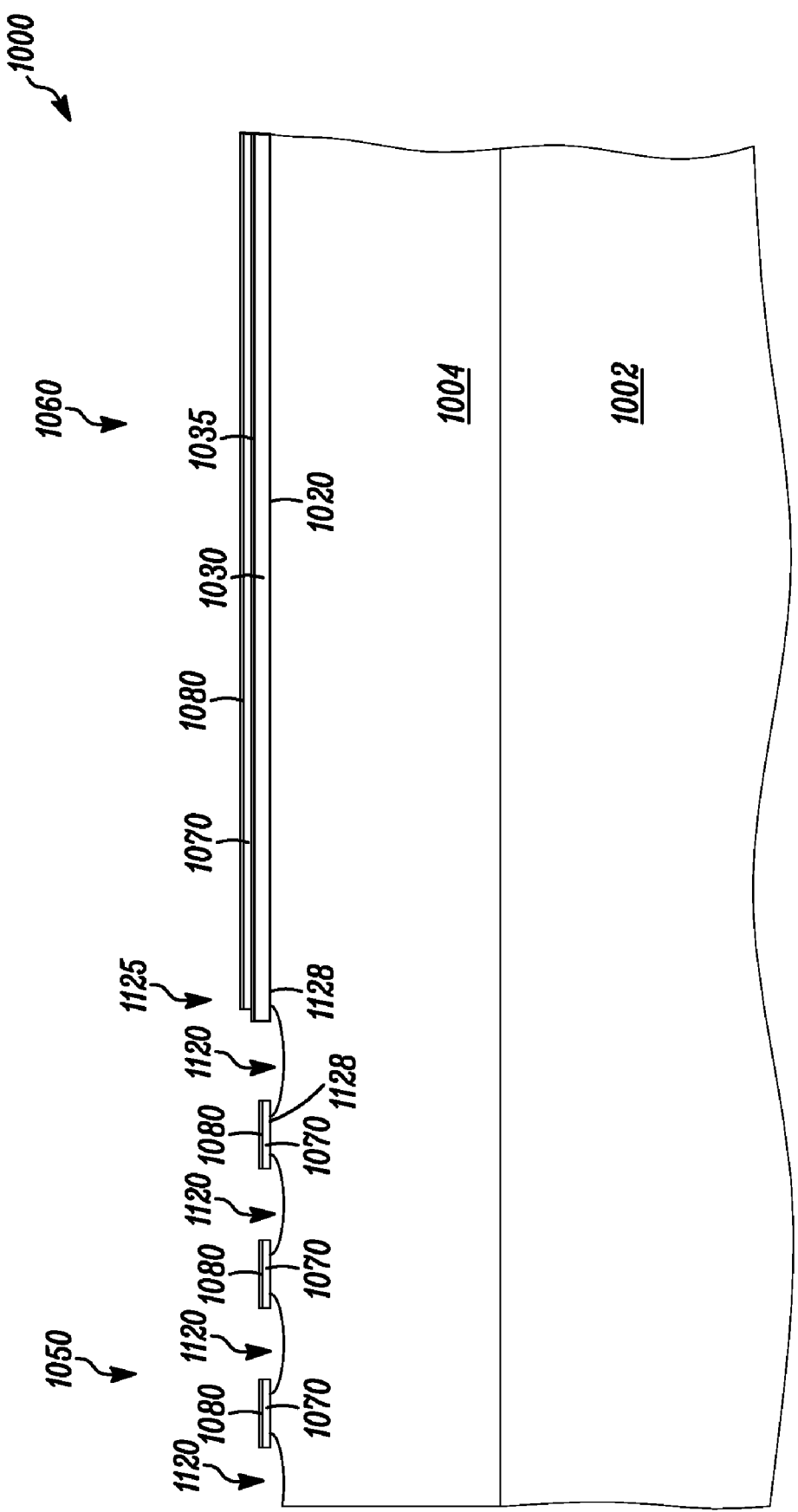
FIG. 34 is a cross-sectional view of the structure of FIG. 33 at a later stage of manufacture.

FIG. 34 is a cross-sectional view of structure 1000 at a later stage during manufacturing. A masking and etching operation is performed to form a plurality of openings 1120. In particular, an isotropic etching operation, which can be performed using a conventional high pressure plasma or wet chemical techniques, is performed in a portion of region 1050 to remove portions of silicon nitride layer 1070, portions of oxide layer 1080, and portions of epitaxial layer 1004 to form openings 1120 in region 1050. In one embodiment, openings 1120 have a width of about 1.5 microns, a depth ranging from about 0.15 microns to about 0.4 microns, and are spaced apart by about one micron or less. The etch mask that is used to form openings 1120 overlaps the step or edge 1085 (FIG. 33), and consequently a step 1125 is formed after openings 1120 are formed.

As discussed above, stresses may be exacerbated at compound right-angled junctions which in turn may give rise to increased dislocation density in the silicon. The isotropic etch that is used to form openings 1120 is optional and clears areas underneath nitride layers 1070 in region 1050, and result in openings having rounded sidewalls and less than ninety degree corners at a surface 1128 of epitaxial layer 1004. For example, the corner portions near the upper portions of openings 1120 at surface 1128 are about 45 degree angle corners. In other words, edges of openings 1120 that were formed by the isotropic etch result in corners that are not 90 degree angle corners. Accordingly, this achieves a reduction in stresses from subsequent thermal oxidation processes at these corners that may result in undesirable dislocation density.

Figure 35:
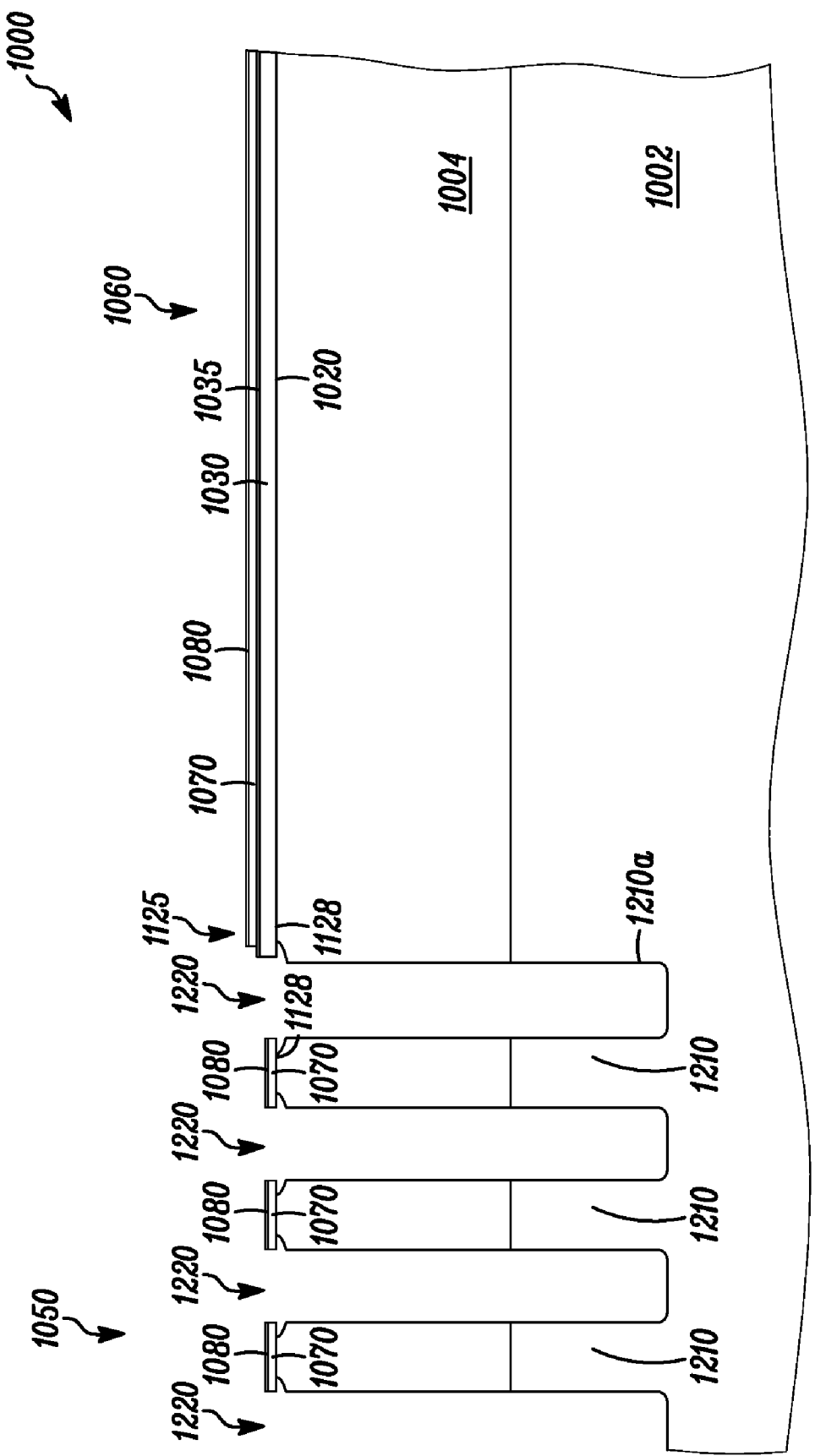
FIG. 35 is a cross-sectional view of the structure of FIG. 34 at a later stage of manufacture.

FIG. 35 is a cross-sectional view of structure 1000 at a later stage during manufacturing. After the optional isotropic etch, an anisotropic etch is performed, which may be a conventional directional etch that can provide a relatively high degree of selectivity between one material and another, to remove portions of epitaxial layer 1004 and substrate 1002 to form a plurality of walls 1210 and openings 1220. The depth of openings 1220 is about ten microns below surface 1128 in some embodiments. The depth of openings 1220 may range from about three microns to about sixty microns after the anisotropic etch. In some embodiments, anisotropic etching is effectuated via conventional etching using high-speed anisotropic etching in a plasma formed from known mixtures of $HBr/NF_3/He/O_2$.

As is discussed above, the depth of openings 1220 that are formed by an anisotropic etch may be significantly greater than the depth of openings 1120 (FIG. 34) that are formed by an isotropic etch. Openings 1220 have vertical, or near or substantially vertical, sidewalls. The substantially rounded sidewalls of openings 1120 (FIG. 34) extend from the near vertical sidewalls of openings 1220 to surface 1128 and thus preclude the sidewalls of openings 1220 from forming a substantially right angle with surface 1128.

A sidewall 1210*a* is adjacent to an outer portion of the active area region 1060. As may be appreciated, walls 1210 comprise silicon at this stage of manufacturing. In some embodiments, openings 1220 have a width of about 1.1 microns to about two microns, and walls 1210 have a width of about 1.1 microns. In one embodiment, the opening 1220 abutting wall 1210*a* has a relatively larger width than the width of other openings 1220, for example, the width of the opening 1220 abutting wall 1210*a* may be about 1.3 microns.

Figure 36:
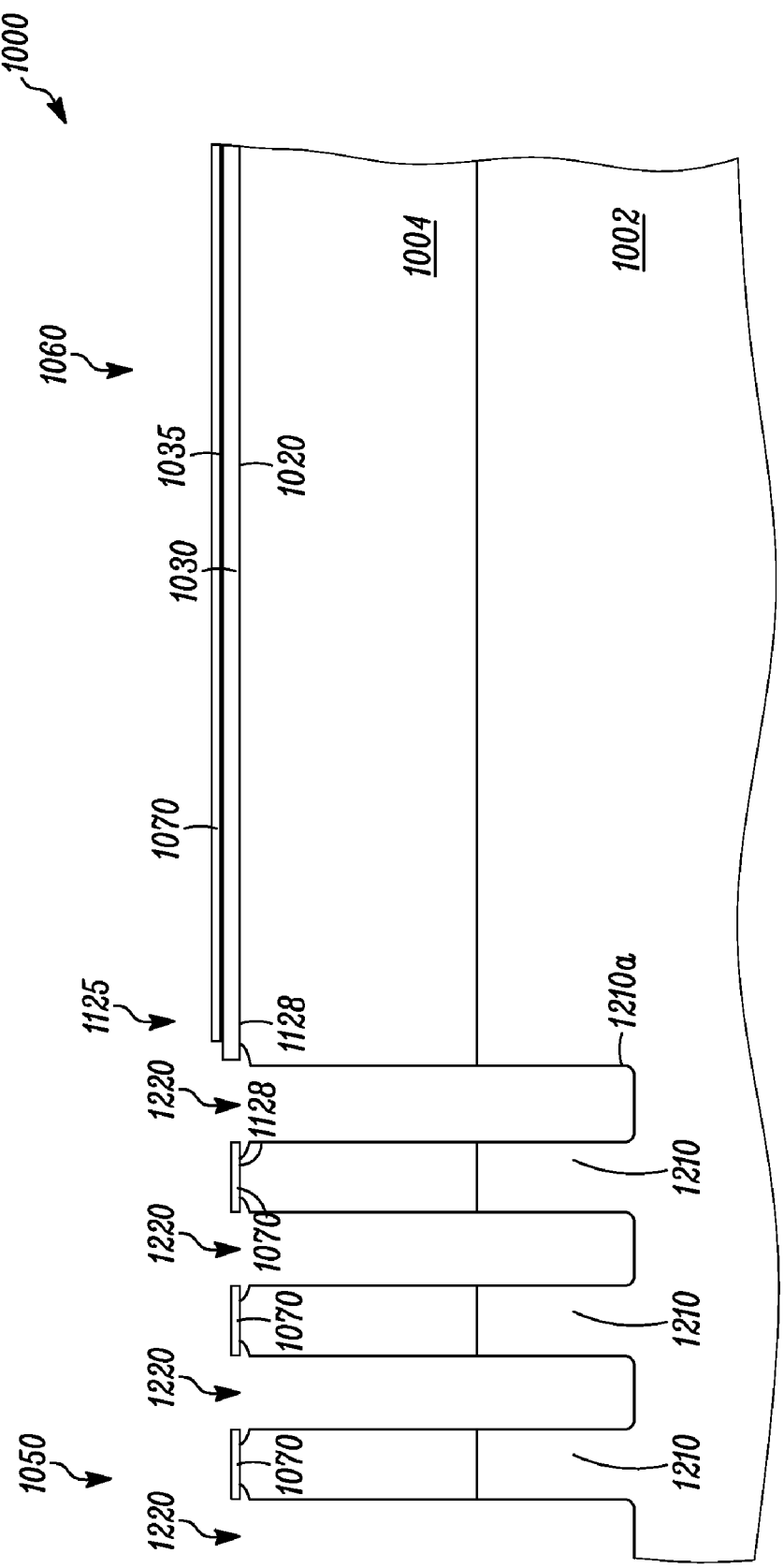
FIG. 36 is a cross-sectional view of the structure of FIG. 35 at a later stage of manufacture.

FIG. 36 is a cross-sectional view of structure 1000 at a later stage during manufacturing. A chemically selective etch such as for example, an anisotropic etch, may then be employed to remove oxide layer 1080 (FIG. 35) and a portion of silicon nitride layer 1070. In some embodiments, this selective etch does not remove all of silicon nitride layer 1070 at this stage. For example, silicon nitride layer 1070 may have a thickness of about 500 Angstroms after the selective etch.

Figure 37:
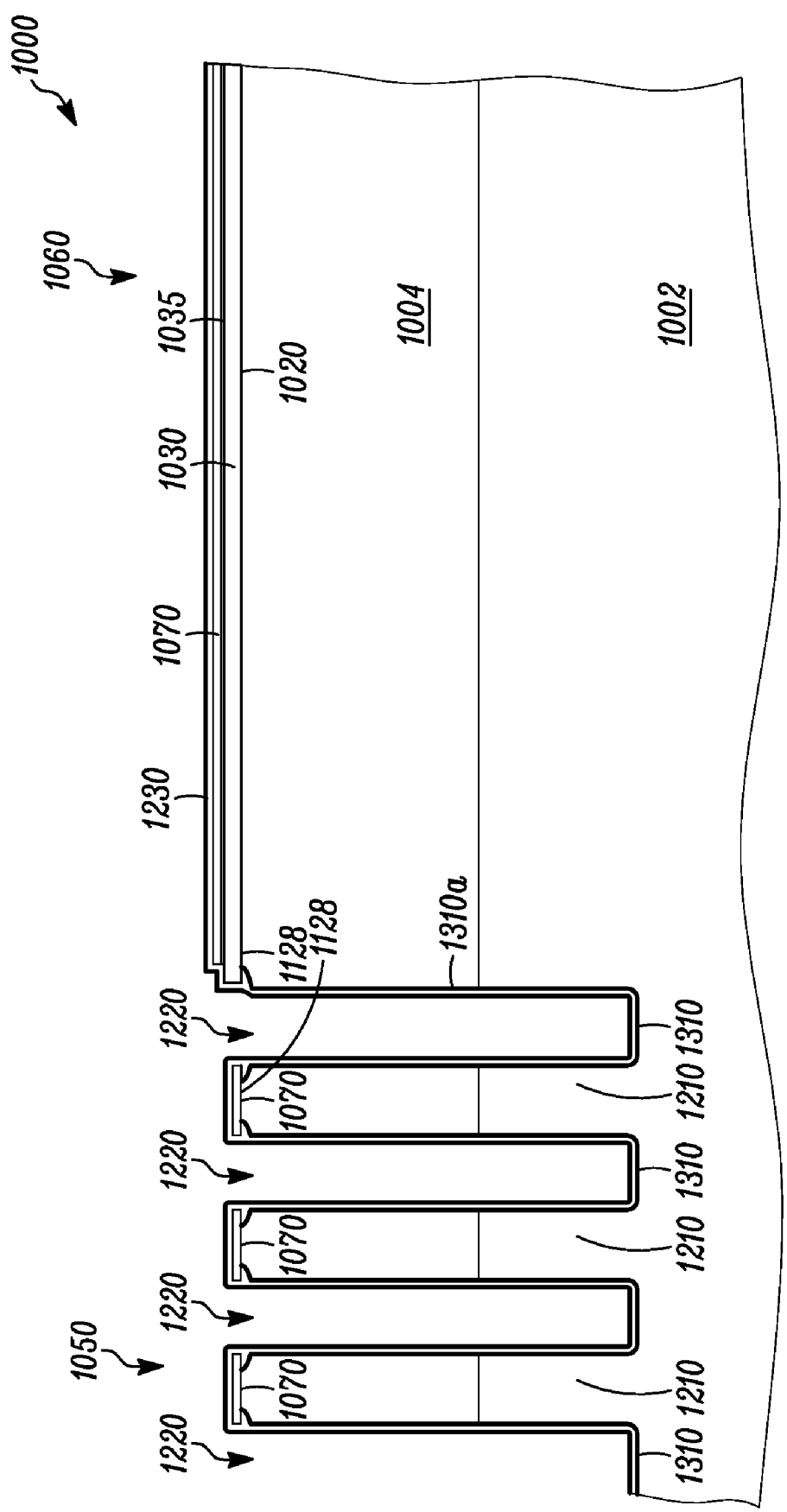
FIG. 37 is a cross-sectional view of the structure of FIG. 36 at a later stage of manufacture.

FIG. 37 is a cross-sectional view of structure 1000 at a later stage during manufacturing. After the etching of layers 1080 and 1070 described above with reference to FIG. 36, a thermal oxidation is performed to form a silicon dioxide or thermal oxide layer 1310 at any exposed silicon surface. In various embodiments, thermal oxide layer 1310 has a thickness ranging from about 1000 Angstroms to about 3000 Angstroms. A portion of thermal oxide layer 1310 abutting region 1060 is labeled 1310*a* and this portion may be referred to as a wall or dielectric bulkhead. Maintaining the thickness of portion 1310*a* below a specified threshold such as, for example, about 1000 Angstroms, may reduce excess stress in structure 1000 which may lead to dislocations and undesirable excessive leakage currents in any active devices subsequently formed in active area 1060.

Figure 38:
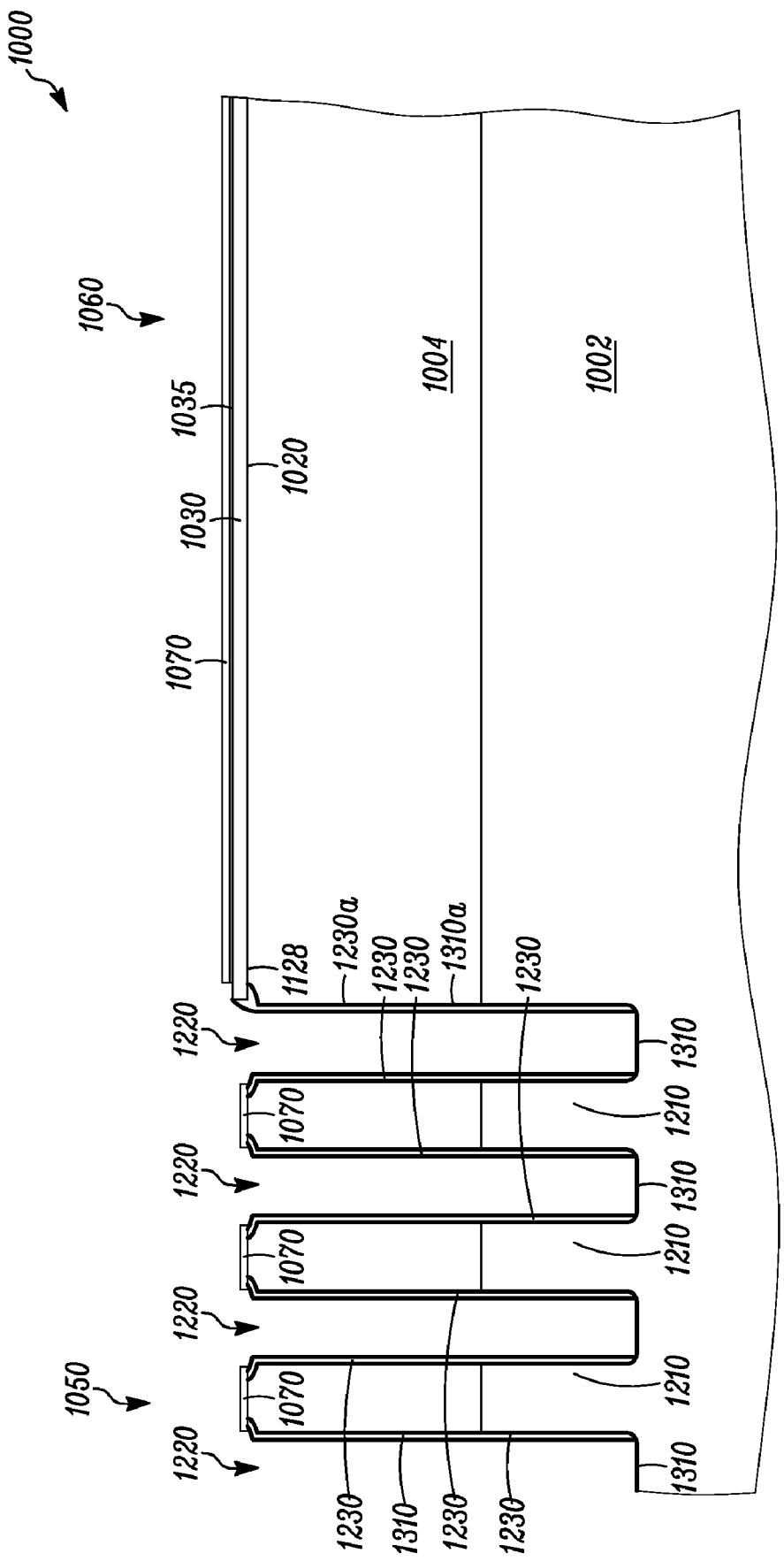
FIG. 38 is a cross-sectional view of the structure of FIG. 37 at a later stage of manufacture.
Figure 39:
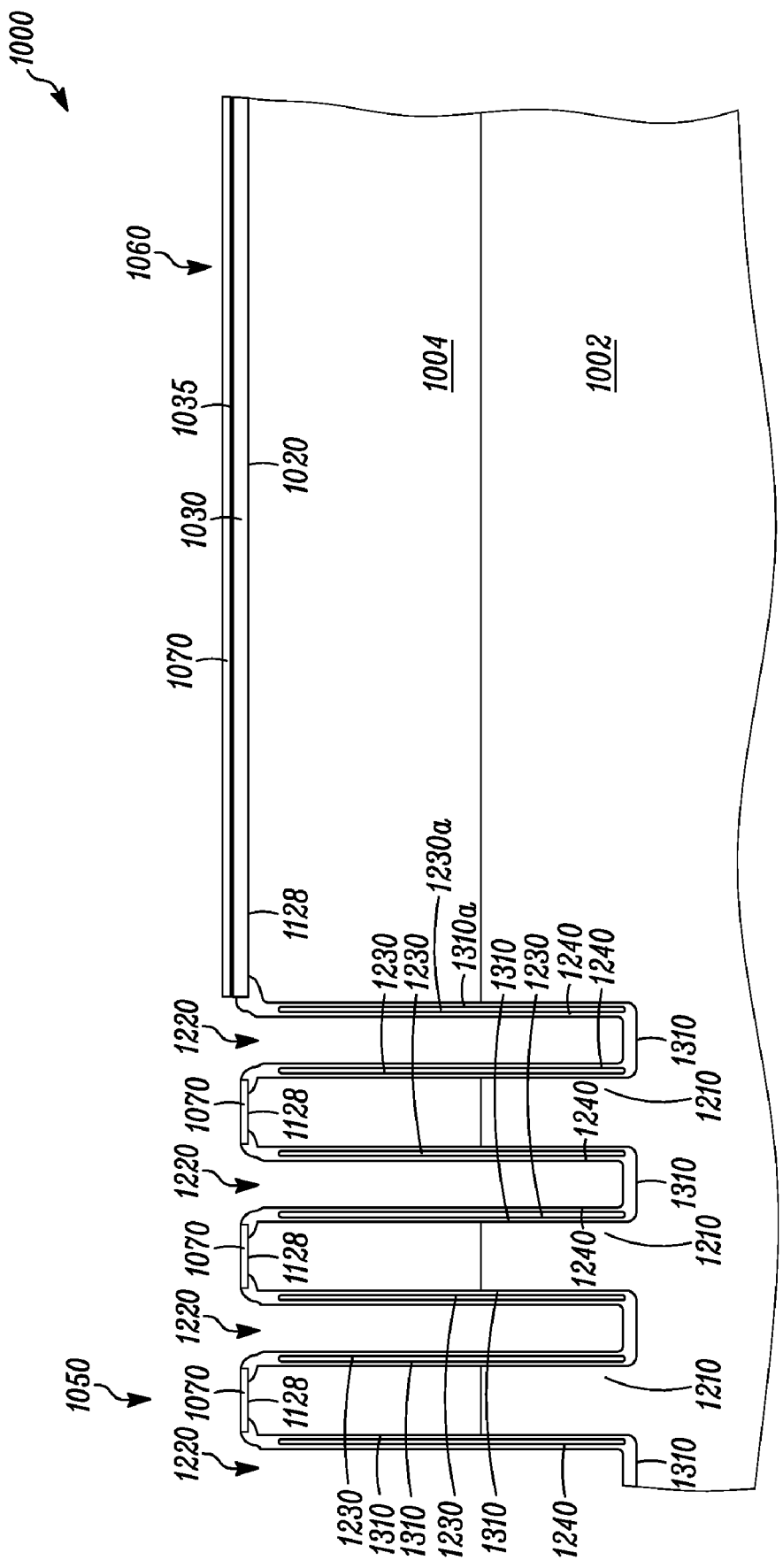
FIG. 39 is a cross-sectional view of the structure of FIG. 38 at a later stage of manufacture.

Depending on the application, it may be desirable to form additional dielectric material to increase the thickness of dielectric material 1310. For example, in some embodiments, the thickness of thermal oxide layer 1310 may be increased through an optional deposition of a dielectric material such as, for example, a TEOS oxide or a nitride. In other embodiments, the thickness of thermal oxide layer 1310 may be increased through optional additional polysilicon deposition and thermal oxidation processes. Examples of optional additional polysilicon deposition and thermal oxidation processes to increase the thicknesses of the resulting vertical dielectric structures or walls in dielectric structure 1110 (FIG. 47) is illustrated in FIGS. 37 through 39 and in FIGS. 43 through 44, although the methods and apparatuses described herein are not limited in this regard. In alternate embodiments, no further thickening acts are performed after the initial thermal oxidation process that is used to form layer 1310. In the example illustrated in FIG. 37, an optional polysilicon layer 1230 is deposited having a thickness of about 1500 Angstroms.

Figure 47:
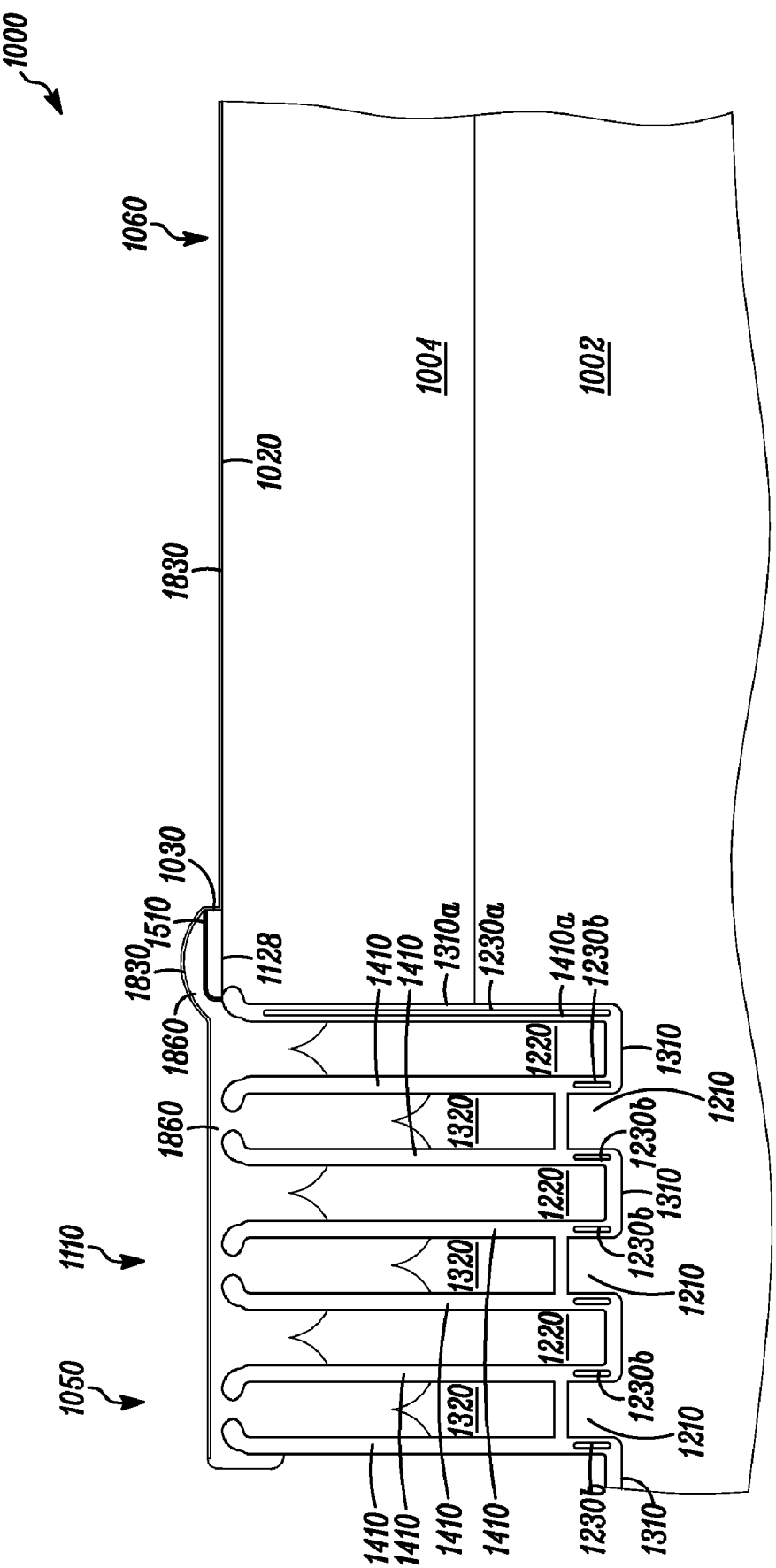
FIG. 47 is a cross-sectional view of the structure of FIG. 46 at a later stage of manufacture.

FIG. 38 is a cross-sectional view of structure 1000 at a later stage during manufacturing. An anisotropic etch is used to remove portions of polysilicon layer 1230 on horizontal surfaces of structure 1000. Specifically, portions of polysilicon layer 1230 at the bottom portions of openings 1220 and on silicon nitride layer 1070 are removed using the anisotropic etch. This may be done to avoid forming excess oxide material at the upper portion of structure 1000 and in the bottom portions of openings 1220 since the purpose of optional polysilicon layer 1230 is to increase the vertical sidewall thickness of the resultant walls 1410 (FIG. 47) of the resultant dielectric structure 1110 (FIG. 47).

FIG. 39 is a cross-sectional view of structure 1000 at a later stage during manufacturing. In some embodiments, the remaining vertical portions of polysilicon layer 1230 are thermally oxidized to form silicon dioxide layers 1240. If the thermal oxidation process is performed to partially consume about 1000 Angstroms of the 1500 Angstroms of polysilicon layer 1230 (FIG. 38), then the thickness of silicon dioxide layer 1240 is about 2200 Angstroms and the portions of polysilicon layer 1230 (FIG. 39) remaining after this thermal oxidation have a thickness of about 500 Angstroms. In other words, in the example illustrated in FIG. 39, the remaining portions of polysilicon layer 1230 (FIG. 24) are partially converted to silicon dioxide and this will form a polysilicon layer 1230*a* abutting oxide wall 1310*a*, wherein the thickness or width of polysilicon layer 1230*a* is about 500 Angstroms and wherein a length or depth of polysilicon layer 1230*a* is at least about two microns or greater, although the methods and apparatuses described herein are not limited in this regard. In other words, layer 1230*a* may also be referred to as an elongated element comprising a semiconductor material, wherein polysilicon layer 1230*a* is adjacent to semiconductor materials 1004 and 1002, spaced apart from semiconductor materials 1004 and 1002 by a distance of, for example, about 5000 Angstroms or less, and extends a distance of, for example, about three microns or greater below the surface semiconductor material 1004.

Polysilicon layer 1230*a* may aid in maintaining the thickness of thermal oxide wall 1310*a* to a predetermined thickness of, for example, 1000 Angstroms. For example, subsequent thermal oxidation may be performed in region 1050 and this subsequent thermal oxidation will not increase the thickness of thermal oxide wall 1310*a* due to the presence of polysilicon layer 1230*a* wherein thermal oxide wall 1310*a* is between polysilicon layer 1230*a* and semiconductor materials 1002 and 1004. As discussed above, maintaining the thickness of wall 1310*a* below a specified threshold such as, for example, about 1000 Angstroms, achieves a reduction in stress in structure 1000 by reducing excess stress in structure 1000 which can lead to dislocations and undesirable excessive leakage currents in any active devices subsequently formed in active area region 1060.

In addition, polysilicon layer 1230*a* may serve as a floating field plate to aid in providing edge termination for active area region 1060 which may aid to realize transistors having increased breakdown voltage formed using active area region 1060. For example, since polysilicon layer 1230*a* is a semiconductor material it may collect electrical charge during the operation of an active device subsequently formed in active area 1060. Further, during operation of such an active device formed in active area 1060, a gradient of voltage may be distributed across polysilicon layer 1230*a* as various voltages may be vertically applied to polysilicon layer 1230*a* from substrate 1002 to the upper portions of epitaxial layer 1004. This gradient may cause equipotential lines from an electric field in active area region 1060 to terminate horizontally at polysilicon layer 1230*a*, thereby aiding in maintaining generally planar equipotential lines to maximize breakdown voltage of any active device subsequently formed using active area region 1060. Polysilicon layer 1230*a* is optional and may be referred to as field plate, floating field plate, or a stress relief layer.

Figure 40:
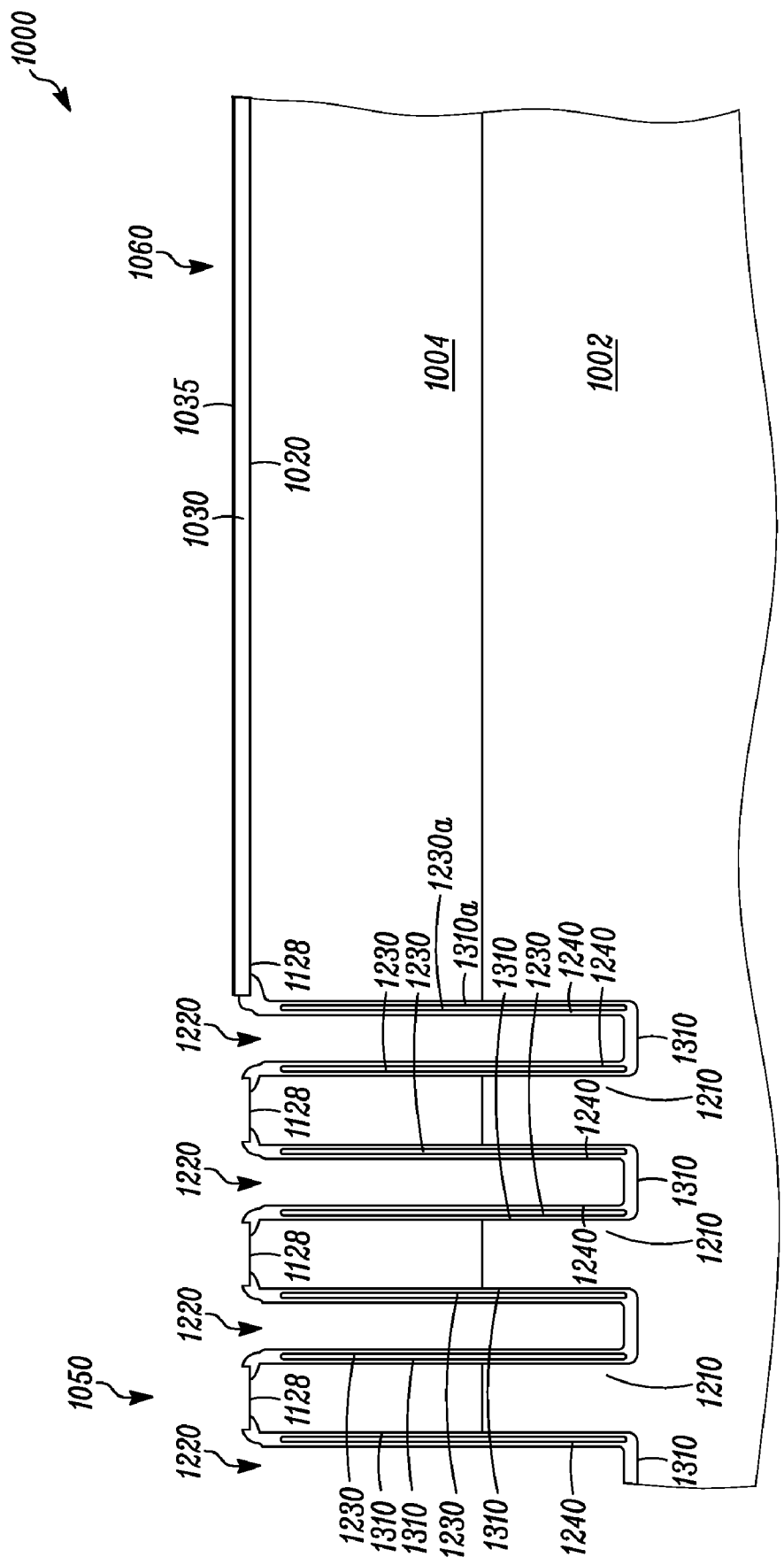
FIG. 40 is a cross-sectional view of the structure of FIG. 39 at a later stage of manufacture.

FIG. 40 is a cross-sectional view of structure 1000 at a later stage during manufacturing. After forming thermal oxide layers 1240, the remaining portions of silicon nitride layer 1070 (FIG. 39) are removed using an anisotropic etch to expose walls 1210 that comprise portions of epitaxial layer 1004 and substrate 1002 in region 1050.

Figure 41:
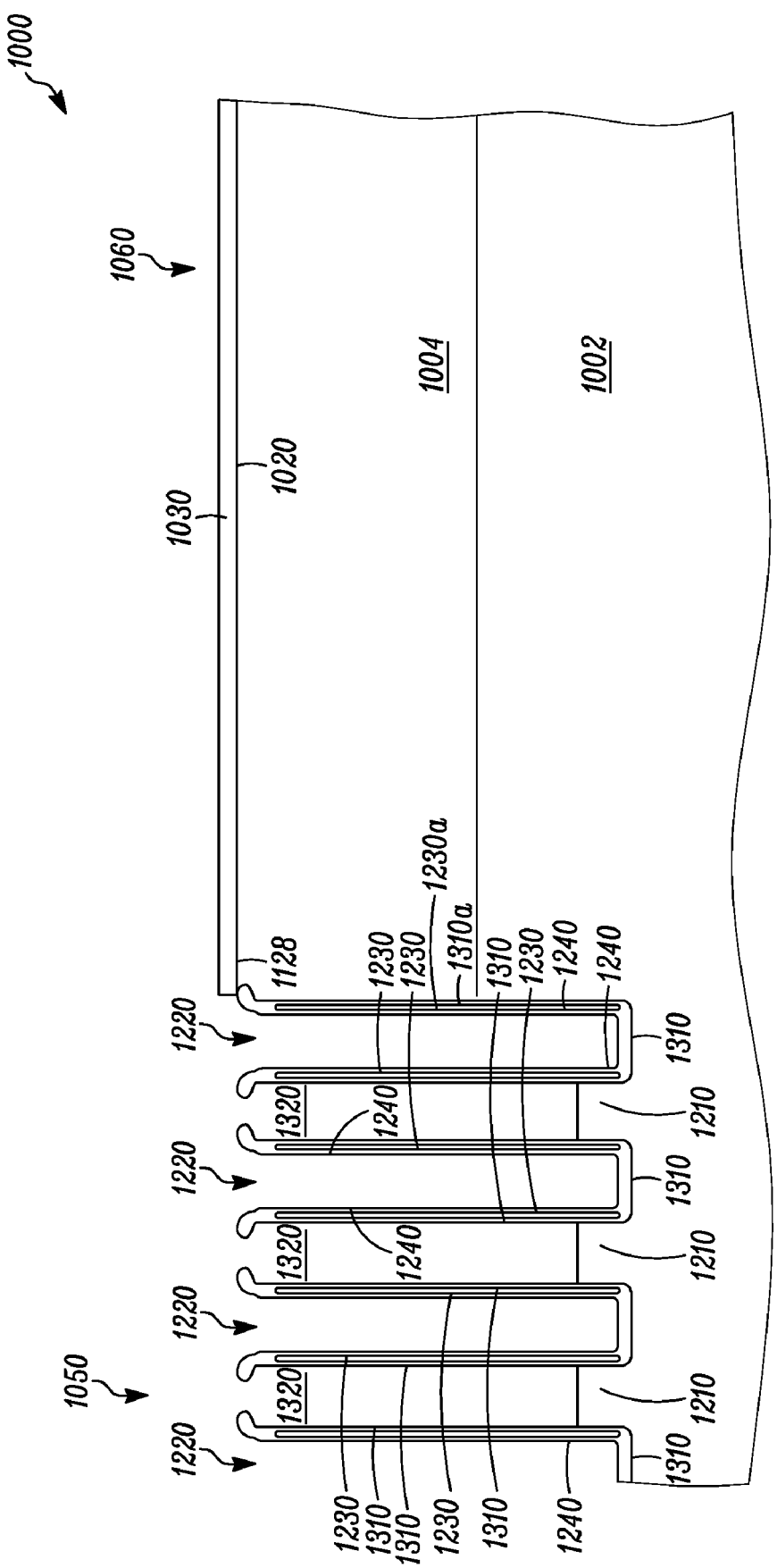
FIG. 41 is a cross-sectional view of the structure of FIG. 40 at a later stage of manufacture.

FIG. 41 is a cross-sectional view of structure 1000 at a later stage during manufacturing. After the etching of silicon nitride layer 1070, in some embodiments two etches are performed to remove portions of silicon walls 1210 to form trenches or openings 1320 that having a depth that is less than the depth of openings 1220. For example, an anisotropic etch may be initially performed to form openings 1320 to a depth of, for example, about ten microns as measured from a plane that is coplanar to surface 1128. Some silicon material may remain along oxide materials 1310 after the anisotropic etch, and therefore, the anisotropic etch may be followed by an isotropic etch to completely remove all silicon material along oxide materials 1310. These etches may have a relatively high selectivity ratio of silicon to silicon dioxide such as, for example, a 60 to 1 selectivity ratio of silicon to silicon dioxide, and therefore, oxide layer 1035 (FIG. 40) and portions of thermal oxide layers 1310 and 1240 are removed during these etches. As a result of the anisotropic etch, the rate of removal of oxide layer 1035 is greater compared to the rate of removal of thermal oxide layers 1310 and 1240. For example, in some embodiments, oxide layer 1035 having a thickness of about 1100 Angstroms is completely removed while about 800 Angstroms of thermal oxide layers 1310 and 1240 is removed during these anisotropic and isotropic etches. In these embodiments, the thickness of layers 1240 is reduced from about 2200 Angstroms to about 1400 Angstroms during the anisotropic and isotropic etches.

The isotropic etch results in a taper in the thickness of silicon dioxide layers 1310, with upper portions of layers 1310 being thinner than bottom portions of layers 1310 since the upper portions of layers 1310 are exposed to the etch chemistry for the whole duration of the etch, whereas the silicon dioxide at the bottom portions of layers 1310 is only exposed for the latter part of the isotropic etch. The depth of openings 1320 is formed to be less than the depth of openings 1220 to provide structural base support for the resultant walls 1410 (FIG. 47) of dielectric structure 1110 (FIG. 47).

Figure 42:
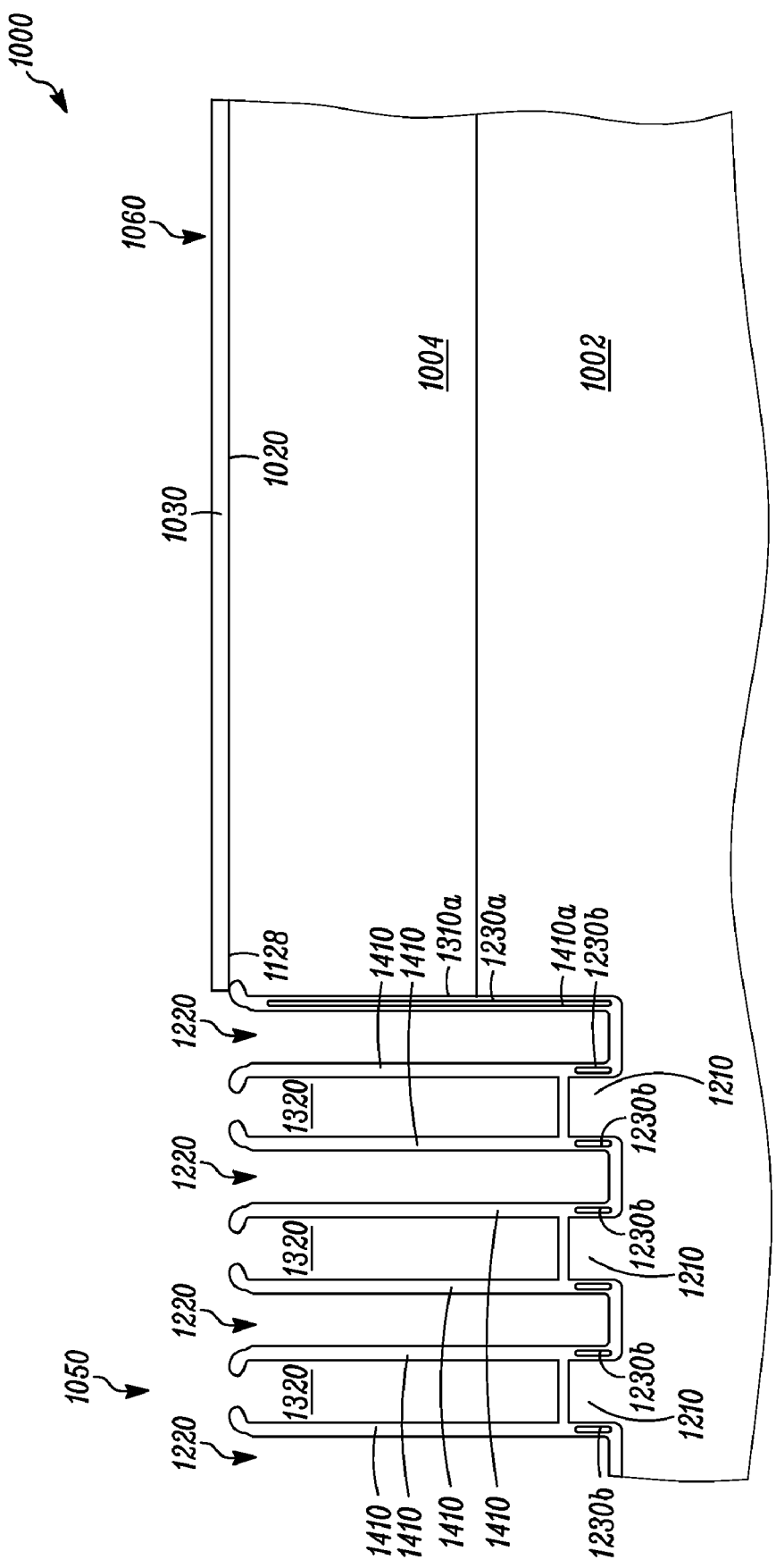
FIG. 42 is a cross-sectional view of the structure of FIG. 41 at a later stage of manufacture.

FIG. 42 is a cross-sectional view of structure 1000 at a later stage during manufacturing. In some embodiments, a thermal oxidation is performed after the two etches described with reference to FIG. 41 to form thermal oxide walls 1410 having a thickness of, for example, about 2500 Angstroms. This thermal oxidation may form silicon dioxide at any exposed silicon surface and consume most of the remaining polysilicon material 1230 (FIG. 41) except portions 1230*a* and 1230*b* which may be reduced in thickness from about 500 Angstroms to about 300 Angstroms after this thermal oxidation in some embodiments. This thermal oxidation may reduce the effective dielectric constant of the resulting embedded dielectric structure by converting some of the polysilicon material 1230 to silicon dioxide which has a lower dielectric constant than polysilicon. As is well known, the dielectric constant of polysilicon and silicon is about 11.7 and the dielectric constant of silicon dioxide is about 3.9.

As may be appreciated, silicon dioxide walls 1410 comprise silicon dioxide layers 1240 (FIG. 41) and 1310 (FIG. 41) and the silicon dioxide formed by thermal oxidation of portions of polysilicon layers 1230 and 1230a. In some embodiments, wherein the thickness of polysilicon wall 1230a is reduced from about 500 Angstroms to about 300 Angstroms due to the thermal oxidation, this results in the increasing of the thickness of silicon dioxide wall 1410a that abuts polysilicon wall 1230a by about 440 Angstroms to a thickness of about 1840 Angstroms due to the thermal oxidation of 200 Angstroms of polysilicon layer 1230a.

Figure 43:
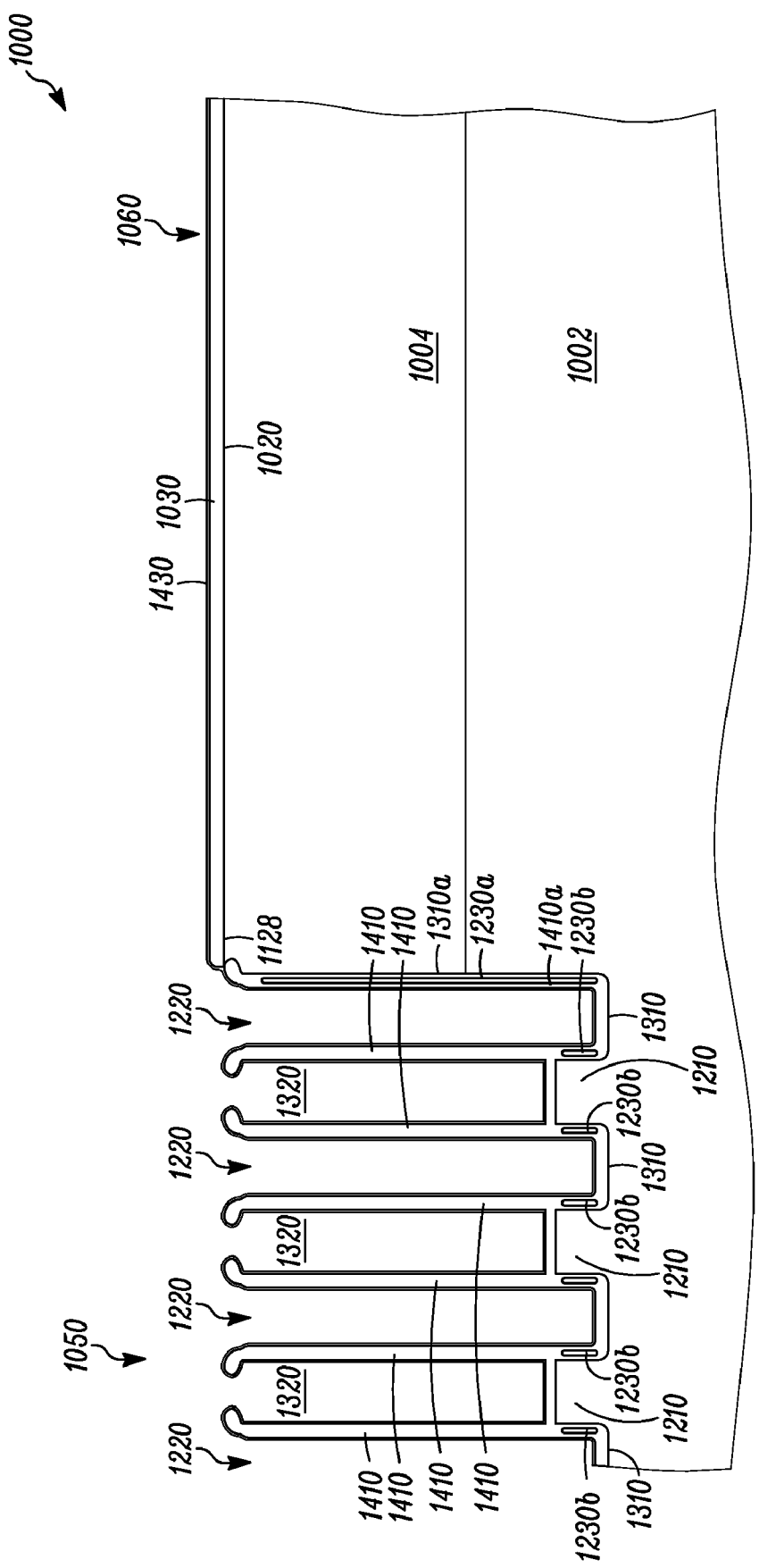
FIG. 43 is a cross-sectional view of the structure of FIG. 42 at a later stage of manufacture.
Figure 44:
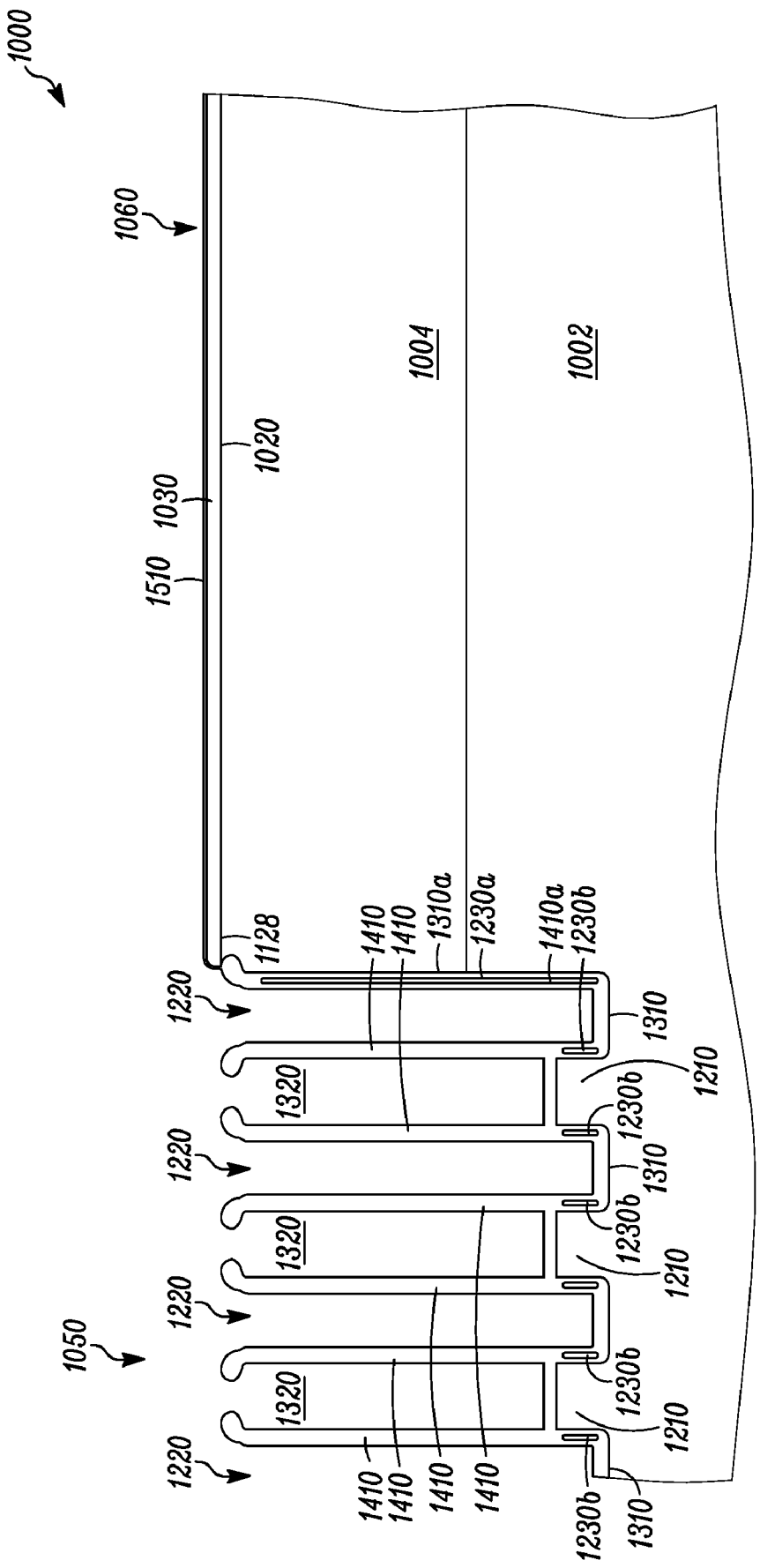
FIG. 44 is a cross-sectional view of the structure of FIG. 43 at a later stage of manufacture.

As was discussed above, in some embodiments, optional additional layers of polysilicon may be deposited and oxidized to increase the physical strength or structural integrity of silicon dioxide walls 1410 by further increasing the thickness of walls 1410. For example, FIGS. 43 and 44 illustrate the deposition of an optional additional polysilicon layer 1430 (FIG. 43) and the subsequent thermal oxidation of polysilicon layer 1430 to form additional silicon dioxide on walls 1410 by thermal oxidation of an additional layer of polysilicon 1430. In other embodiments, the thickness of silicon dioxide walls 1410 may be increased by, for example, using a hot wall TEOS process to form TEOS oxide (not shown) on walls 1410, or the thickness of silicon dioxide walls 1410 may be increased by depositing layers comprising nitride (not shown) on silicon dioxide walls 1410.

FIG. 43 is a cross-sectional view of structure 1000 at a later stage during manufacturing. An optional additional layer of polycrystalline silicon 1430 having a thickness of approximately 500 Angstroms is conformally formed on silicon nitride layer 1030 and on silicon dioxide layers 1410, 1410a, and 1310.

FIG. 44 is a cross-sectional view of structure 1000 at a later stage during manufacturing. A thermal oxidation process is performed to convert polysilicon layer 1430 to a layer of silicon dioxide on silicon dioxide walls 1410. In some embodiments, as part of this thermal oxidation, the thickness of walls 1410 is increased by about 1100 Angstroms on each sidewall of wall 1410 if polysilicon layer 1430 (FIG. 43) is about 500 Angstroms, resulting in wall 1410 having a width or thickness of about 4700 Angstroms. In these embodiments, the thickness of wall 1410a increases to about 2940 Angstroms from about 1840 Angstroms due to the thermal oxidation of the 500 Angstroms of polysilicon layer 1430 (FIG. 43) abutting layer 1410a. Further, in the embodiments wherein polysilicon layer 1430 (FIG. 43) has a thickness of about 500 Angstroms, the portion of polysilicon layer 1430 (FIG. 43) over silicon nitride layer 1030 is converted to a silicon dioxide layer having a thickness of about 1100 Angstroms as a result of the thermal oxidation of polysilicon layer 1430. Accordingly, in some embodiments, at this stage of manufacturing, the thickness of silicon dioxide walls 1410 is about 4700 Angstroms, the thickness of silicon dioxide wall 1410a is about 2940 Angstroms, the thickness of polysilicon layers 1230a and 1230b is about 300 Angstroms, the thickness of silicon dioxide layer 1510 is about 1100 Angstroms, the thickness of silicon nitride layer 1030 is about 1250 Angstroms, and the thickness of silicon dioxide layer 1020 is about 670 Angstroms.

Figure 45:
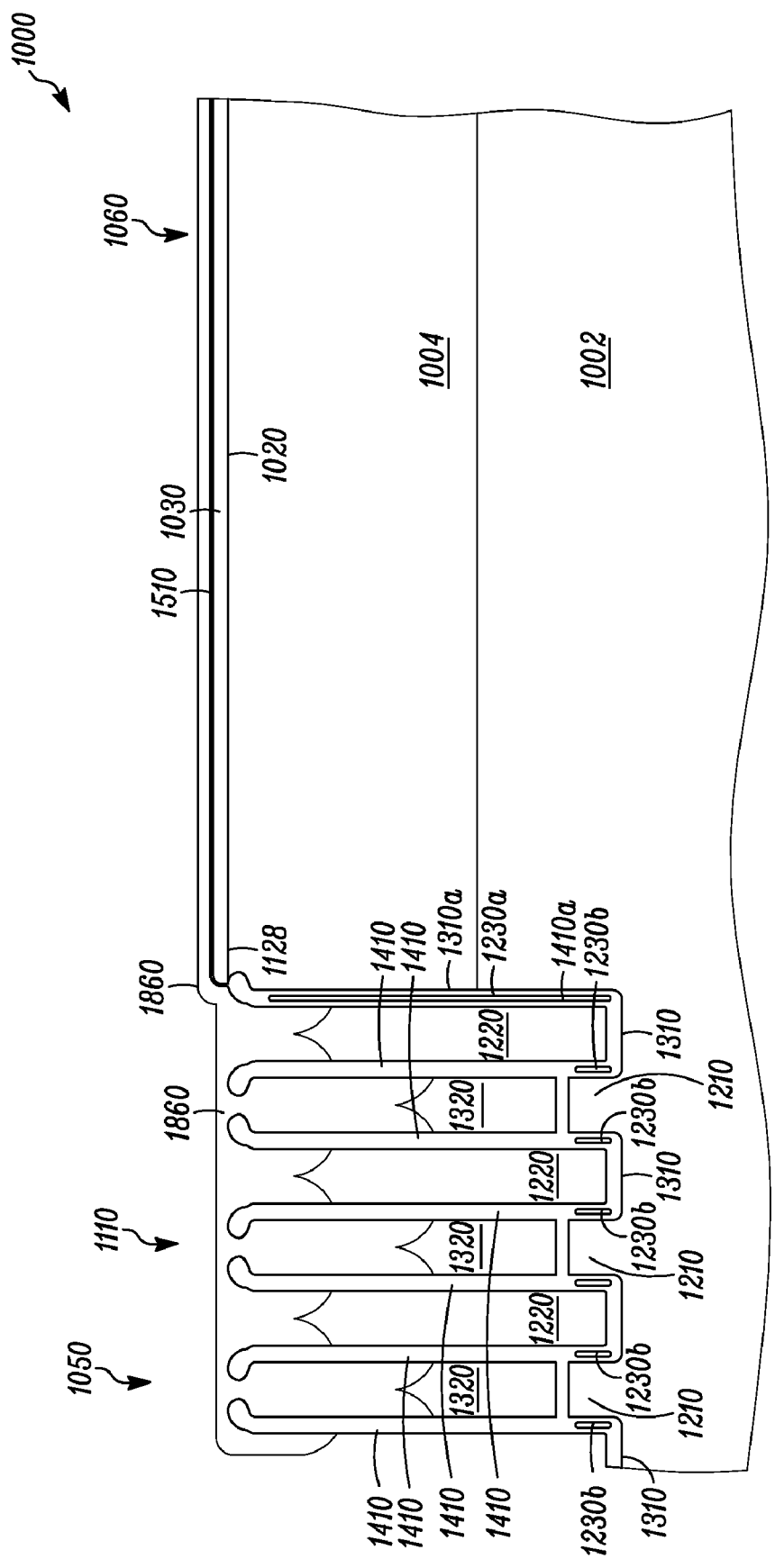
FIG. 45 is a cross-sectional view of the structure of FIG. 44 at a later stage of manufacture.

FIG. 45 is a cross-sectional view of structure 1000 at a later stage during manufacturing. FIG. 45 illustrates dielectric structure 1110 in region 1050, wherein dielectric structure 1110 includes silicon dioxide walls 1410 and 1410a. Dielectric structure 1110 further includes dielectric bulkhead layer 1310a, silicon dioxide materials 1310, polysilicon materials 1230a and 1230b, openings 1220 and 1320, and a capping material 1860. In addition, as is discussed below with reference to FIG. 47, dielectric structure 1110 may include a silicon nitride layer 1830 (FIG. 47) to further seal dielectric structure 1110 to prevent any gasses from entering voids 1220 and 1320 through cap layer 1860.

Using chemical vapor deposition (CVD) or gas deposition techniques, a dielectric layer such as, for example, an oxide layer 1860, is formed to cap or seal openings 1220 and 1320. For example, a hot wall TEOS or plasma TEOS oxide may be deposited such that the deposited oxide material builds up in each opening 1220 and 1320, gradually reducing the size of the openings until openings 1220 and 1320 are closed forming a dielectric layer 1860 at the upper portions of openings 1220 and 1320, wherein the remaining lower portions of openings 1220 and 1320 are not filled. After openings 1220 and 1320 are sealed using oxide layer 1860, openings 1220 and 1320 may be referred to as chambers, voids, closed cells, or sealed air gaps. The thickness of oxide layer 1860 may range from about 7,000 Angstroms to about 12,000 Angstroms. Oxide layer 1860 performs the function of sealing openings 1220 and 1320 to isolate openings 1220 and 1320 from potential contamination from undesirable particulates.

Cap layer 1860 may be formed using a plasma TEOS or hot wall TEOS to form a capping oxide that seals off the closed-cell chambers. Cap layer 1860 may have a thickness of about 7,000 Angstroms in one example. As a result, the closed-cell dielectric structure 1110 traps and encapsulates a low vacuum, a partial vacuum, or a solid matter that does not compromise further processing or subsequent device operational parameters.

Figure 46:
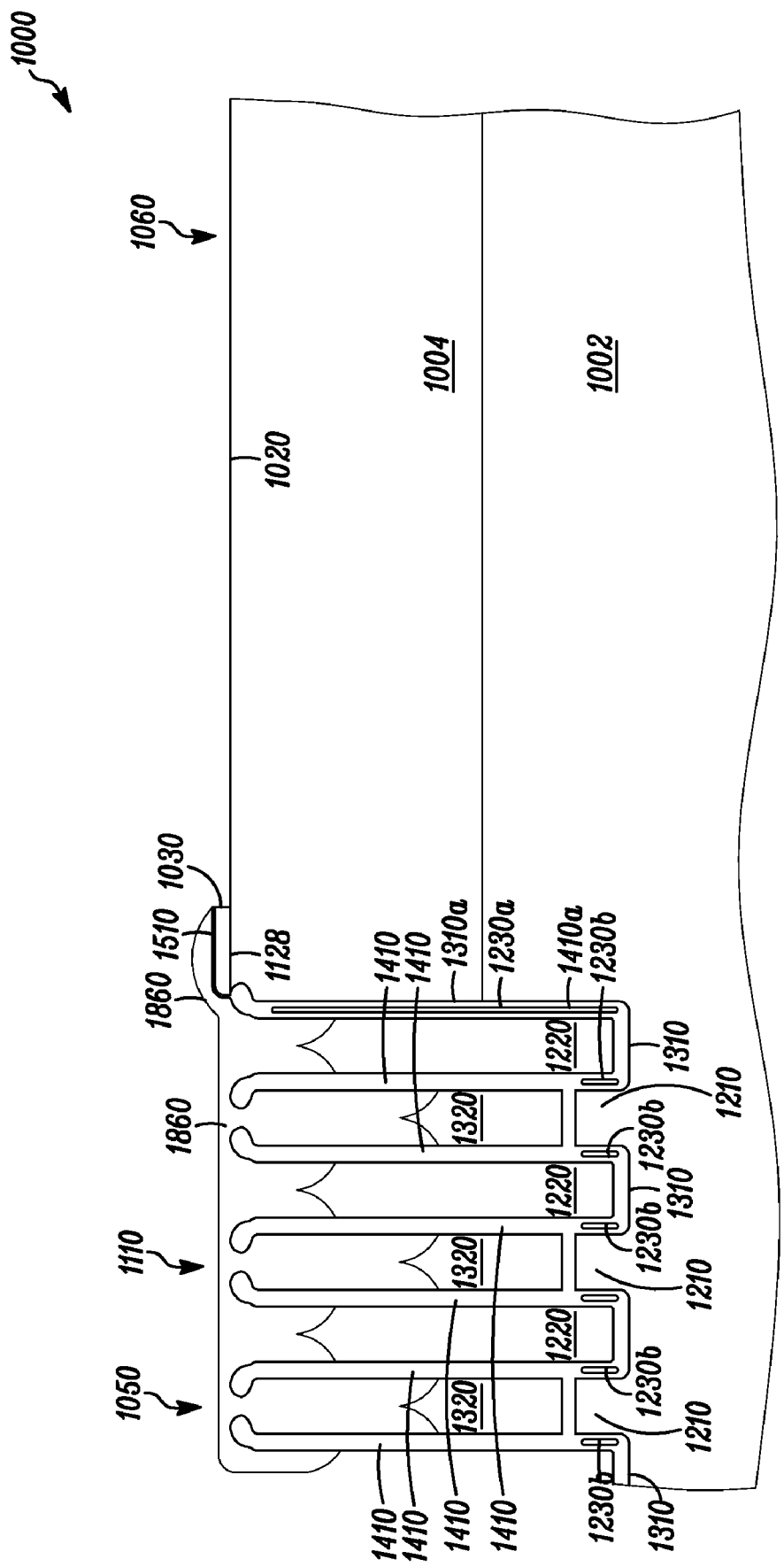
FIG. 46 is a cross-sectional view of the structure of FIG. 45 at a later stage of manufacture.

FIG. 46 is a cross-sectional view of structure 1000 at a later stage during manufacturing. A third masking and etching operation is performed to remove portions of cap layer 1860, portions of silicon nitride layer 1030, and portions of oxide layer 1510 in region 1060. As an example, an isotropic etch may be performed to remove portions of cap layer 1860, silicon nitride layer 1030, and oxide layer 1510 as is shown in FIG. 46. Optional planarization of the resultant structure may be performed, to provide a planar upper surface for structure 1000. For example, a chemical mechanical planarization (CMP) process may be used to planarize the upper surface of structure 1000. A sufficiently planar surface may prevent step coverage problems with subsequent wafer processing steps.

FIG. 47 is a cross-sectional view of structure 1000 at a later stage during manufacturing. An optional dielectric layer 1830 such as, for example, a silicon nitride ($Si_3N_4$) layer, may be conformally formed over silicon dioxide layer 1020 and capping layer 1860. Silicon nitride layer 1830 may be formed using a low pressure chemical vapor deposition (LPCVD) and may have a thickness of about 500 Angstroms. Silicon nitride layer 1830 may be formed over cap layer 1860 to seal cap layer 1860 and to prevent any gasses from entering voids 1220 and 1320 through cap layer 1860. The silicon nitride layer 1830 may fill in any cracks in the capping layer 1860, and in general prevent the propagation of gases into voids 1220 and 1320.

Dielectric structure 1110 may be referred to as an embedded dielectric structure since it is formed substantially within a silicon substrate. In other words, substantially all of dielectric structure 1110 is formed below a plane that is coplanar to a top surface of epitaxial layer 1004. As discussed above, in some embodiments, optional planarization of the resultant structure may be performed, to provide a planar upper surface for structure 1000. Accordingly, in some embodiments, a top surface of the active area region 1060 may be substantially coplanar to a top surface of the dielectric structure region 1050. In other words, a top surface of dielectric structure 1110 may be substantially coplanar to a top surface of epitaxial layer 1004 in some embodiments, or substantially coplanar to a top surface of some layer above the top surface of epitaxial layer 1004, such as, for example, oxide layer 1020 or nitride layer 1030.

The dielectric structure 1110 may be adjacent to, abutting, and/or surrounding, the active area region 1060 to provide edge termination. In addition, if dielectric structure 1110 surrounds active area region 1060, then dielectric structure 1110 may also be used to provide electrical isolation. For example, dielectric structure 1110 may be used to electrically isolate active regions from each other, which may also result in electrical isolation between any active devices formed in the isolated active regions.

The dielectric structure 1110 may be used to support passive electrical components such as, for example, electrical interconnections formed from metals or doped polycrystalline silicon. The dielectric structure 1110 also may accommodate inductors and thin film resistors such as doped polycrystalline silicon or metal resistors. The dielectric structure 1110 may also be used to support capacitors with two conductive plates separated by an insulating dielectric. The dielectric structure 1110 reduces capacitance of passive components to the conductive silicon substrate. Smaller parasitic capacitance means less power is required to switch electrical signals in conductors and other components formed over, or in conjunction with, the dielectric structure 1110.

Forming dielectric structures to have a relative dielectric constant $\in_R$ of that of silicon dioxide (for example, about 3.9) or less may be desirable, and in some instances a dielectric structure incorporating sealed voids to provide a relative dielectric constant $\in_R$ as low as about 1.5 or lower may be desired. Other considerations for a dielectric structure, such as dielectric structure 1110, include thermal coefficients of expansion of the dielectric structure and the materials adjacent the dielectric structure and mechanical stability.

In some embodiments, dielectric structure 1110 may be formed greater than five microns wide and greater than three microns deep. In various embodiments, dielectric structure 1110 may have a width ranging from approximately five microns to approximately 300 microns and may have a depth or height ranging from approximately three microns to about 60 microns. In one example, the width of dielectric structure 1110 may be about ten microns and the depth of dielectric structure 1110 may be about ten microns. In another example, the depth of dielectric structure 1110 may be about twelve microns.

Passive devices and/or electrical interconnects, electrodes, or contacts may be formed overlying dielectric structure 1110. In some embodiments, dielectric structure 1110 is formed to a depth greater than three microns. Moreover, dielectric structure 1110 can be formed at these dimensions or greater without significant stress being added to the die. For example, as discussed above, the thickness of dielectric bulkhead 1310a may be controlled to reduce undesirable stress in structure 1000.

In some embodiments, dielectric structure 1110 is a nonconductive structure having a relatively low dielectric constant. From a structural perspective, stress may be reduced in structure 1000 if the thickness of the oxide material formed on the sidewall 1310a abutting the active area 1060 is controlled to where stress is not induced into the substrate that produces warpage or dislocation defects in the wafer. As discussed above, dielectric structure 1110 is designed to reduce stress imparted to the wafer when the dielectric structure comprises a substantial portion of the die area.

The dielectric structure 1110 may serve as a support structure that has sufficient structural strength to allow the formation of interconnects, passive components, or active devices over the dielectric structure 1110. To achieve this, in some embodiments, vertical support structures such as walls 1410 are formed that support a top surface layer such as layer 1860. The vertical support structures and top surface layer may comprise a dielectric material. In one embodiment, empty compartments such as voids 1220 and 1320 underlying the top surface layer are formed between the vertical support structures to form air gaps that lower the dielectric constant of the dielectric platform. The diameter of the openings 1220 and 1320 may be selected to allow the build up of deposited dielectric material near the upper portion of openings 1220 and 1320 to close off and seal the voids without filling the voids with the deposited dielectric material.

The dielectric structure 1110 may also reduce parasitic capacitances of devices formed using the wafer, thereby extending the frequency response of any devices built using structure 1000. Dielectric structure 1110 may be used to separate conductive regions from one another, and thus, a relatively low dielectric constant is realized to minimize the capacitance. A relatively low dielectric constant for a dielectric structure may be achieved by maximizing the volume of empty space in the dielectric structure between conductive regions which form the parasitic capacitance.

The dielectric structure 1110, and specifically, wall 1310a, may be used to provide edge termination by forming dielectric structure 1110 adjacent a transistor that is subsequently formed in active area region 1060, to realize a transistor that has increased breakdown voltage relative to conventional devices. Wall 1310a may be referred to as a dielectric bulkhead.

Although dielectric structure 1110 has been described as being formed adjacent to, or abutting an active area region, this is not a limitation of the present invention. For example, in some embodiments, it may not be necessary to use dielectric structure 1110 for edge termination, and therefore, dielectric structure 1110 may not be formed near an active area. Further, in some embodiments, dielectric structure 1110 may be used mainly to form passive devices, such as inductors and capacitors, having a relatively high Q, or quality factor, compared to, for example, other implementations of passive devices formed using a silicon substrate. Embedded dielectric structure 1110 can provide adequate isolation for passive elements from the conductive substrate, and may have advantages over other implementations such as implementations that form an inductor over a relatively thick, solid dielectric layer that is formed above the upper surface over the silicon material (for example, over the upper surface of the top epitaxial layer) to provide isolation between the inductor and the conductive silicon substrate. Such an implementation that uses a relatively thick, solid dielectric layer has a substantially nonplanar surface, which can interfere with subsequent semiconductor process steps such as photoligthographic processes employed for definition of other circuit elements.

Dielectric structure 1110 may correspond to dielectric structure 110 of FIGS. 29 and 31. For example, dielectric structure 110 of FIGS. 29 and 31 may be a top view of structure 1000 at the stage of manufacturing illustrated in either of FIG. 41, 42, 43, or 44. In other words, FIG. 41, 42, 43, or 44 may be cross-sectional views of a portion of dielectric structure 110 of FIGS. 29 and 31. For example, walls 910 (FIGS. 29 and 31) may correspond to walls 1410 (FIGS. 42 and 44) and openings 920 (FIGS. 29 and 31) may correspond to openings 1220 and 1320 (FIG. 41, 42, 43, or 44), although the methods and apparatuses described herein are not limited in this regard.

Accordingly, the dielectric structure 1110 (FIG. 47), which may correspond to dielectric structure 110 of FIGS. 29 and 31, is a closed-cell structure, includes a dielectric bulkhead adjacent to an active area, and a plurality of air gaps. The dielectric bulkhead portion 1310a of dielectric structure 1110 may provide termination for equipotential lines from an electric field in active area region 1060 formed adjacent to the dielectric structure 1110. Dielectric structure 1110 may be referred to as an embedded structure since it is formed substantially below a surface of a silicon substrate. The plurality of air gaps 1220 and 1320 of dielectric structure 1110 may be spaced to facilitate sealing of the air gaps using a suitable cap layer material 1860. In addition, the plurality of air gaps 1220 and 1320 of dielectric structure 1110 may have different depths extending towards the substrate, and therefore, the plurality of air gaps 1220 and 1320 may have substantially different volumes. Dielectric structure 1110 has a plurality of walls 1410, wherein in some embodiments, no single wall extends across the width of dielectric structure 1110 and no straight-line portion of the walls 1410 are more than 4.5 times (4.5×) the spacing between walls 1410. Forming walls 1410 in this manner may further reduce undesirable stress in dielectric structure 1110.

Although dielectric structure 1110 is described as having a plurality of air gaps 1220 and 1320, the methods and apparatuses described herein are not limited in this regard. For example, in alternate embodiments, openings 1220 and 1320 could be filled, or partially filled, with a material, such as, for example, a material comprising an oxide, nitride, or silicon if so desired, to form a solid or filled dielectric structure 1110. Such a solid or filled dielectric structure 1110 would have a relatively higher dielectric constant compared to an air-gap dielectric structure 1110 since the material used to fill the openings 1220 and 1320 would have a higher dielectric constant compared to an opening or void. Examples of materials that may be used to fill, or backfill, openings 1220 and 1320 may include an oxide material formed using a hot wall TEOS process, silicon nitride, or polycrystalline silicon.

Structures 2110 (FIG. 48), 2310 (FIG. 49), and 2610 (FIG. 50) are three other examples of dielectric structures or dielectric platforms.

Figure 48:
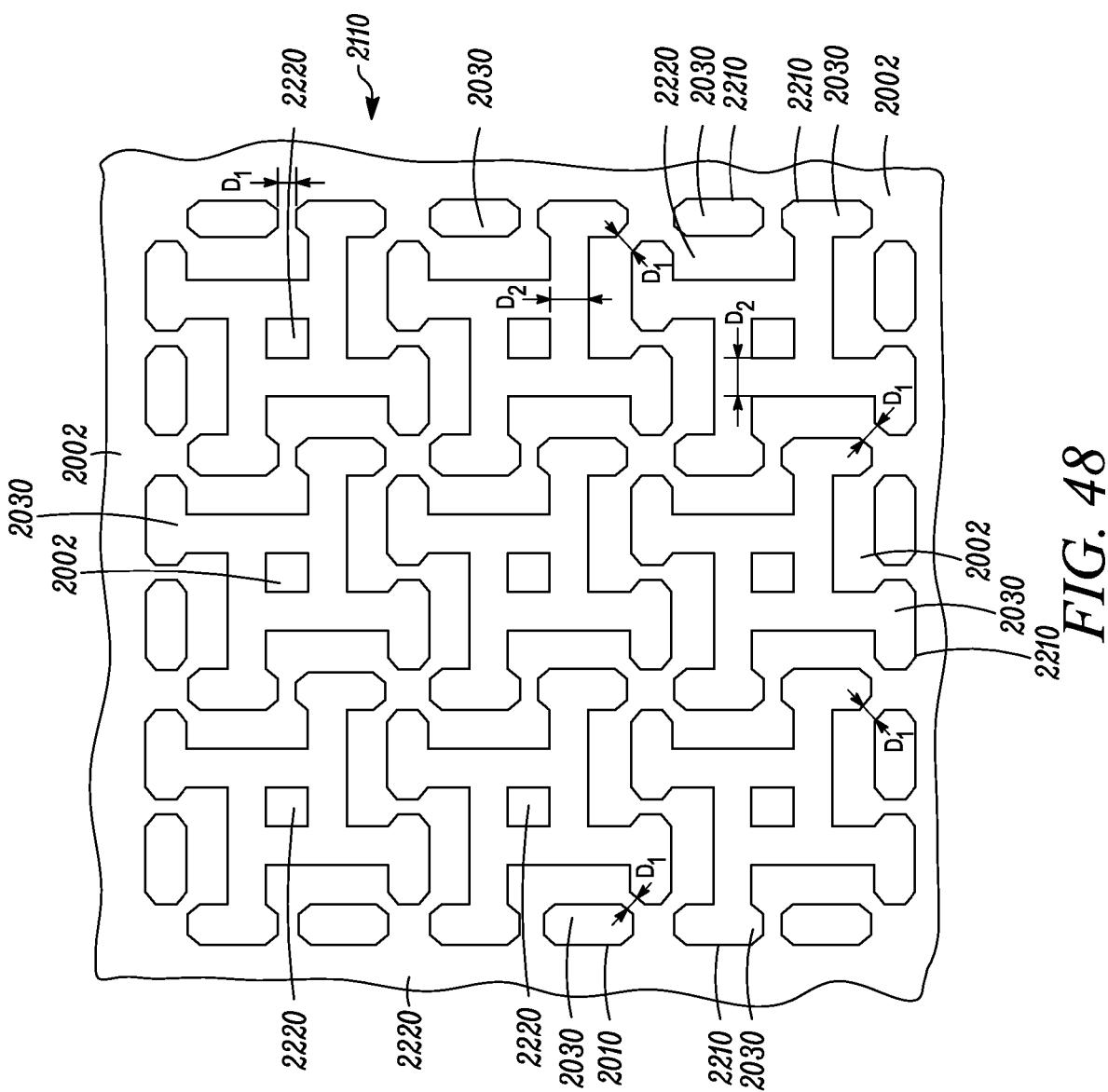
FIG. 48 is a top view of another embodiment of a portion of a structure during manufacture.

FIG. 48 is a top view of another embodiment of a portion of a structure 2110 at one stage during manufacturing. In this example, structure 2110 includes a repeating pattern of a plurality of walls 2010 and 2210 and openings or trenches 2220.

This embodiment of structure 2110 combines features of dielectric structures 510 (FIG. 27) and 1110 (FIG. 47) described above. In addition, some of the methods for making structures 510 (FIG. 27) and 1110 (FIG. 47) described above may be used to make structure 2110.

At this stage of manufacturing, walls 2210 have a pinwheel configuration so that stress is cancelled within structure 2110 and not translated into areas adjacent to structure 2110. Walls 2210 may comprise silicon (not shown) having a layer of silicon nitride 2030 formed over the silicon of walls 2210. Walls 2010 may also comprise silicon (not shown) having a layer of silicon nitride 2030 formed over the upper portions of walls 2010.

Structure 2110 may be formed using photolithography and etching processes. After forming an etch mask (not shown), a structure comprising an epitaxial layer (not shown) formed over a silicon substrate 2002, and comprising a silicon nitride layer 2030 formed over the epitaxial layer (not shown) may be etched using, for example, an anisotropic etch to remove portions of silicon nitride layer 2030, portions of the epitaxial layer, and portions of silicon substrate 2002 to form openings 2220.

Dimensions or distances $D_1$ and $D_2$ are shown in FIG. 48. In some embodiments, the distance $D_1$ may be about 0.6 microns and the distance $D_2$ may be about 1.2 microns at this stage of manufacturing.

Although not shown, subsequent processing steps may include, after the anisotropic etch to form openings 2220, performing a thermal oxidation process to form a layer of silicon dioxide having a thickness of, for example, 1000 Angstroms, at any exposed silicon surface. Then, a layer of polysilicon (not shown) may be conformally formed over structure 2110 and subsequently thermally oxidized so that the portions of walls 2010 and 2210 separated by the distance of $D_1$ prior to the thermal oxidation contact or touch after the thermal oxidation processes. By forming silicon dioxide in this manner, a closed cell structure may be formed to physically isolate or separate the resultant openings of structure 2110. The layer of polysilicon may be etched using an anisotropic etch prior to thermal oxidation to remove horizontal portions (as viewed by a cross section) of the polysilicon layer which will expose silicon nitride material 2030. Next, silicon nitride material 2030 may be removed using, for example, a chemically selective anisotropic etch that is selective to remove silicon nitride, and this chemically selective anisotropic etch will expose the upper portions of walls 2010 and 2210 which at this stage of manufacturing comprise portions of the epitaxial layer over portions of silicon substrate 2002. Next, two etches, for example, an anisotropic etch followed by an isotropic etch, may be performed to remove the epitaxial layer portions and silicon substrate portions 2002 of walls 2010 and 2210 to form trenches having a shallower depth than the trenches formed by the initial etching operation.

Accordingly, structure 2110 is a dielectric structure that has a relatively low dielectric constant since a substantial portion of structure 2110 is empty space which has a dielectric constant of one. In addition, walls 2010 and 2210 are formed as shown to reduce undesirable stress and to form multiple physically isolated closed cells to limit propagation of undesirable contaminants.

Figure 49:
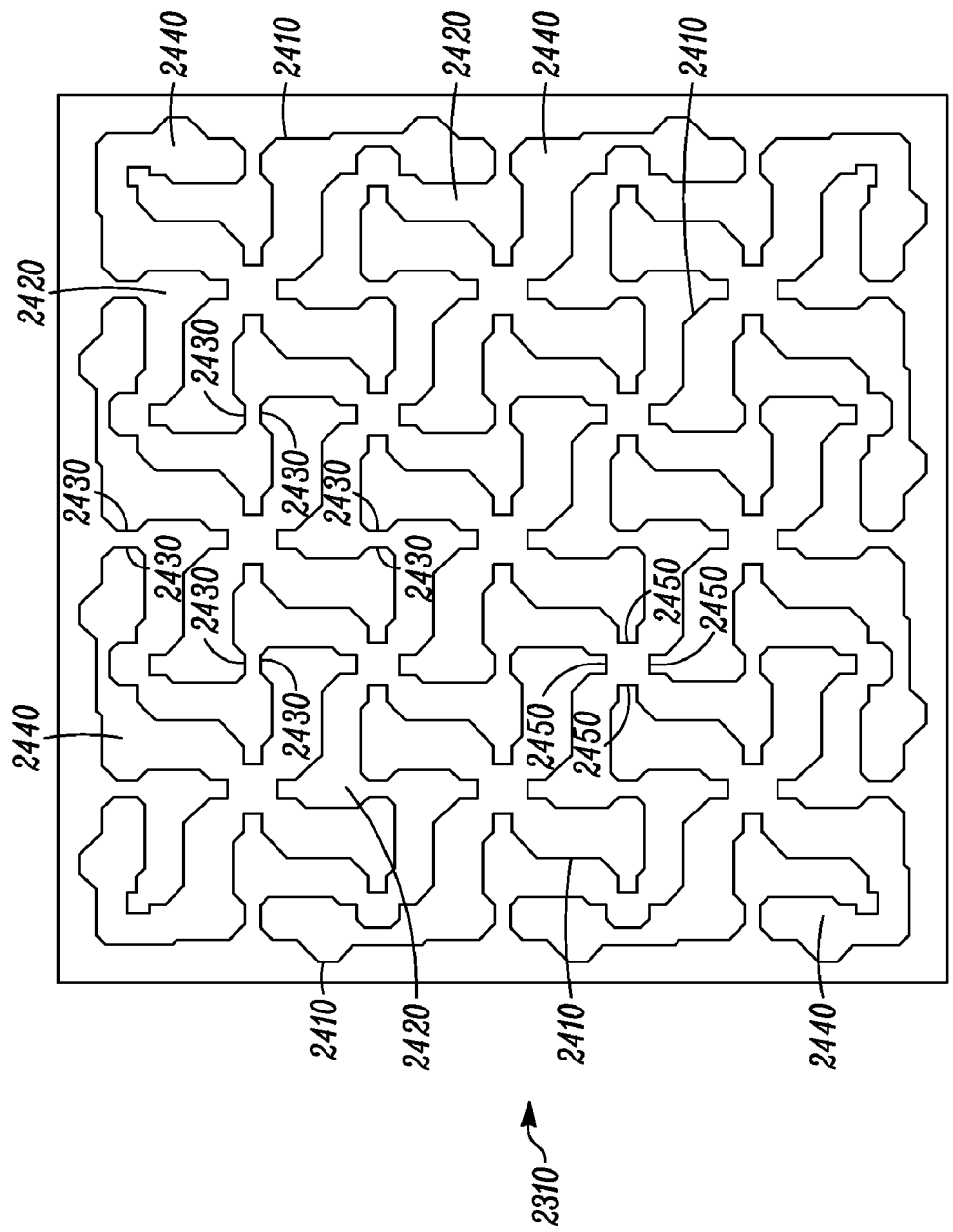
FIG. 49 is a top view of another embodiment of a portion of a structure during manufacture.

FIG. 49 is a top view of another embodiment of a portion of a structure 2310 at one stage during manufacturing. In this example, structure 2310 includes a repeating pattern of a plurality of walls 2410 and openings or voids 2420.

This embodiment of structure 2310 combines features of dielectric structures 510 (FIG. 27) and 1110 (FIG. 47) described above. In addition, some of the methods for making structures 510 (FIG. 27) and 1110 (FIG. 47) described above may be used to make structure 2310.

At this stage of manufacturing, walls 2410 have a pinwheel configuration so that stress is cancelled within structure 2310 and not translated into areas adjacent to structure 2310. Walls 2410 may comprise silicon (not shown) having a layer of silicon nitride 2440 formed over the silicon of walls 2410.

Structure 2310 may be formed using photolithography and etching processes. After forming an etch mask (not shown), a structure comprising an epitaxial layer (not shown) formed over a silicon substrate, and comprising a silicon nitride layer 2440 formed over the epitaxial layer (not shown) may be etched using, for example, an anisotropic etch to remove portions of silicon nitride layer 2440, portions of the epitaxial layer, and portions of silicon substrate to form openings 2420.

Although not shown, subsequent processing steps may include, after the anisotropic etch to form openings 2420, performing a thermal oxidation process to form a layer of silicon dioxide at any exposed silicon surface along the sidewalls of openings 2420. During this thermal oxidation process, endpoints 2430 of substructures of structure 2310 will contact each other as a result of the expansion or growth of the silicon dioxide during the thermal oxidation process. The spacing or distance between endpoints 2450 may be greater than the distance between endpoints 2430, and in this example, the endpoints 2450 will not contact each other. The spacing between endpoints 2430 is selected so that these endpoints contact each other during the thermal oxidation process to form multiple closed cells in structure 2310. By forming silicon dioxide in this manner, a closed cell structure may be formed to physically isolate or separate the resultant openings of structure 2310.

Next, silicon nitride material 2440 may be removed using, for example, a chemically selective anisotropic etch that is selective to remove silicon nitride, and this chemically selective anisotropic etch will expose the upper portions of the epitaxial layer that were under the removed silicon nitride layer 2440 adjacent openings 2420. Next, two etches, for example, an anisotropic etch followed by an isotropic etch, may be performed to remove the epitaxial layer portions and silicon substrate portions that are adjacent to openings 2420 to form trenches or openings having a shallower depth than the trenches 2420 formed by the initial etching operation, and these etches will not etch the oxide walls 2410. Optionally, the thickness of the remaining oxide walls 2410 may be increased through optional additional polysilicon deposition and thermal oxidation processes.

Accordingly, structure 2310 is a dielectric structure that has a relatively low dielectric constant since a substantial portion of structure 2310 is empty space which has a dielectric constant of one. Structure 2310 will also comprise a relatively small amount of silicon dioxide with silicon dioxide walls 2410, which can provide structure support and physical isolation for the multiple closed cells. In addition, walls 2410 are formed as shown to reduce undesirable stress and to form multiple physically isolated closed cells to limit propagation of undesirable contaminants.

Figure 50:
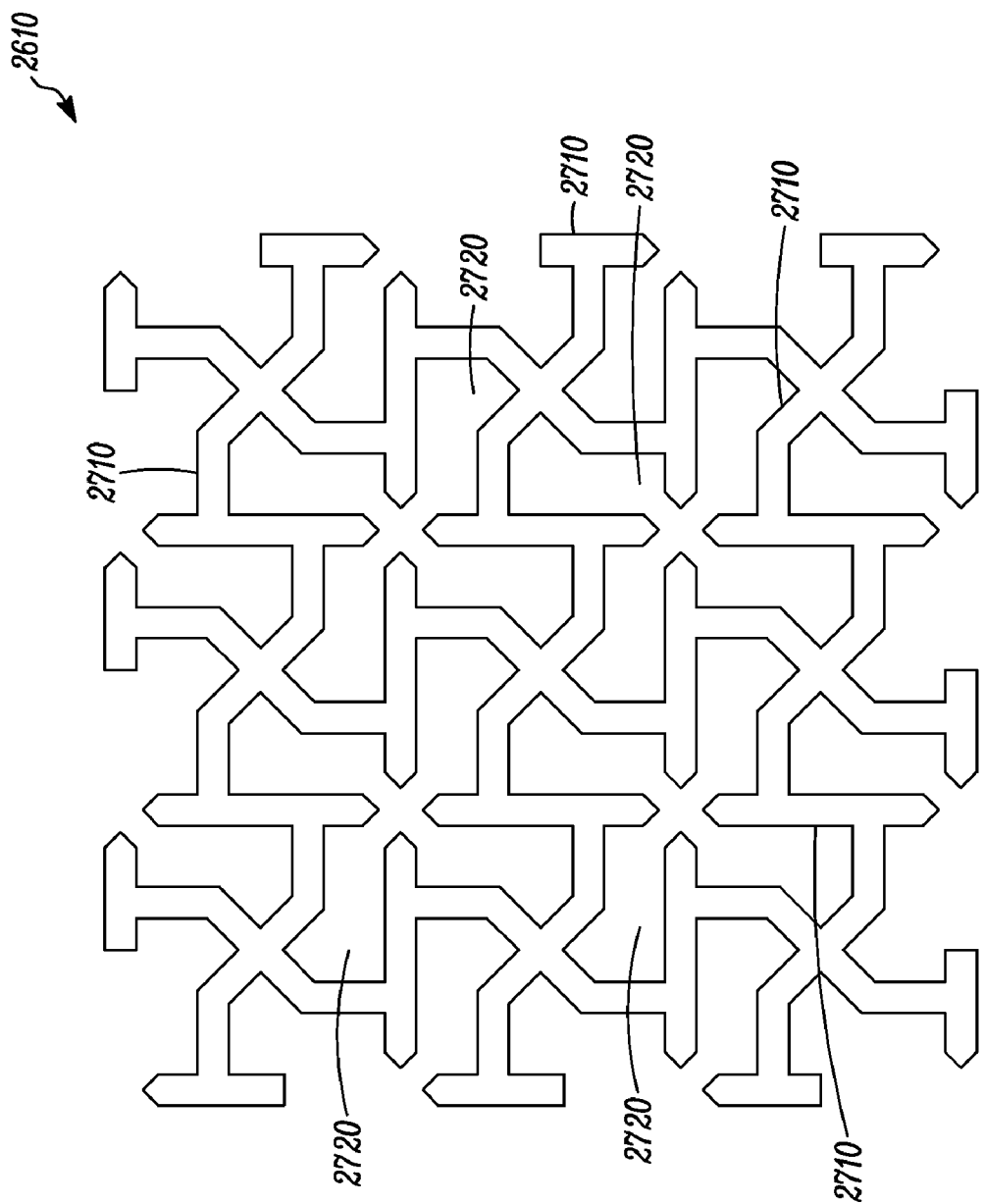
FIG. 50 is a top view of another embodiment of a portion of a structure during manufacture.

FIG. 50 is a top view of another embodiment of a portion of a dielectric structure 2610 at one stage during manufacturing. In this example, structure 2610 includes a repeating pattern of a plurality of walls 2710 and openings or voids 2720.

This embodiment of dielectric structure 2610 combines features of dielectric structure 510 (FIG. 27) described above. In addition, the methods for making structure 510 (FIG. 27) described above with reference to FIGS. 21 to 28 may be used to make structure 2610.

At this stage of manufacturing, walls 2710 may comprise silicon dioxide. As may be appreciated, in other embodiments, walls 2710 may comprise silicon or a combination of silicon and silicon dioxide, however, if a lower dielectric constant is desired, then relatively more empty space or voids may be formed in structure 2610 and the amount of silicon in walls 2710 can be reduced or eliminated as silicon dioxide has a lower dielectric constant than silicon.

Walls 2710 have a pinwheel configuration so that stress is cancelled within structure 2610 and not translated into areas adjacent to structure 2610. Specifically, during thermal cycling of structure 2610 the central portions of a substructure in structure 2610 which have a cross shape may twist in a clockwise direction and the outer portion of the substructure may twist in a counterclockwise direction with equal and opposite force, so that the net accumulation of stress is zero.

Forming multiple pinwheel cell structures together as shown will have the result of cancelling stresses in structure 2610 so that stress does not translate across structure 2610, and will reduce or eliminate stress from being translated into areas adjacent to structure 2610. Dielectric structure 2610 has a closed-cell configuration in that the voids 2720 of dielectric structure 2610 may be physically isolated from each other by walls 2710.

Dielectric structure 2610 of FIG. 50 is similar to dielectric structure 110 of FIG. 19. At least one difference between structure 2610 and structure 110 is that structure 110 has a center tube portion in the substructures of structure 110. Since the width or diameter of the tube portion is relatively smaller than the spacing between other wall segments 210 of structure 110, the depth of the resultant void or opening may be relatively less than the other openings of structure 110 after etching. Since structure 2610 does not include such a tube portion, the depths of voids 2720 may be substantially uniform, or substantially the same.

Accordingly, structure 2610 is a dielectric structure that has a relatively low dielectric constant since a substantial portion of structure 2610 is empty space which has a dielectric constant of one. Structure 2610 will also comprise a relatively small amount of silicon dioxide compared to empty space with silicon dioxide walls 2710, which can provide structure support and physical isolation for the multiple closed cells. In addition, walls 2710 are formed as shown having a pinwheel configuration to reduce undesirable stress and to form multiple physically isolated closed cells to limit propagation of undesirable contaminants.

The dielectric structures 2110 (FIG. 48), 2310 (FIG. 49), and 2610 (FIG. 50), may be capped or sealed to form sealed voids using a capping layer as described above with reference to dielectric structures 510 (FIG. 27) and 1110 (FIG. 47).

Structures 110 (FIGS. 15, 19, 29), 2110 (FIG. 48), 2310 (FIG. 49), and 2610 (FIG. 50) may be referred to as rectilinear structures since each of these structures include straight line, or substantially straight line, segments and/or sidewalls, although the methods and apparatuses described herein are not limited in this regard. In other embodiments, structures 110 (FIGS. 15, 19, 29), 2110 (FIG. 48), 2310 (FIG. 49), and 2610 (FIG. 50) may also include curved segments and/or curved sidewalls.

Further, structures 110 (FIGS. 15, 19, 29), 2110 (FIG. 48), 2310 (FIG. 49), and 2610 (FIG. 50) have segments that intersect other segments of these structures at an angle greater than zero degrees and less than 180 degrees. In some embodiments, some segments of structures 110 (FIGS. 15, 19, 29), 2110 (FIG. 48), 2310 (FIG. 49), and 2610 (FIG. 50) intersect another segment of these structures at a perpendicular angle, or a substantially perpendicular angle. In other words, the segments of structures 110 (FIGS. 15, 19, 29), 2110 (FIG. 48), 2310 (FIG. 49), and 2610 (FIG. 50) intersect another segment of these structures at an angle of 90 degrees or about 90 degrees. In addition, some segments of structures 110 (FIGS. 15, 19, 29), 2110 (FIG. 48), 2310 (FIG. 49), and 2610 (FIG. 50) intersect another segment of these structures at an angle of 45 degrees or about 45 degrees. Similarly, structures 110 (FIGS. 15, 19, 29), 2110 (FIG. 48), 2310 (FIG. 49), and 2610 (FIG. 50) include sidewalls that intersect other sidewalls at an angle greater than zero degrees and less than 180 degrees.

In some embodiments, structures 110 (FIGS. 15, 19, 29), 2110 (FIG. 48), 2310 (FIG. 49), and 2610 (FIG. 50) may be formed greater than three microns deep. In other words, structures 110 (FIGS. 15, 19, 29), 2110 (FIG. 48), 2310 (FIG. 49), and 2610 (FIG. 50) may be embedded in a semiconductor material such as, for example, a silicon material, that has a upper boundary and a lower boundary parallel to, or substantially parallel to, the upper boundary. The upper boundary may be the top surface of the semiconductor material. Structures 110 (FIGS. 15, 19, 29), 2110 (FIG. 48), 2310 (FIG. 49), and 2610 (FIG. 50) may extend from the upper boundary of the semiconductor material to a distance of at least about three microns or greater toward the lower boundary.

In addition, in some embodiments, structures 110 (FIGS. 15, 19, 29), 2110 (FIG. 48), 2310 (FIG. 49), and 2610 (FIG. 50) may be formed greater than five microns wide. In other words, structures 110 (FIGS. 15, 19, 29), 2110 (FIG. 48), 2310 (FIG. 49), and 2610 (FIG. 50) may be between two lateral boundaries of the semiconductor material that are parallel, or substantially parallel, to each other, and these lateral boundaries may be separated or spaced apart by about five microns or greater. These lateral boundaries may perpendicular, or substantially perpendicular, to the top surface of the semiconductor material.

Accordingly, various structures and methods have been disclosed to provide a relatively thick, embedded dielectric platform that may be a dielectric support structure capable of supporting one or more passive devices over the dielectric platform. In various embodiments, the disclosed dielectric platform may provide electrical isolation, reduce parasitic substrate capacitance, allow for the formation of passive devices having a relatively high Q, and enable relatively higher frequency of operation or breakdown voltages of any devices formed using, or in conjunction with, a structure that includes the disclosed dielectric platform. In addition, the disclosed dielectric platform and the methods for making the dielectric platform may reduce stress that may be imparted to regions adjacent to the dielectric platform compared to other techniques and structures.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A semiconductor device, comprising:
a semiconductor material having a first surface and a second surface parallel to, or substantially parallel to, the first boundary;
a plurality of pinwheel structures, wherein the plurality of pinwheel structures comprise silicon dioxide and extend from the first surface of the semiconductor material toward the second surface; and
a dielectric structure disposed in said semiconductor material, said dielectric structure comprising said plurality of pinwheel structures, said pinwheel structures defining a plurality of voids formed therein to reduce a dielectric constant of the dielectric structure by about 30% or greater and wherein the plurality of pinwheel structures are patterned to comprise a plurality of orthogonally walled structures such that stress vectors from abutting cells of the dielectric structure are aligned in opposite directions to reduce stress in the dielectric structure.

2. The semiconductor device of claim 1, wherein the plurality of pinwheel structures extend from the surface of the semiconductor material to a distance of at least about three microns or greater below the surface of the semiconductor material and wherein the plurality of pinwheel structures comprise segments that orthogonally intersect at least one other segment of the plurality of pinwheel structures.

3. The semiconductor device of claim 1, wherein plurality of pinwheel structures surround at least a portion of the semiconductor material and wherein at least a portion of an active device is in the semiconductor material.

4. A semiconductor device, comprising:
a semiconductor material;
a plurality of rectilinear structures, wherein the plurality of rectilinear structures comprise silicon dioxide and extend from a surface of the semiconductor material to a distance of at least about three microns or greater below the surface of the semiconductor material and wherein a first rectilinear structure of the plurality of rectilinear structures is perpendicular to, or substantially perpendicular to, a second rectilinear structure of the plurality of rectilinear structures; and
a dielectric structure disposed in said semiconductor material, said dielectric structure comprising said plurality of rectilinear structures, said rectilinear structures defining a plurality of voids formed therein to reduce a dielectric constant of the dielectric structure by about 30% or greater and wherein the plurality of rectilinear structures are patterned to comprise a plurality of orthogonally walled structures such that stress vectors from abutting cells of the dielectric structure are aligned in opposite directions to reduce stress in the dielectric structure.

5. The semiconductor device of claim 4, further comprising a semiconductor substrate, wherein the semiconductor substrate comprises the semiconductor material and wherein each rectilinear structure of the plurality of rectilinear structures is perpendicular to, or substantially perpendicular to, another rectilinear structure of the plurality of rectilinear structures, wherein the semiconductor material has a first boundary and a second boundary parallel to, or substantially parallel to, the first boundary, wherein the plurality of rectilinear segments extend from the first boundary of the semiconductor material to a distance of at least about three microns or greater toward the second boundary, and wherein the first boundary is the surface of the semiconductor material.

6. A semiconductor structure, comprising:
a semiconductor material; and
an element comprising a plurality of rectilinear segments, wherein the plurality of rectilinear segments comprise silicon dioxide and extend from a surface of the semiconductor material to a distance of at least about three microns or greater below the surface of the semiconductor material, wherein a first rectilinear segment of the plurality of rectilinear segments is spaced apart from a second rectilinear segment of the plurality of rectilinear segments by a first distance, wherein a length of each rectilinear segment of the plurality of rectilinear segments is equal to or less than about 4.5 times (4.5×) the first distance;
said plurality of rectilinear segments defining a plurality of voids formed therein to reduce a dielectric constant of element by about 30% or greater and wherein the plurality of rectilinear segments are patterned to comprise a plurality of orthogonally walled structures such that stress vectors from abutting cells of the element are aligned in opposite directions to reduce stress in the element.

7. The semiconductor structure of claim 6, wherein the semiconductor material has a first boundary and a second boundary parallel to, or substantially parallel to, the first boundary, wherein the plurality of rectilinear segments extend from the first boundary of the semiconductor material to a distance of at least about three microns or greater toward the second boundary, and wherein the first boundary is the surface of the semiconductor material.

8. The semiconductor structure of claim 6, wherein the first distance is about 1.1 microns and wherein the length of each rectilinear segment of the plurality of rectilinear segments is about 4.4 microns or less.

9. The semiconductor structure of claim 6, wherein the element is between a first boundary of the semiconductor material and a second boundary of the semiconductor material, wherein the first boundary is parallel to, or substantially parallel to, the second boundary and the first boundary is perpendicular, or substantially perpendicular, to the surface of the semiconductor material.

10. The semiconductor structure of claim 9, wherein the first boundary is separated from the second boundary by about five microns or greater.

11. A semiconductor device, comprising:
a semiconductor material; and
a structure comprising silicon dioxide embedded in the semiconductor material and comprising a first portion, a second portion, and a third portion, the first portion is parallel, or substantially parallel to, the second portion, the first portion is spaced apart from the second portion by a first distance, a width of the first portion is less than the first distance, and the first portion intersects the third portion at an angle greater than zero degrees and less than 180 degrees;
the first, second, and third portions defining a plurality of voids formed therein to reduce a dielectric constant of the structure by about 30% or greater and wherein the first, second, and third structures are patterned to comprise a plurality of orthogonally walled structures such that stress vectors from abutting cells of the structure are aligned in opposite directions to reduce stress in the structure.

12. The semiconductor device of claim 11, wherein the first distance is about 1.2 microns and the width of the first portion is about 0.3 microns.

13. The semiconductor device of claim 11, wherein the first portion intersects the third portion at a perpendicular angle, or a substantially perpendicular angle.

14. The semiconductor device of claim 11, wherein the first portion intersects the third portion at an angle of about 45 degrees.

15. The semiconductor device of claim 11, further comprising a semiconductor substrate, wherein the semiconductor substrate comprises the semiconductor material and wherein the semiconductor material has a first boundary and a second boundary parallel to, or substantially parallel to, the first boundary, wherein the structure extends from the first boundary of the semiconductor material to a distance of at least about three microns or greater toward the second boundary, and wherein the first boundary is the surface of the semiconductor material.

16. The semiconductor device of claim 11, wherein the first portion is a rectilinear structure, the second portion is a rectilinear structure, and the third portion is a rectilinear structure.

17. The semiconductor device of claim 11, further comprising a plurality of voids, wherein a first void of the plurality of voids is physically isolated from a second void of the plurality of voids by the structure.

18. The semiconductor device of claim 17, wherein a volume of the first void is substantially different than a volume of the second void.

19. The semiconductor device of claim 17, wherein a depth of the first void is greater than a depth of the second void.

20. The semiconductor device of claim 17, wherein a ratio of a width to depth of the first void exceeds one to four (1:4).

21. The semiconductor device of claim 11, further comprising an electrically conductive material, wherein at least a portion of the electrically conductive material is over the structure, wherein the semiconductor material comprises silicon and the structure comprises silicon, wherein at least a portion of an active device is in the semiconductor material, wherein the structure is between at least a portion of the electrically conductive material and the semiconductor material, and wherein the electrically conductive material comprises aluminum, copper, or doped polycrystalline silicon.

22. The semiconductor device of claim 11, wherein the first portion of the structure is tapered.

23. The semiconductor device of claim 22, wherein a width of an upper portion of the first portion is less than a width of a lower portion of the first portion and wherein the upper portion of the first portion is proximal to the surface of the semiconductor material and the second portion is of the first portion is distal to the surface of the semiconductor material.

24. The semiconductor device of claim 22, wherein the upper portion of the first portion is proximal to the surface of the semiconductor material and the lower portion is of the first portion is distal to the surface of the semiconductor material.

25. The semiconductor device of claim 11, wherein the structure further comprises an elongated element adjacent to, and spaced apart from the semiconductor material and wherein the elongated element extends from a distance of about three microns or greater below the surface of the semiconductor material, the elongated element comprises polysilicon, and wherein the elongated element is spaced apart from the semiconductor material by a distance of about 5000 Angstroms or less.

* * * * *